(12) United States Patent
Mori et al.

(10) Patent No.: US 10,366,905 B2
(45) Date of Patent: Jul. 30, 2019

(54) SEMICONDUCTOR DEVICE

(71) Applicant: ROHM CO., LTD., Kyoto-shi, Kyoto (JP)

(72) Inventors: Seigo Mori, Kyoto (JP); Masatoshi Aketa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/061,251

(22) PCT Filed: Dec. 7, 2016

(86) PCT No.: PCT/JP2016/086369
§ 371 (c)(1),
(2) Date: Jun. 11, 2018

(87) PCT Pub. No.: WO2017/099122
PCT Pub. Date: Jun. 15, 2017

(65) Prior Publication Data
US 2018/0366346 A1    Dec. 20, 2018

(30) Foreign Application Priority Data

Dec. 11, 2015 (JP) .................................. 2015-242486
Jun. 10, 2016 (JP) .................................. 2016-116466
Jun. 22, 2016 (JP) .................................. 2016-123817

(51) Int. Cl.
*H01L 23/48* (2006.01)
*H01L 21/52* (2006.01)
(Continued)

(52) U.S. Cl.
CPC .............. *H01L 21/52* (2013.01); *H01L 23/48* (2013.01); *H01L 23/49503* (2013.01);
(Continued)

(58) Field of Classification Search
CPC ......... H01L 24/48; H01L 24/73; H01L 24/45; H01L 29/7787; H01L 29/747
See application file for complete search history.

(56) References Cited

U.S. PATENT DOCUMENTS 10,123,443 B2 * 11/2018 Nakamura .......... H01L 23/5227
2009/0134405 A1    5/2009 Ota et al.
(Continued)

FOREIGN PATENT DOCUMENTS

JP    S5465477 A    5/1979
JP    H0523547 U    3/1993
(Continued)

OTHER PUBLICATIONS

International Preliminary Report on Patentability issued for International Patent Application No. PCT/JP2016/086369, dated Jun. 21, 2018, 42 pages including English translation.
(Continued)

*Primary Examiner* — Nicholas J Tobergte
(74) *Attorney, Agent, or Firm* — Hamre, Schumann, Mueller & Larson, P.C.

(57) ABSTRACT

A semiconductor device according to the present invention includes a semiconductor chip having a semiconductor layer that has a first surface on a die-bonding side, a second surface on the opposite side of the first surface, and an end surface extending in a direction crossing the first surface and the second surface, a first electrode that is formed on the first surface and has a peripheral edge at a position separated inward from the end surface, and a second electrode formed on the second surface, a conductive substrate onto which the semiconductor chip is die-bonded, a conductive spacer that has a planar area smaller than that of the first electrode and supports the semiconductor chip on the conductive sub-
(Continued)

strate, and a resin package that seals at least the semiconductor chip and the conductive spacer.

17 Claims, 40 Drawing Sheets

(51) Int. Cl.
*H01L 29/417* (2006.01)
*H01L 29/47* (2006.01)
*H01L 29/78* (2006.01)
*H01L 27/04* (2006.01)
*H01L 29/872* (2006.01)
*H01L 29/06* (2006.01)
*H01L 29/12* (2006.01)
*H01L 23/00* (2006.01)
*H01L 29/808* (2006.01)
*H01L 23/495* (2006.01)
*H01L 29/739* (2006.01)
*H01L 29/32* (2006.01)
*H01L 29/861* (2006.01)
*H01L 29/16* (2006.01)
*H01L 27/06* (2006.01)
*H01L 27/088* (2006.01)

(52) U.S. Cl.
CPC ........ *H01L 23/49562* (2013.01); *H01L 24/83* (2013.01); *H01L 27/04* (2013.01); *H01L 29/06* (2013.01); *H01L 29/12* (2013.01); *H01L 29/417* (2013.01); *H01L 29/47* (2013.01); *H01L 29/7395* (2013.01); *H01L 29/78* (2013.01); *H01L 29/8083* (2013.01); *H01L 29/872* (2013.01); *H01L 27/0694* (2013.01); *H01L 27/088* (2013.01); *H01L 29/0619* (2013.01); *H01L 29/1608* (2013.01); *H01L 29/32* (2013.01); *H01L 29/8611* (2013.01); *H01L 2224/0603* (2013.01); *H01L 2224/32258* (2013.01); *H01L 2224/48091* (2013.01); *H01L 2224/48247* (2013.01); *H01L 2224/4903* (2013.01); *H01L 2224/73265* (2013.01); *H01L 2924/181* (2013.01)

(56) References Cited

U.S. PATENT DOCUMENTS

| | | | |
|---|---|---|---|
| 2012/0211762 A1* | 8/2012 | Imada | H01L 23/4952 257/76 |
| 2014/0001487 A1 | 1/2014 | Nakazawa et al. | |
| 2014/0225126 A1 | 8/2014 | Aketa et al. | |
| 2014/0357026 A1 | 12/2014 | Kobayashi et al. | |
| 2014/0374774 A1 | 12/2014 | Tanaka et al. | |
| 2015/0060884 A1 | 3/2015 | Ota et al. | |
| 2015/0228717 A1 | 8/2015 | Hara | |
| 2015/0333190 A1 | 11/2015 | Aketa et al. | |
| 2016/0192495 A1* | 6/2016 | Nakamura | H01L 23/5227 361/783 |

FOREIGN PATENT DOCUMENTS

| | | |
|---|---|---|
| JP | H05315490 A | 11/1993 |
| JP | H06236990 A | 8/1994 |
| JP | H11265976 A | 9/1999 |
| JP | 2003197831 A | 7/2003 |
| JP | 2004095572 A | 3/2004 |
| JP | 2005183891 A | 7/2005 |
| JP | 2008041708 A | 2/2008 |
| JP | 2009130266 A | 6/2009 |
| JP | 2012174831 A | 9/2012 |
| JP | 2012256662 A | 12/2012 |
| JP | 2013219194 A | 10/2013 |
| JP | 2015050394 A | 3/2015 |
| JP | 2015099932 A | 5/2015 |
| JP | 2015153784 A | 8/2015 |
| WO | 2012124190 A1 | 9/2012 |
| WO | 2013018760 A1 | 2/2013 |
| WO | 2013141221 A1 | 9/2013 |
| WO | 2014087601 A1 | 6/2014 |
| WO | 2014091961 A1 | 6/2014 |
| WO | 2014210072 A1 | 12/2014 |
| WO | 2015166608 A1 | 11/2015 |

OTHER PUBLICATIONS

International Search Report issued for International Patent Application No. PCT/JP2016/086369, dated Mar. 7, 2017, 7 pages including English translation.

* cited by examiner

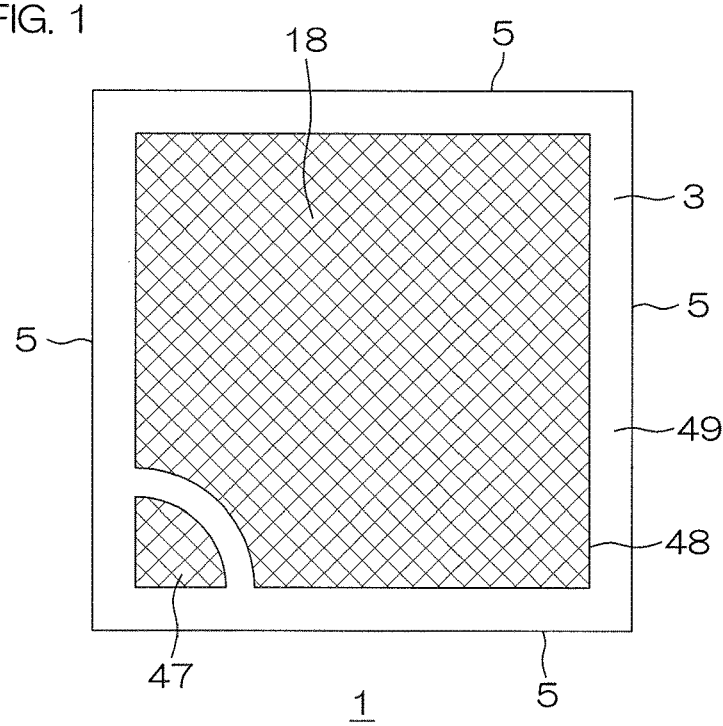
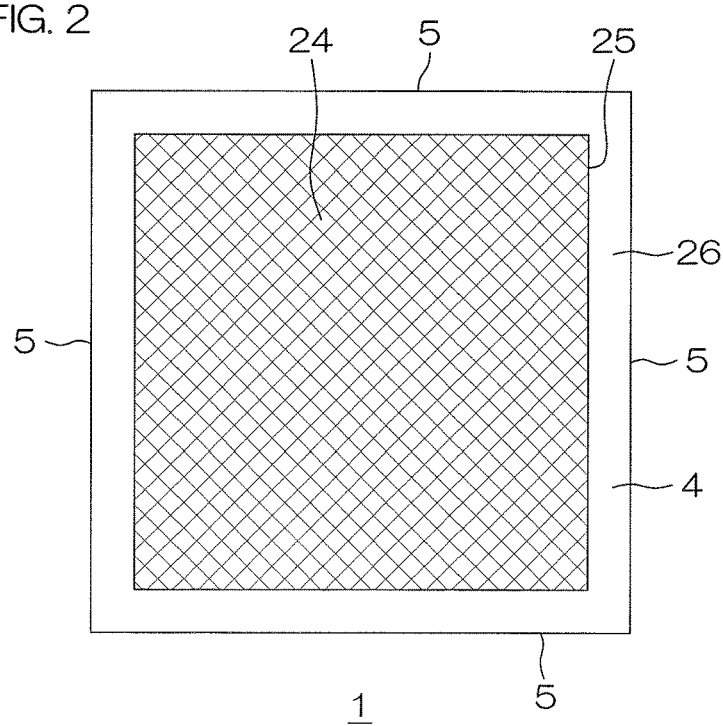

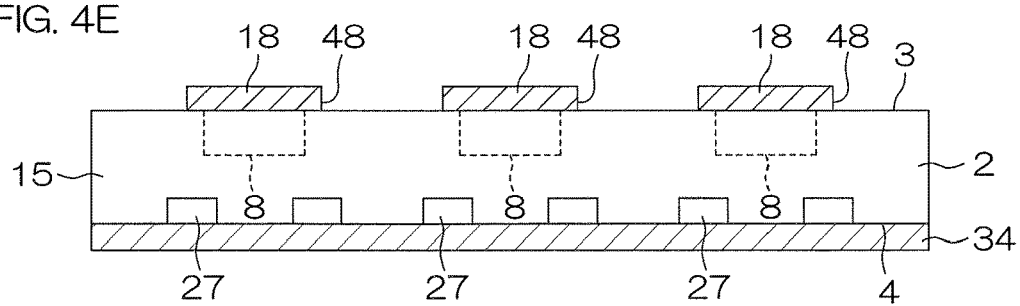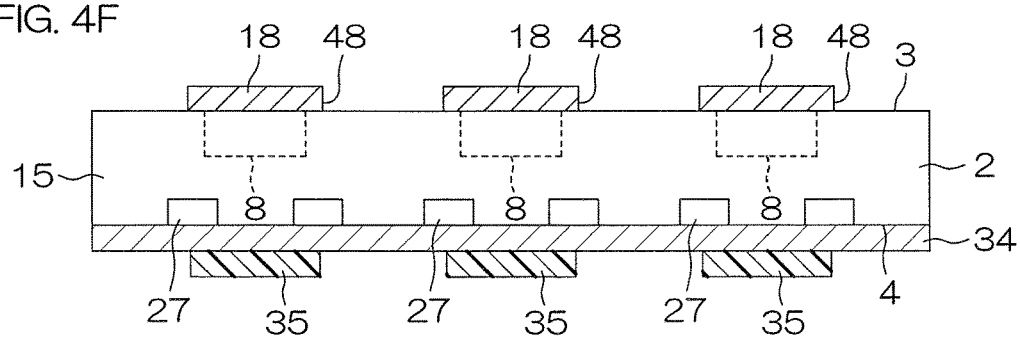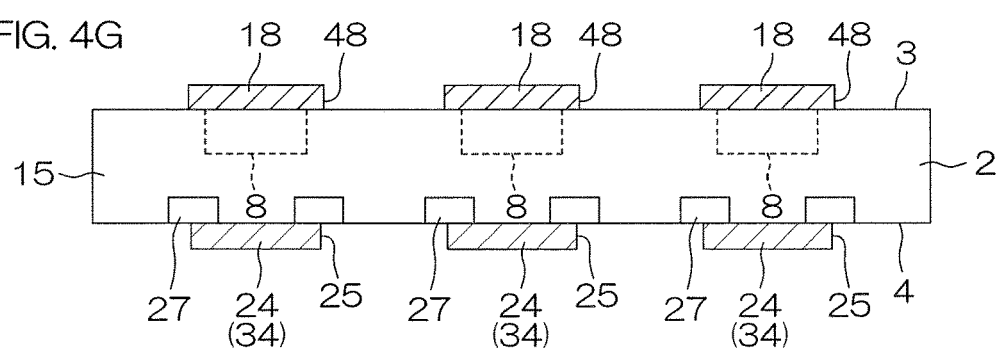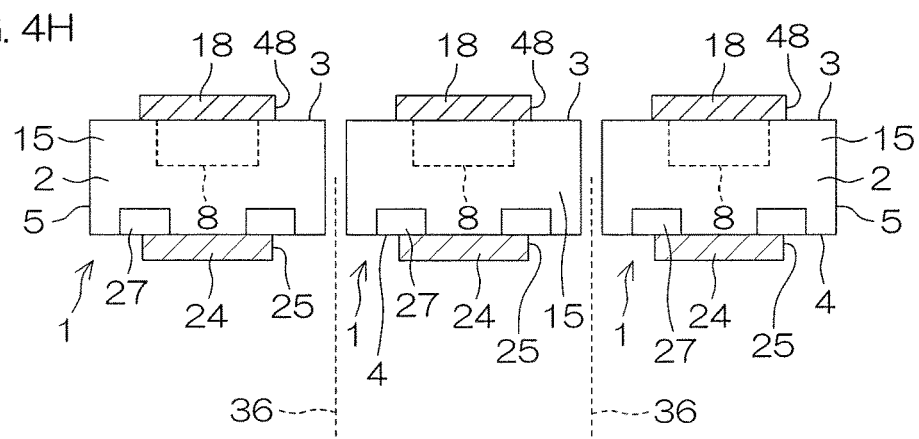

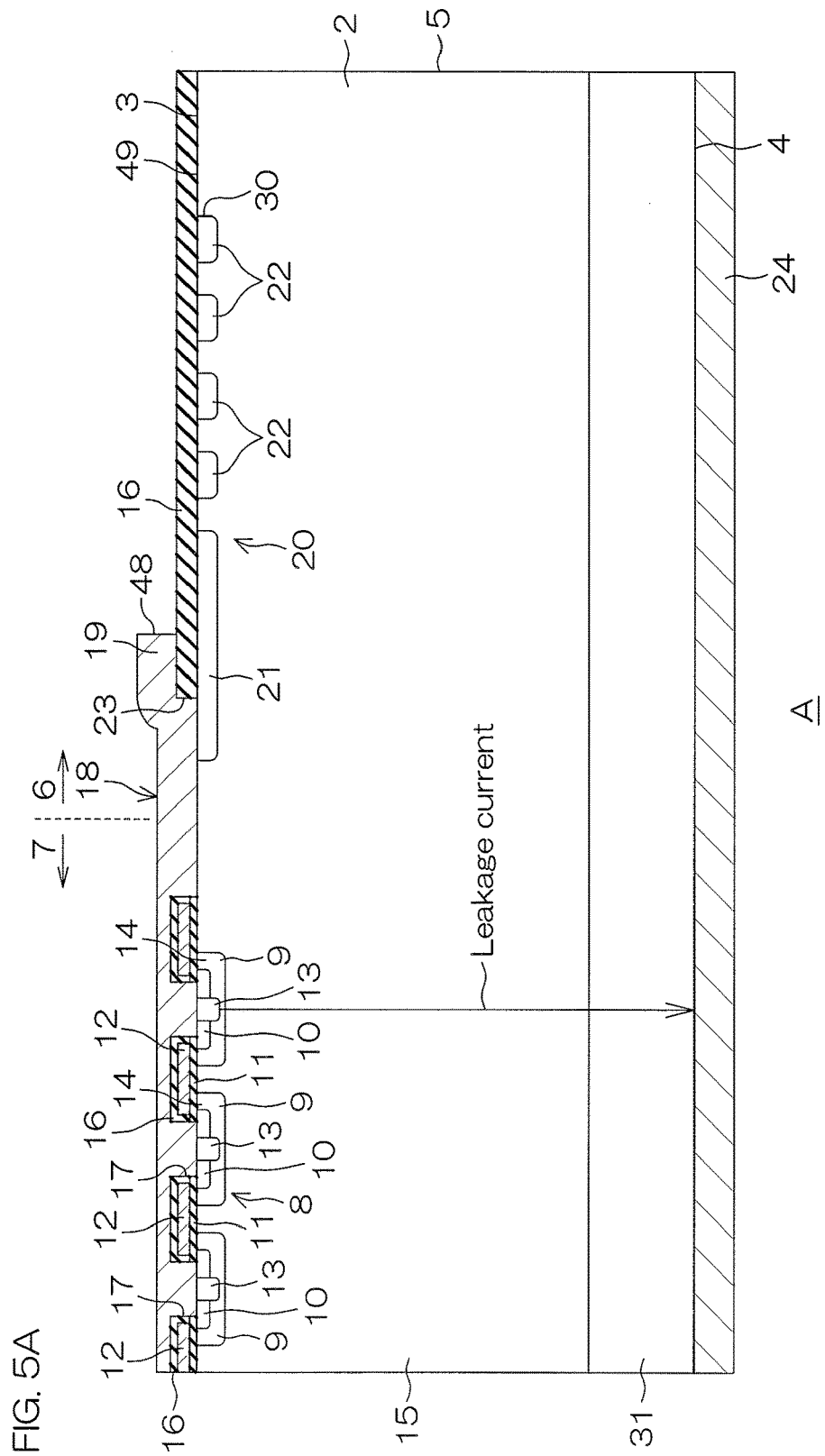

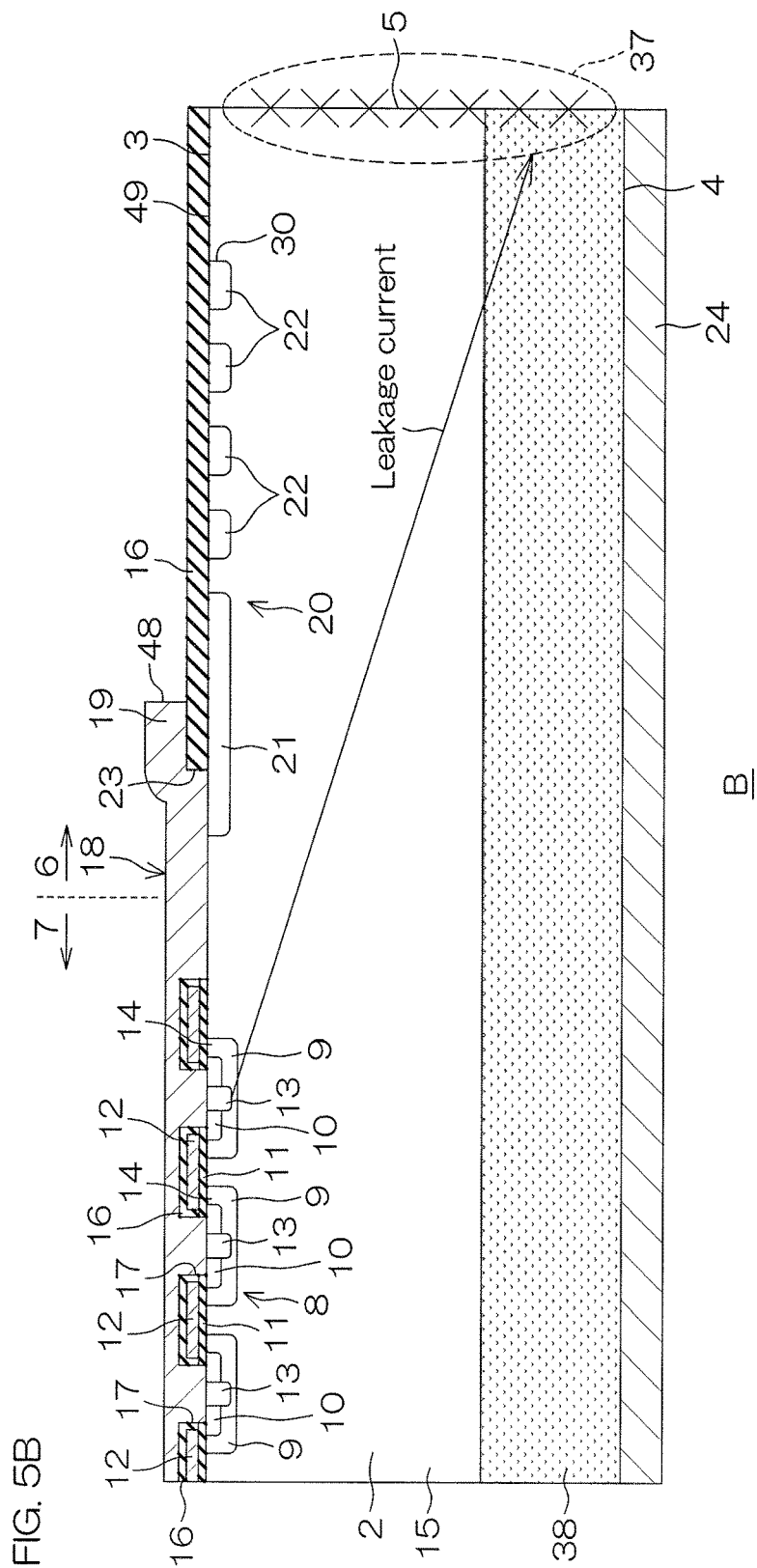

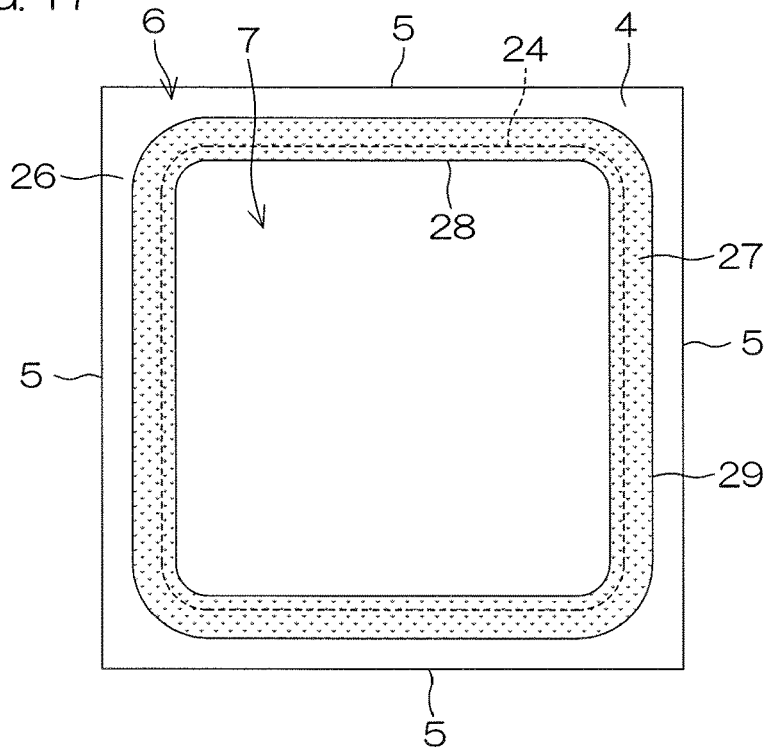
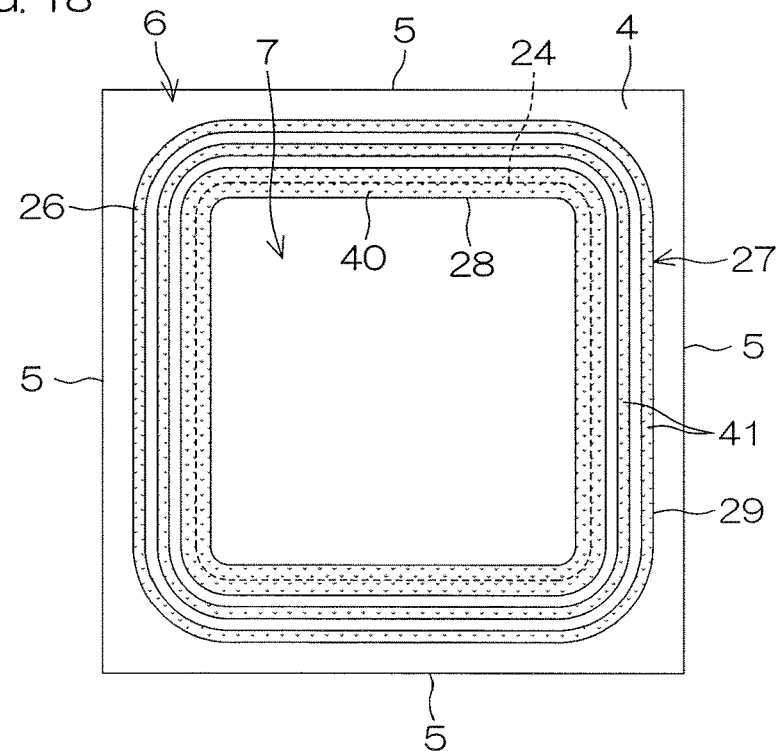

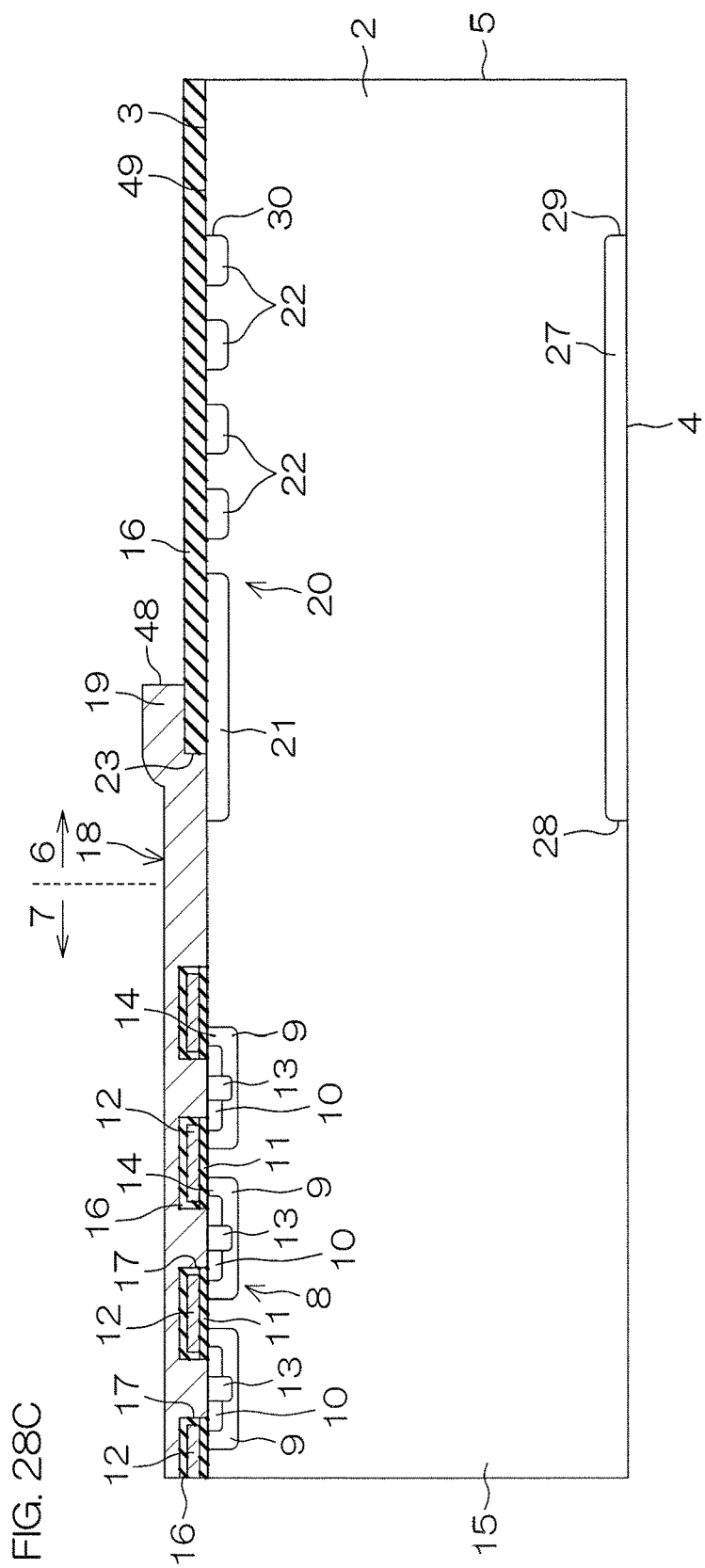

SEMICONDUCTOR DEVICE

TECHNICAL FIELD

The present invention relates to a semiconductor device.

BACKGROUND ART

Conventionally, as a high-voltage bidirectional AC switch to be used in an electric power system, a bidirectional switch using MOSFET and IGBT has been known. The bidirectional switch is used in, for example, a matrix converter circuit and a neutral point clamp.

Normally, as shown in FIG. 23, a bidirectional switch 101 includes a combination of two transistors 102A and 102B and two diodes 103A and 103B. In the configuration shown in FIG. 23, the two transistors 102A and 102B are connected in series, and a conduction loss is determined by the sum of the conduction losses of the two transistors 102A and 102B, so that there is room for improvement in on-state power loss as a bidirectional switch.

Therefore, in recent years, a device having reliability in forward withstand voltage as well as in reverse withstand voltage, called a reverse blocking IGBT, has been proposed. As shown in FIG. 24, by connecting reverse blocking IGBTs 104A and 104B in parallel, a bidirectional switch 105 whose conduction loss can be calculated based on a single element can be configured.

For example, a metal film on an inner surface of a trench described in Patent Literature 1 functions as a Schottky electrode that forms a Schottky junction with an n type SIC layer. In the device described in Patent Literature 1, when a reverse voltage to cause a negative potential at a drain electrode side is applied between the drain electrode and a source electrode, the Schottky junction is caused to bear the reverse voltage.

CITATION LIST

Patent Literature

Patent Literature 1: Japanese Patent Application Publication No. 2012-174831

SUMMARY OF THE INVENTION

Technical Problem

In a reverse blocking device, for example, to the outside of a back metal on a die-bonding side, a semiconductor surface (semiconductor region) of a semiconductor layer constituting a semiconductor chip is exposed in some cases. In this case, when a high voltage that makes the surface side positive is applied between a surface metal and the back metal, near an end surface on the die-bonding side of the semiconductor layer, a potential distribution that has the same potential as that of the surface side is generated.

Therefore, when a semiconductor device is mounted onto a conductive substrate by a bonding material such as solder, the semiconductor layer and the conductive substrate may short-circuit via the bonding material. Even when the bonding material is made thinner to prevent contact between the semiconductor layer and the conductive substrate, the distance between the semiconductor layer and the conductive substrate or the bonding material is short, and between these, discharge may occur. Therefore, a sufficient withstand voltage for use as a reverse blocking device cannot be secured.

Therefore, an object of the present invention is to provide a semiconductor device capable of preventing short-circuiting between a semiconductor layer and a conductive substrate when a first electrode on a die-bonding side is bonded and mounted onto the conductive substrate.

Solution to Problem

A semiconductor device according to a preferred embodiment of the present invention includes a semiconductor chip including a semiconductor layer that has a first surface on a die-bonding side, a second surface on the opposite side of the first surface, and an end surface extending in a direction crossing the first surface and the second surface, a first electrode that is formed on the first surface and has a peripheral edge at a position separated inward from the end surface, and a second electrode formed on the second surface, a conductive substrate onto which the semiconductor chip is die-bonded, a conductive spacer that has a planar area smaller than that of the first electrode and supports the semiconductor chip on the conductive substrate, and a resin package that seals at least the semiconductor chip and the conductive spacer.

With this configuration, even if a high potential distribution is generated on a semiconductor surface (semiconductor region) on the bonding side when a reverse voltage is applied between the first electrode and the second electrode, due to the presence of the conductive spacer, an insulation distance can be secured between the potential distribution and the conductive substrate. As a result, discharge between the semiconductor layer and the conductive substrate can be prevented.

In addition, the conductive spacer has a planar area smaller than that of the first electrode of the semiconductor chip. Therefore, when bonding the semiconductor chip and the conductive spacer, by preparing in advance a suitable amount of bonding material for an area of a top surface of the conductive spacer, after bonding, an extra bonding material can be prevented from excessively spreading in the horizontal direction and coming into contact with the semiconductor layer. As a result, the semiconductor layer and the conductive spacer can be prevented from short-circuiting via the bonding material.

In a semiconductor device according to a preferred embodiment of the present invention, the conductive spacer may include a columnar spacer integrally formed with the conductive substrate.

In a semiconductor device according to a preferred embodiment of the present invention, the columnar spacer may be formed into a rectangular parallelepiped shape having a side surface perpendicular to a surface of the conductive substrate.

In a semiconductor device according to a preferred embodiment of the present invention, the columnar spacer may be formed into the shape having a tapered side surface inclined with respect to the surface of the conductive substrate.

In a semiconductor device according to a preferred embodiment of the present invention, the columnar spacer may be formed into a shape having a side surface including a curved surface concaved toward the inside of the columnar spacer.

In a semiconductor device according to a preferred embodiment of the present invention, the conductive spacer may be bonded to the conductive substrate via a second bonding material.

In a semiconductor device according to a preferred embodiment of the present invention, the conductive spacer and the conductive substrate may be formed of materials different from each other.

A semiconductor device according to a preferred embodiment of the present invention may include a semiconductor chip including a semiconductor layer that has a first surface on a die-bonding side, a second surface on the opposite side of the first surface, and an end surface extending in a direction crossing the first surface and the second surface, a first electrode that is formed on the first surface and has a peripheral edge at a position separated inward from the end surface, and a second electrode formed on the second surface, a conductive substrate onto which the semiconductor chip is die-bonded, a conductive spacer that is a hollow conductive spacer formed by selectively projecting a part of the conductive substrate and has a planar area smaller than that of the first electrode, and a resin package that seals at least the semiconductor chip and the conductive spacer.

In a semiconductor device according to a preferred embodiment of the present invention, the semiconductor chip may have, in a surface portion of the semiconductor layer on the first surface side, a first conductivity type first impurity region electrically connected to the first electrode, and a second conductivity type second impurity region exposed on the outer side of the first electrode, and the second impurity region may have a portion that becomes the same potential as that of the second electrode when a reverse voltage is applied between the first electrode and the second electrode.

A semiconductor device according to a preferred embodiment of the present invention may include a bonding material that is provided between the conductive spacer and the first electrode of the semiconductor chip, and has a projecting portion projecting from the conductive spacer and fitting inside the first electrode.

A semiconductor device according to a preferred embodiment of the present invention may further include a protective insulation film that is formed in contact with at least a peripheral edge portion of the first electrode, and covers an area from the peripheral edge of the first electrode to the end surface of the semiconductor layer.

In a semiconductor device according to a preferred embodiment of the present invention, a part of the resin package may enter a space between a portion of the semiconductor chip on an outer side of the conductive spacer and the conductive substrate, and when a withstand voltage of the semiconductor device is $V_{B1}$ (V), a withstand voltage of the resin package per unit length is $V_{B2}$ (V/mm), and a height distance between the semiconductor chip and the conductive substrate is H, the height H may exceed $V_{B1}/V_{B2}$.

In a semiconductor device according to a preferred embodiment of the present invention, a part of the resin package may enter a space between a portion of the semiconductor chip on an outer side of the conductive spacer and the conductive substrate, and when a withstand voltage of the semiconductor device is $V_{B1}$ (V), a withstand voltage of the resin package per unit length is $V_{B2}$ (V/mm), and a distance between a peripheral surface of the conductive spacer and a peripheral surface of the second impurity region is L, the distance L may exceed $V_{B1}/V_{B2}$.

In a semiconductor device according to a preferred embodiment of the present invention, the conductive spacer may be made of Cu or an alloy containing Cu, or a metal whose surface is plated with Cu.

In a semiconductor device according to a preferred embodiment of the present invention, the conductive substrate may include a substrate terminal that includes an island portion on which the semiconductor chip is disposed, and a terminal portion extending from the island portion.

In a semiconductor device according to a preferred embodiment of the present invention, the semiconductor chip may include an active region in which a plurality of transistors are formed in a surface portion of the semiconductor layer, and an outer peripheral region in which a protection element is formed so as to surround the active region.

In a semiconductor device according to a preferred embodiment of the present invention, the semiconductor layer may be a wide bandgap type semiconductor layer.

A power converter according to a preferred embodiment of the present invention uses the semiconductor device as a bidirectional switch circuit.

BRIEF DESCRIPTION OF THE DRAWINGS

FIG. 1 is a schematic plan view of a semiconductor device according to a preferred embodiment of the present invention.

FIG. 2 is a schematic bottom view of the semiconductor device according to the preferred embodiment of the present invention.

FIG. 4E is a view showing a next step of FIG. 4D.

FIG. 4F is a view showing a next step of FIG. 4E.

FIG. 4G is a view showing a next step of FIG. 4F.

FIG. 4H is a view showing a next step of FIG. 4G.

FIG. 5A is a schematic sectional view of a semiconductor device used to show an effect of reverse leakage characteristics.

FIG. 5B is a schematic sectional view of a semiconductor device used to show an effect of reverse leakage characteristics.

FIG. 17 is a view to describe a variation of a plane pattern of the back surface termination structure.

FIG. 18 is a view to describe a variation of a plane pattern of the back surface termination structure.

FIG. 28C is a view showing a next step of FIG. 28B.

DETAILED DESCRIPTION OF THE PREFERRED EMBODIMENTS

Figure 3:
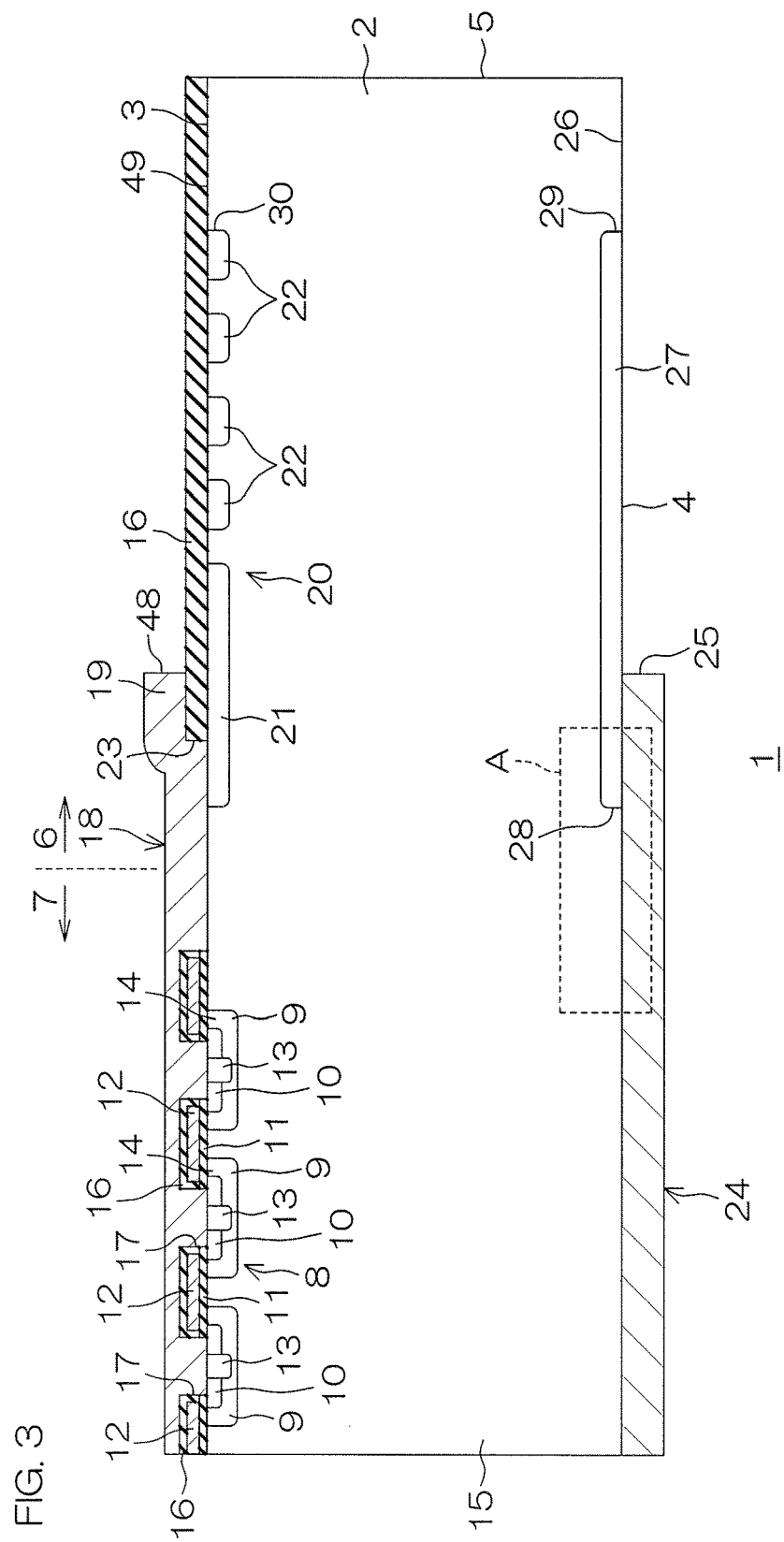
FIG. 3 is a schematic sectional view of the semiconductor device according to the preferred embodiment of the present invention.

Hereinafter, preferred embodiments of the present invention are described in detail with reference to the accompanying drawings.

FIG. 1 and FIG. 2 are respectively a plan view and a bottom view of a semiconductor device 1 according to a preferred embodiment of the present invention.

The semiconductor device 1 has, on its surface 3 side, a source electrode 18 and a gate pad 47, and on its back surface 4 side, a drain electrode 24.

The source electrode 18 is formed into a substantially quadrilateral shape on the substantially entire surface 3, and has a peripheral edge 48 at a position separated inward from an end surface 5 of the semiconductor device 1. At the peripheral edge, a surface termination structure such as a guard ring is provided which is described in the following description. Accordingly, on the surface 3 of the semiconductor device 1, a semiconductor region 49 is exposed around the source electrode 18. In this preferred embodiment, the semiconductor region 49 surrounding the source electrode 18 is exposed. The gate pad 47 is provided at a distance from the source electrode 18 at one corner portion of the source electrode 18.

As described in the following description, the drain electrode 24 is formed into a substantially quadrilateral shape on the substantially entire surface 4, and has a peripheral edge 25 at a position separated inward from the end surface 5 of the semiconductor device 1. Accordingly, on the back surface 4 of the semiconductor device 1, a semiconductor region 26 is exposed around the drain electrode 24. In this preferred embodiment, the semiconductor region 26 surrounding the drain electrode 24 is exposed.

FIG. 3 is a schematic sectional view of the semiconductor device 1 according to a preferred embodiment of the present invention.

The semiconductor device 1 includes a semiconductor layer 2 made of $n^-$ type SiC. The semiconductor substrate 2 has the surface 3 and the back surface 4 on the opposite side of the surface 3, and the end surface 5 extending in a direction crossing the surface 3 (extending in a perpendicular direction in FIG. 3). The surface 3 may be an Si surface of SiC, and the back surface 4 may be a C surface of SiC.

The semiconductor layer 2 has a thickness of 10 μm to 100 μm. The semiconductor layer 2 has an entirely substantially uniform impurity concentration, and has an impurity concentration of, for example, $1 \times 10^{14}$ $cm^{-3}$ to $1 \times 10^{17}$ $cm^{-3}$. Here, having an entirely substantially uniform impurity concentration means that the semiconductor layer 2 does not have an n type portion (for example, an $n^+$ type portion) with a comparatively high impurity concentration in its back surface portion (for example, a region from the back surface 4 to a certain distance in the thickness direction).

The semiconductor device 1 includes an outer peripheral region 6 set on its peripheral edge portion (portion near the end surface 5) and an active region 7 surrounded by the outer peripheral region 6.

In a surface portion of the semiconductor layer 2 in the active region 7, an MIS transistor structure 8 is formed. The MIS transistor structure 8 includes p type body regions 9, n+ type source regions 10, gate insulation films 11, gate electrodes 12, and p+ type body contact regions 13.

In detail, a plurality of p type body regions 9 are formed in the surface portion of the semiconductor layer 2. Each p type body region 9 forms a minimum unit (unit cell) in which a current flows in the active region 7. The n+ type source region 10 is formed in an inner region of each p type body region 9 so as to be exposed to the surface 3 of the semiconductor layer 2. In the p type body region 9, a region on the outer side of the n+ type source region 10 (region surrounding the n+ type source region 10) defines a channel region 14. The gate electrode 12 extends across adjacent unit cells and faces the channel regions 14 via the gate insulation film 11. The p+ type body contact region 13 penetrates through the n+ type source region 10 and is electrically connected to the p type body region 9.

Each portion of the MID transistor structure 8 is additionally described. An impurity concentration of the p type body region 9 is, for example, $1\times10^{16}$ cm$^{-3}$ to $1\times10^{19}$ cm$^{-3}$, an impurity concentration of the n+ type source region 10 is, for example, $1\times10^{19}$ cm$^{-3}$ to $1\times10^{21}$ cm$^{-3}$, and an impurity concentration of the p+ type body contact region is, for example, $1\times10^{19}$ cm$^{-3}$ to $1\times10^{21}$ cm$^{-3}$. The gate insulation film 11 is made of, for example, silicon oxide (SiO$_2$), and the thickness thereof is 20 nm to 100 nm. The gate electrode 12 is made of, for example, polysilicon.

In the semiconductor layer 2, an n$^-$ type region on the back surface 4 side with respect to the MIS transistor structure 8 is an n$^-$ type drift region 15, and is exposed to the back surface 4 of the semiconductor layer 2.

On the semiconductor layer 2, an interlayer dielectric film 16 is formed extending over both the active region 7 and the outer peripheral region 6. The interlayer dielectric film 16 is made of, for example, silicon oxide (SiO$_2$), and has a thickness of 0.5 μm to 3.0 μm. In the interlayer dielectric film 16, contact holes 17 to expose the n+ type source regions 10 and the p+ type body contact regions 13 of each unit cell are formed.

On the interlayer dielectric film 16, a source electrode 18 is formed. The source electrode 18 enters the respective contact holes 17 and comes into ohmic contact with the n+ type source regions 10 and the p+ type body contact regions 13. The source electrode 18 has an overlap portion 19 extending from the active region 7 to the outer peripheral region 6 and riding on the interlayer dielectric film 16 in the outer peripheral region 6.

In the surface portion of the semiconductor layer 2 in the outer peripheral region 6, a surface termination structure 20 is formed. The surface termination structure 20 may include a plurality of portions having at least one portion overlapping a peripheral edge portion of the source electrode 18 (a peripheral edge portion of a junction portion joined to the semiconductor layer 2). In FIG. 3, the surface termination structure includes a RESURF layer 21 (RESURF: Reduced Surface Field) on the innermost side, and a plurality of guard ring layers 22 surrounding the RESURF layer 21. The RESURF layer 21 is formed to extend across the inside and the outside of an aperture 23 of the interlayer dielectric film 16, and is in contact with the peripheral edge portion of the source electrode 18 inside the aperture 23. The plurality of guard ring layers 22 are formed at intervals. The surface termination structure 20 may be formed of a p type impurity region.

On the back surface 4 of the semiconductor layer 2, a drain electrode 24 is formed. The drain electrode 24 is an electrode common to a plurality of unit cells. The drain electrode 24 is made of a metal (for example, a lamination structure of Ti/Al, etc.) that can form a Schottky junction with the semiconductor layer 2. In detail, it is required that a layer (for example, a Ti layer) in contact with the semiconductor layer 2 in the drain electrode 24 can form a Schottky junction with the semiconductor layer 2.

The drain electrode 24 is formed so as to have a peripheral edge 25 at a position separated inward from the end surface 5 of the semiconductor layer 2. Accordingly, on the back surface 4 of the semiconductor layer 2, the semiconductor region 26 is exposed around the drain electrode 24. In this preferred embodiment, a semiconductor region 26 surrounding the drain electrode 24 is exposed (refer to FIG. 17 to FIG. 22). The peripheral edge portion of the drain electrode 24 faces the peripheral edge portion of the source electrode 18 across the semiconductor layer 2. In detail, the drain electrode 24 has a peripheral edge portion that extends from the active region 7 to the outer peripheral region 6 and is disposed just below the surface termination structure 20 (in this preferred embodiment, the RESURF layer 21) in the outer peripheral region 6. The drain electrode 24 may be formed so as to have the same size as the source electrode 18 as shown in FIG. 3.

In the outer peripheral region 6, in a back surface portion of the semiconductor layer 2, a back surface termination structure 27 is formed. The back surface termination structure 27 includes an inner peripheral edge 28 on the inner side of the peripheral edge 25 of the drain electrode 24, and an outer peripheral edge 29 positioned on the outer side of the peripheral edge 25 of the drain electrode 24 and separated inward from the end surface 5 of the semiconductor layer 2. In this preferred embodiment, the formation range of the back surface termination structure 27 is substantially the same as that of the surface termination structure 20. Therefore, in a plan view, the outer peripheral edge 29 of the back surface termination structure 27 may coincide with the outer peripheral edge 30 of the outermost guard ring layer 22.

The back surface termination structure 27 may be a high-resistance region having a higher resistance than the n type drift region 15, or may be a p type impurity region. When it is a high-resistance region, the back surface termination structure 27 may have a crystal defect concentration of $1\times10^{14}$ cm$^{-3}$ to $1\times10^{21}$ cm$^{-3}$. On the other hand, in the case of the p type impurity region, the back surface termination structure 27 may have an impurity concentration of $1\times10^{16}$ cm$^{-3}$ to $1\times10^{19}$ cm$^{-3}$.

Next, referring to FIG. 4A to FIG. 4H, a method of manufacturing the semiconductor device 1 is described.

FIG. 4A to FIG. 4H are views showing a manufacturing process of the semiconductor device 1 in order of steps. In FIG. 4A to FIG. 4H, only the points of the method of manufacturing the semiconductor device 1 are described, so that the configuration of the semiconductor device 1 is more simply shown than the configuration shown in FIG. 3.

Figure 4A:
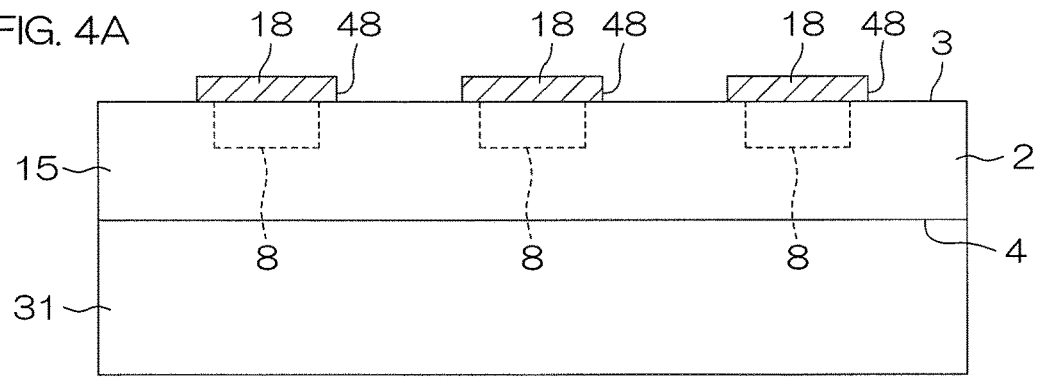
FIG. 4A is a view showing apart of a manufacturing process of the semiconductor device of FIG. 3.

In order to manufacture the semiconductor device 1, as shown in FIG. 4A, first, on a base substrate 31 (wafer) made of n+ type SiC (with an impurity concentration of, for example, $1\times10^{18}$ cm$^{-3}$ to $1\times10^{20}$ cm$^{-3}$), a semiconductor layer 2 with a lower concentration than the base substrate 31 is formed by epitaxial growth. A thickness of the base substrate 31 may be, for example, 250 μm to 450 μm. Next, by a known semiconductor manufacturing technology, the above-described MIS transistor structure 8 is formed in the surface portion of the semiconductor layer 2. Thereafter, the interlayer dielectric film 16 (not shown) and the source electrodes 18 are formed.

Figure 4B:
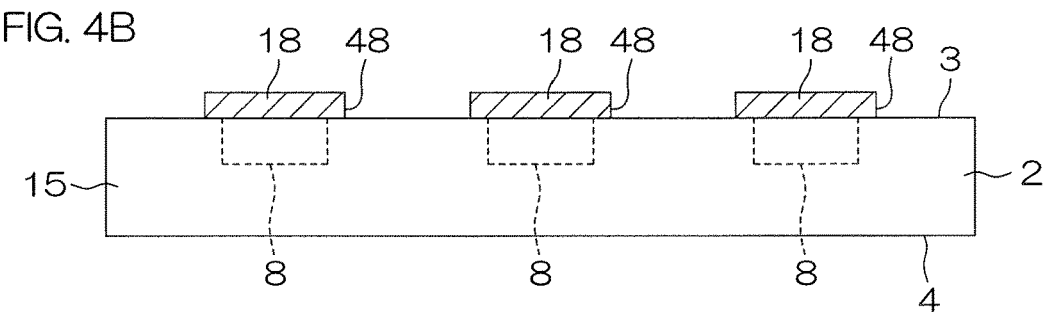
FIG. 4B is a view showing a next step of FIG. 4A.

Next, as shown in FIG. 4B, by removing the base substrate 31, the entire back surface 4 of the semiconductor layer 2 is exposed. In this step, for example, after the base substrate 31 is substantially completely removed by grinding from the back surface 4 side, polishing (for example, CMP) may be performed for finishing. In the polishing step, the semiconductor layer 5 exposed after grinding may be further thinned. In detail, it is possible that the base substrate 31 with a thickness of 350 μm is removed by back surface grinding, and thereafter, the semiconductor layer 2 with a thickness of 50 μm is ground to a thickness of 40 μm. By finally applying the polishing step, the surface state of the exposed back surface 4 of the semiconductor layer 2 can be made smooth, so that the drain electrode 24 can be satisfactorily Schottky-joined.

Figure 4C:
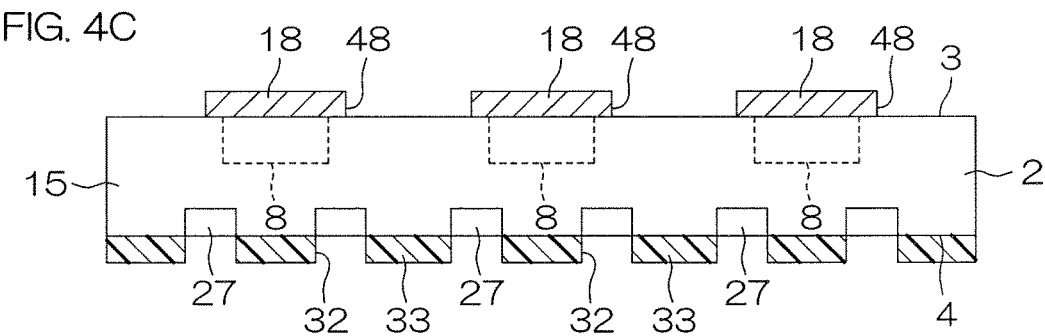
FIG. 4C is a view showing a next step of FIG. 4B.

Next, as shown in FIG. 4C, a resist film 33 selectively having apertures 32 is formed on the back surface 4 of the semiconductor layer 2, and via the resist film 33, p type impurity (for example, aluminum (Al)) ions are injected into the back surface 4 of the semiconductor layer 2. At this time, alignment (back surface alignment) to form the pattern of the resist film 33 may be performed based on a pattern on the surface 3 side seen through the semiconductor layer 2. For example, based on the source electrodes 18 seen through the semiconductor layer 2, the apertures 32 may be formed in the resist film 33 so as to overlap the source electrodes 18. Thereafter, by laser annealing, the p type impurity is activated and the back surface termination structure 27 is formed.

When the back surface termination structure 27 is formed as a high-resistance region, after forming the resist film 33, boron ions (B), p type impurity ions, protons, or electron beams are irradiated, and thereafter, by laser annealing or heat treatment at 500° C. or less, the back surface termination structure 27 is transformed into a high-resistance region with higher resistance than the semiconductor layer 2. By adopting laser annealing or heat treatment at 500° C. or less, the MIS transistor structure 8 that has already been formed on the surface 3 side of the semiconductor layer 2 can be protected. For example, the source electrodes 18 can be prevented from melting.

Figure 4D:
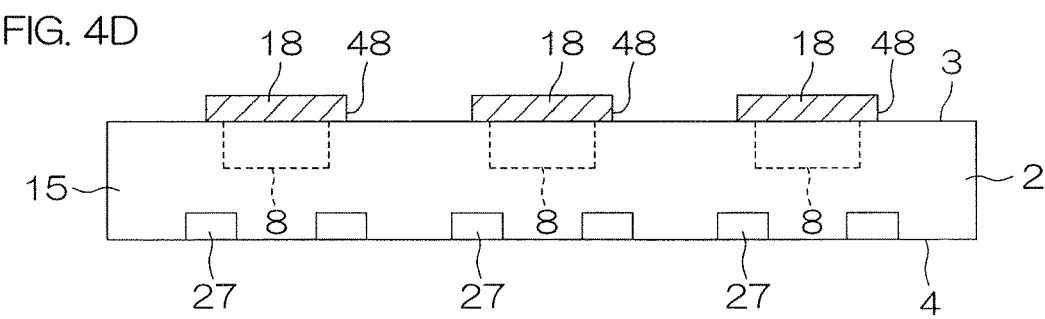
FIG. 4D is a view showing a next step of FIG. 4C.

Next, as shown in FIG. 4D, the resist film 33 is removed.

Next, as shown in FIG. 4E, by, for example, sputtering, a metal film 34 (for example, Ti/Al) is formed on the entire back surface 4 of the semiconductor layer 2.

Next, as shown in FIG. 4F, on the metal film 34, a resist film 35 that selectively covers regions in which drain electrodes 24 should be formed is formed.

Next, as shown in FIG. 4G, by etching via the resist film 35, the metal film 34 is selectively removed. Accordingly, the drain electrodes 24 are formed. By performing alignment to form the pattern of the resist film 35 based on the source electrodes 18, as shown in FIG. 3, the drain electrodes 24 and the source electrodes 18 can be formed so as to have the same size. After forming the drain electrodes 24, the resist film 35 is removed.

Next, as shown in FIG. 4H, along dicing lines 36 set at positions away from the peripheral edges 25 of the drain electrodes 24, the semiconductor layer 2 is cut. Accordingly, individualized semiconductor devices 1 are obtained.

According to the method described above, unlike trench formation by etching disclosed in Patent Literature 1, a Schottky junction surface (back surface 4) in the semiconductor layer 2 can be easily exposed by removing the base substrate 31. By forming the drain electrode 24 into a desired size on this Schottky junction surface, a Schottky junction area can be set. For example, as shown in FIG. 4E to FIG. 4G, the metal film 34 is formed on the entire back surface 4 of the semiconductor layer 2, and by patterning the metal film 34, drain electrodes 24 with desired sizes can be easily obtained.

Next, effects of the semiconductor device 1 according to the present preferred embodiment are described.

Figure 5C:
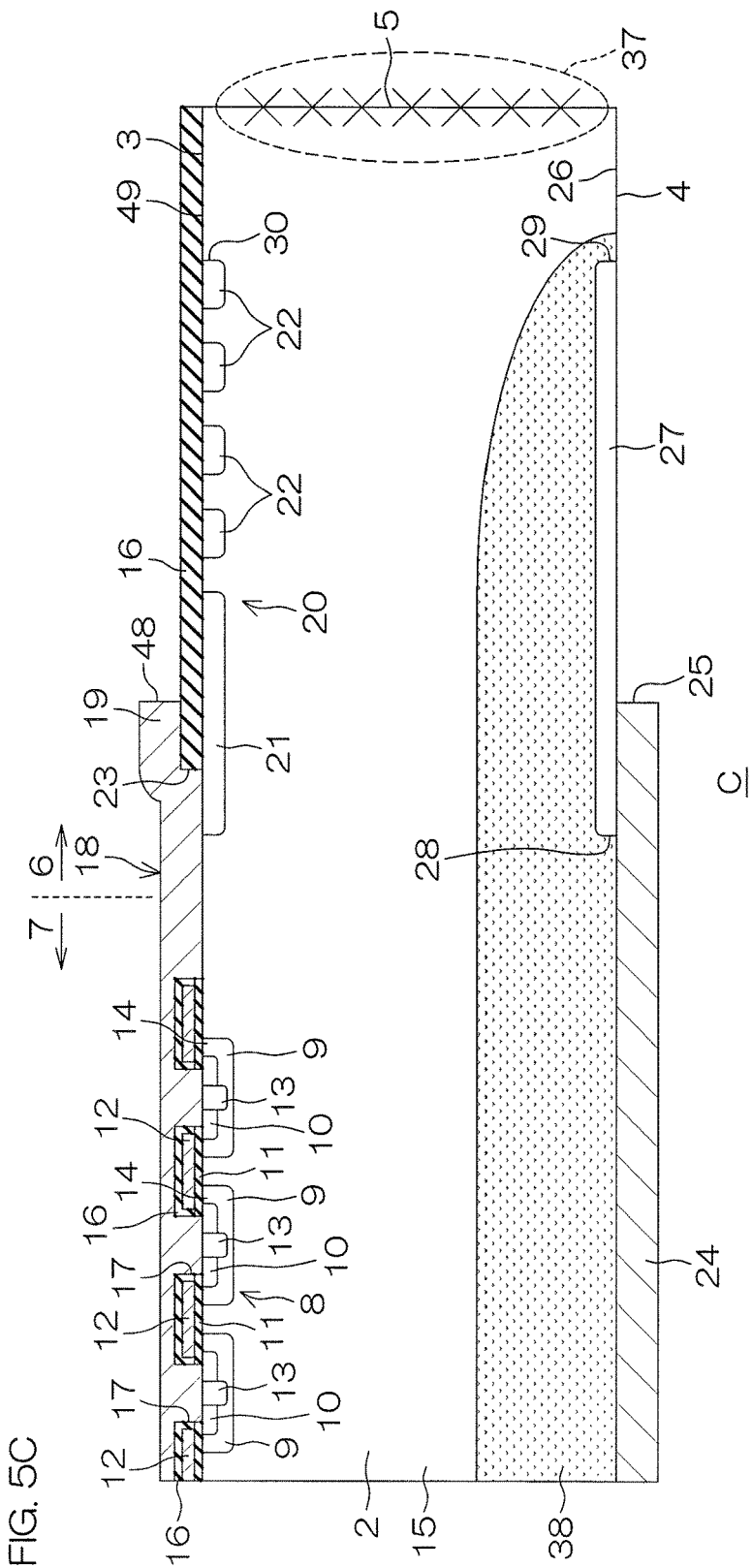
FIG. 5C is a schematic sectional view of a semiconductor device used to show an effect of reverse leakage characteristics.

FIG. 5A to FIG. 5C are schematic sectional views of semiconductor devices A, B, and C used to show effects of reverse leakage characteristics.

First, among FIG. 5A to FIG. 5C, the semiconductor device C shown in FIG. 5C is a semiconductor device having the same configuration as that of the semiconductor device 1 shown in FIG. 3 described above. On the other hand, in the semiconductor device A shown in FIG. 5A, the base substrate 31 made of $n^+$ type SiC remains on the back surface 4 of the semiconductor layer 2, and the drain electrode 24 is in ohmic contact with the base substrate 31. The semiconductor device B shown in FIG. 5B is in common with the semiconductor device C shown in FIG. 5 in that the base substrate 31 is not provided and the entire back surface 4 of the semiconductor layer 2 is exposed, and the drain electrode 24 forms a Schottky junction with the semiconductor layer 2, however, the drain electrode 24 is formed so as to reach the end surface 5 of the semiconductor layer 2, and the back surface termination structure 27 is not provided. In FIG. 5B and FIG. 5C, the reference sign 38 denotes a depletion layer when a reverse voltage is applied.

Figure 6:
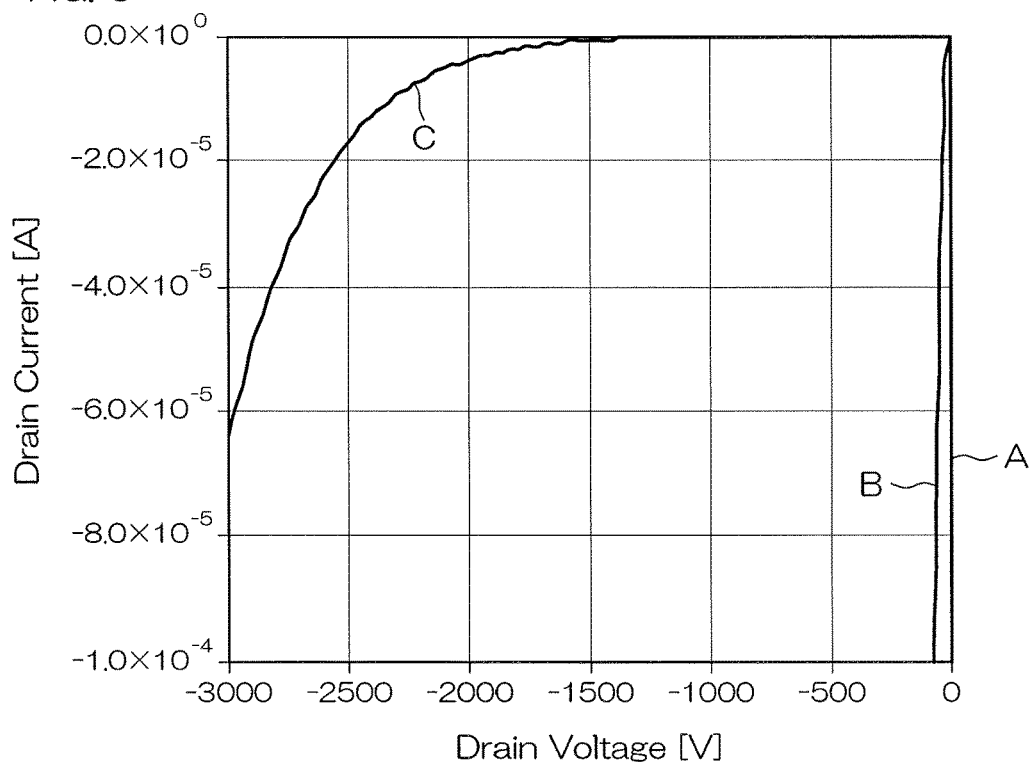
FIG. 6 is a graph showing reverse leakage characteristics of the semiconductor devices shown in FIG. 5A to FIG. 5C.

Reverse leakage characteristics of these semiconductor devices A, B, and C are shown in FIG. 6.

Referring to FIG. 6, in the configurations shown in FIG. 5A and FIG. 5B, when a reverse voltage is applied between the source and the drain, a reverse leakage current flows. In the configuration shown in FIG. 5A, a current is considered to flow to the back surface ohmic (drain electrode 24) via the body diode of the MIS transistor structure 8.

In the configuration shown in FIG. 5B, it is considered that, although a body diode current is blocked by a Schottky barrier of the drain electrode 24, electron-hole pairs are generated in a defect region 37 (defect in dicing) of the end surface 5 of the semiconductor layer 2, and a current flows by being drifted by an electric field in the depletion layer 38 extending from the Schottky interface (back surface 4) to the end surface 5.

On the other hand, in the configuration shown in FIG. 5C, it is found that a leakage current hardly flows before the reverse voltage reaches approximately −3 kV, and when −3 kV is applied, punch-through occurs. This is because a body diode current is blocked by the Schottky barrier of the drain electrode 24, and the back surface termination structure 27 is formed so as to overlap the peripheral edge portion of the drain electrode 24, so that when a reverse voltage is applied, the depletion layer 38 is prevented from reaching the end surface 5 (chip end surface 5) of the semiconductor layer 2. Accordingly, even when a defect region 37 is present at the end surface 5 of the semiconductor layer 2 due to dicing, a leakage current can be prevented from flowing due to generation of electron-hole pairs in the defect region 37. Therefore, in the semiconductor device C shown in FIG. 5C, a reverse withstand voltage of at least approximately 3 kV is realized.

Figure 7:
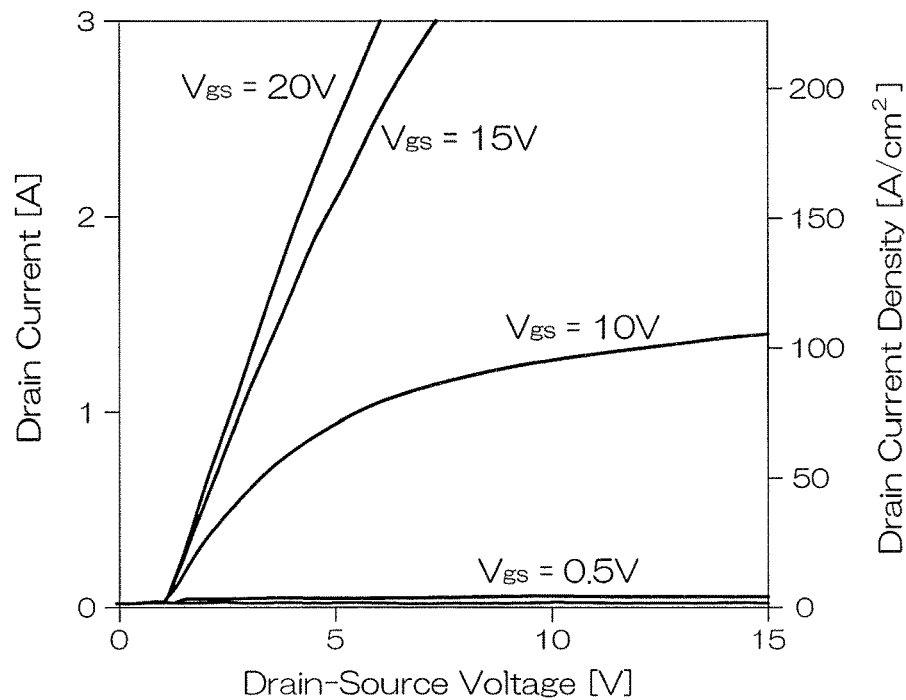
FIG. 7 is a graph showing forward Id-Vd characteristics of the semiconductor device shown in FIG. 5C.
Figure 8:
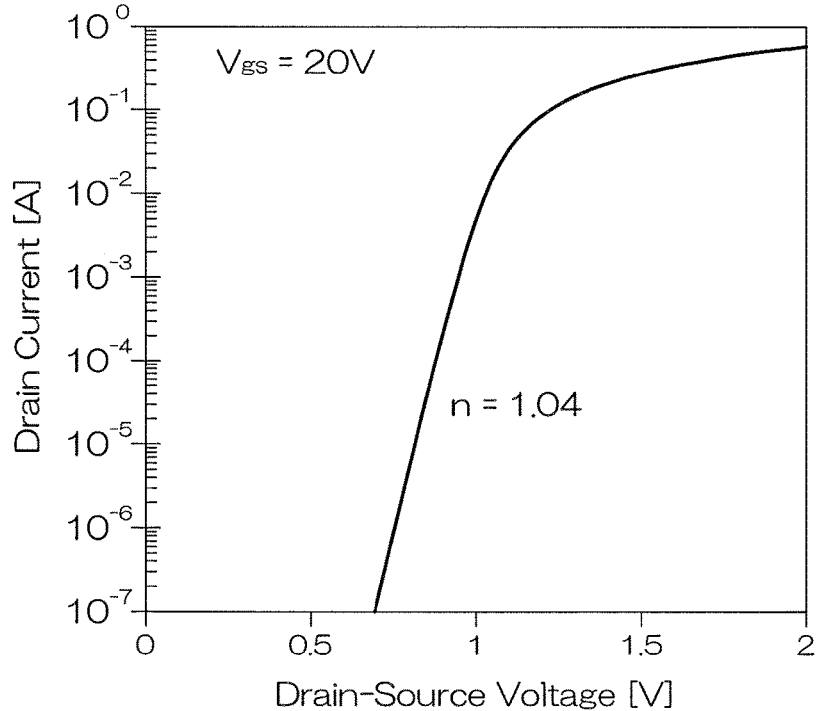
FIG. 8 is a graph showing forward Schottky characteristics of the semiconductor device shown in FIG. 5C.

Regarding the semiconductor device C shown in FIG. 5C, forward characteristics were further measured. The semiconductor device C as a measurement sample had a semiconductor layer 2 with a thickness of 40 μm (chip size: 1.6 mm square), and an area of the active region 7 was 1.3 mm². FIG. 7 is a graph showing forward Id-Vd characteristics of the semiconductor device C shown in FIG. 5C. FIG. 8 is a graph showing forward Schottky characteristics of the semiconductor device C shown in FIG. 5C.

Referring to FIG. 7, it could be confirmed that as the gate voltage Vgs was increased in stages to 0.5 V, 10 V, 15 V, and 20 V, the drain current flowed satisfactorily. Referring to FIG. 8, at the Schottky interface between the drain electrode 24 and the semiconductor layer 2, an ideal factor was 1.04, and this shows excellent forward Schottky characteristics.

Figure 9:
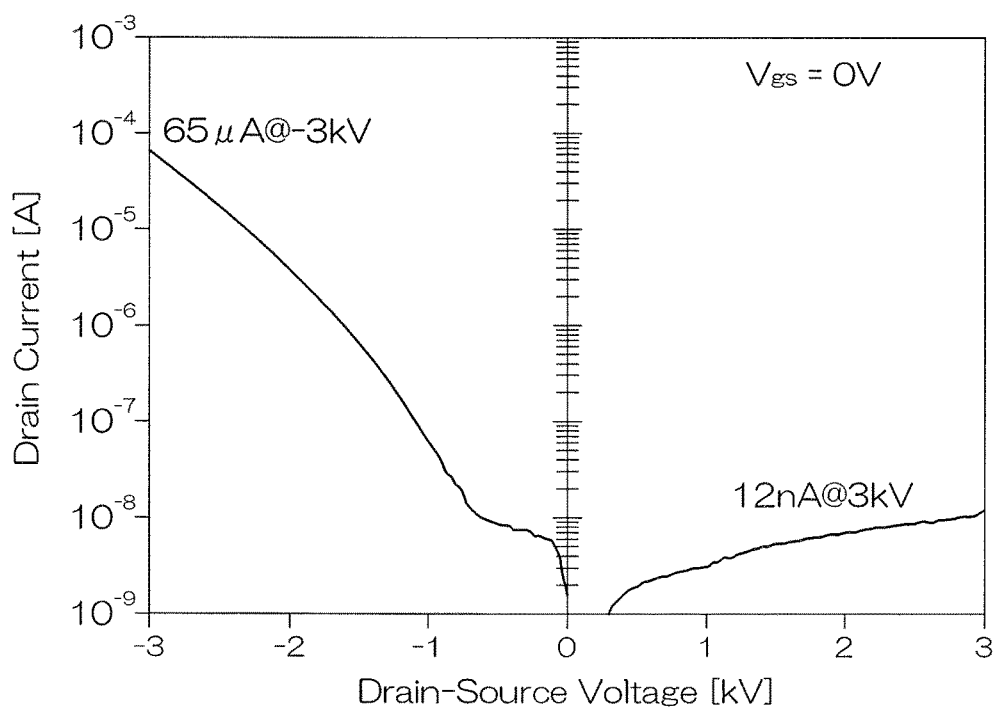
FIG. 9 is a graph showing withstand voltage characteristics of the semiconductor device shown in FIG. 5C.

From the results described above, withstand voltage characteristics of the semiconductor device C shown in FIG. 5C are summarized as shown in FIG. 9. That is, by adopting the configuration of the semiconductor device 1 according to the present preferred embodiment, as shown in FIG. 9, punch-through did not occur until the voltage reached approximately 3 kV in both reverse direction (negative drain-source voltage side) and forward direction (positive drain-source voltage side), and a withstand voltage of 3 kV or more could be realized.

Figure 10:
FIG. 10 is a circuit diagram of a bidirectional switch using reverse blocking SiC-MISFETs.

Thus, the semiconductor device 1 according to the present preferred embodiment can realize a bidirectional withstand voltage of 3 kV or more, and therefore, as shown in FIG. 10, by connecting two semiconductor devices 1 in parallel, they can be satisfactorily used as a bidirectional switch 39. In detail, in the withstand voltage state shown in FIG. 10, a reverse voltage is applied to the upper transistor 1A (left to right) and the lower transistor 1B (right to left), and a forward voltage is applied to the lower transistor 1B (left to right) and the upper transistor 1A (right to left), and due to sufficient withstand voltage characteristics in both directions, both ends of the transistors can be prevented from becoming conductive.

Further, when a current is supplied, a conduction loss can be calculated based on a single element of the upper or lower transistor 1A or 1B, so that an on-state loss can be suppressed to be low. In addition, by configuring the transistors 1A and 1B of the bidirectional switch 39 so as to have a MISFET configuration, a high-speed bidirectional switch with low power consumption can be realized as compared with the case using IGBT.

Next, a modification of the semiconductor device 1 according to the present preferred embodiment is described with reference to the drawings.

<Variations of Back Surface Termination Structure 27>

Figure 11:
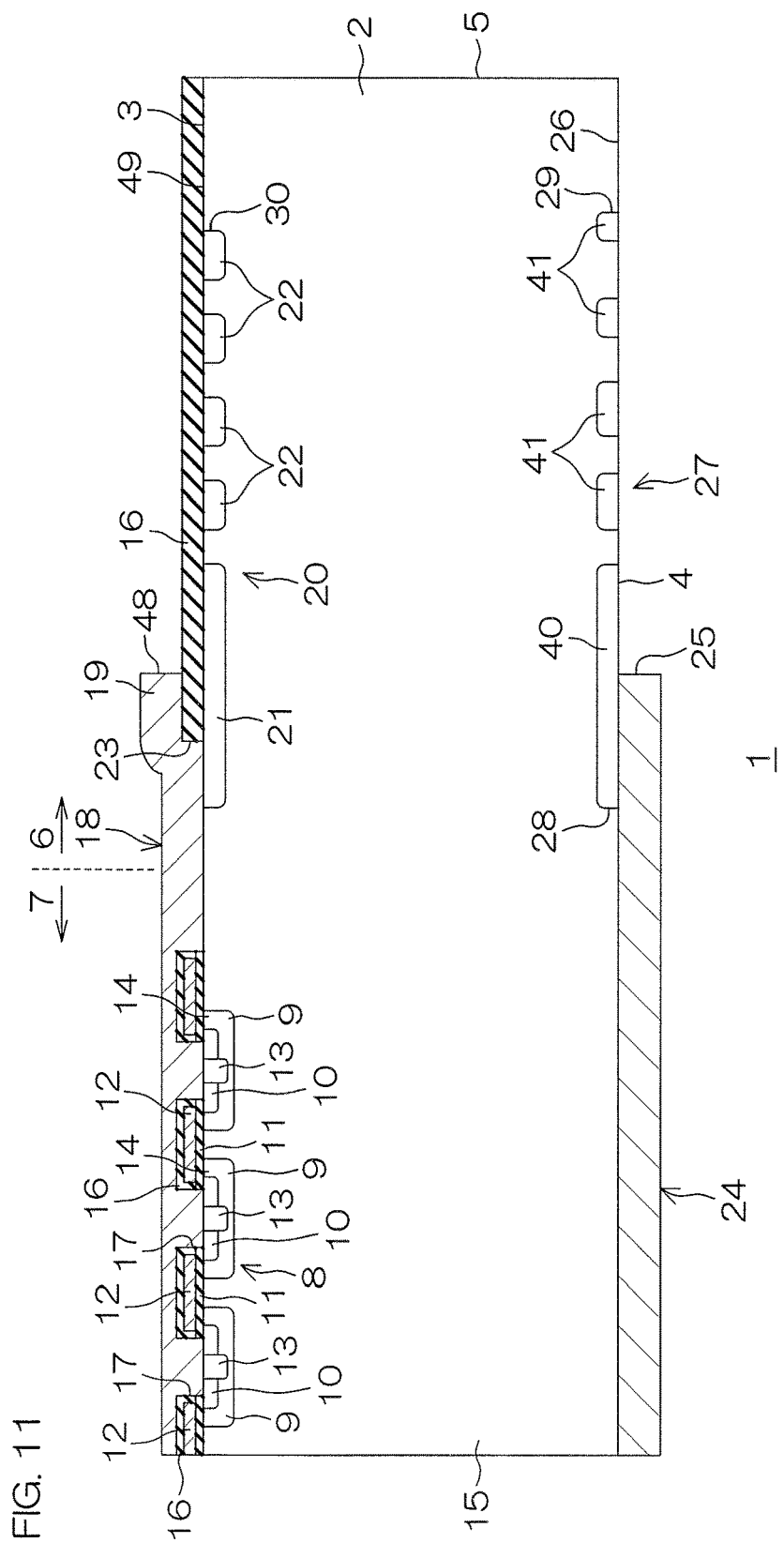
FIG. 11 is a view showing another form of a back surface termination structure shown in FIG. 3.
Figure 12:
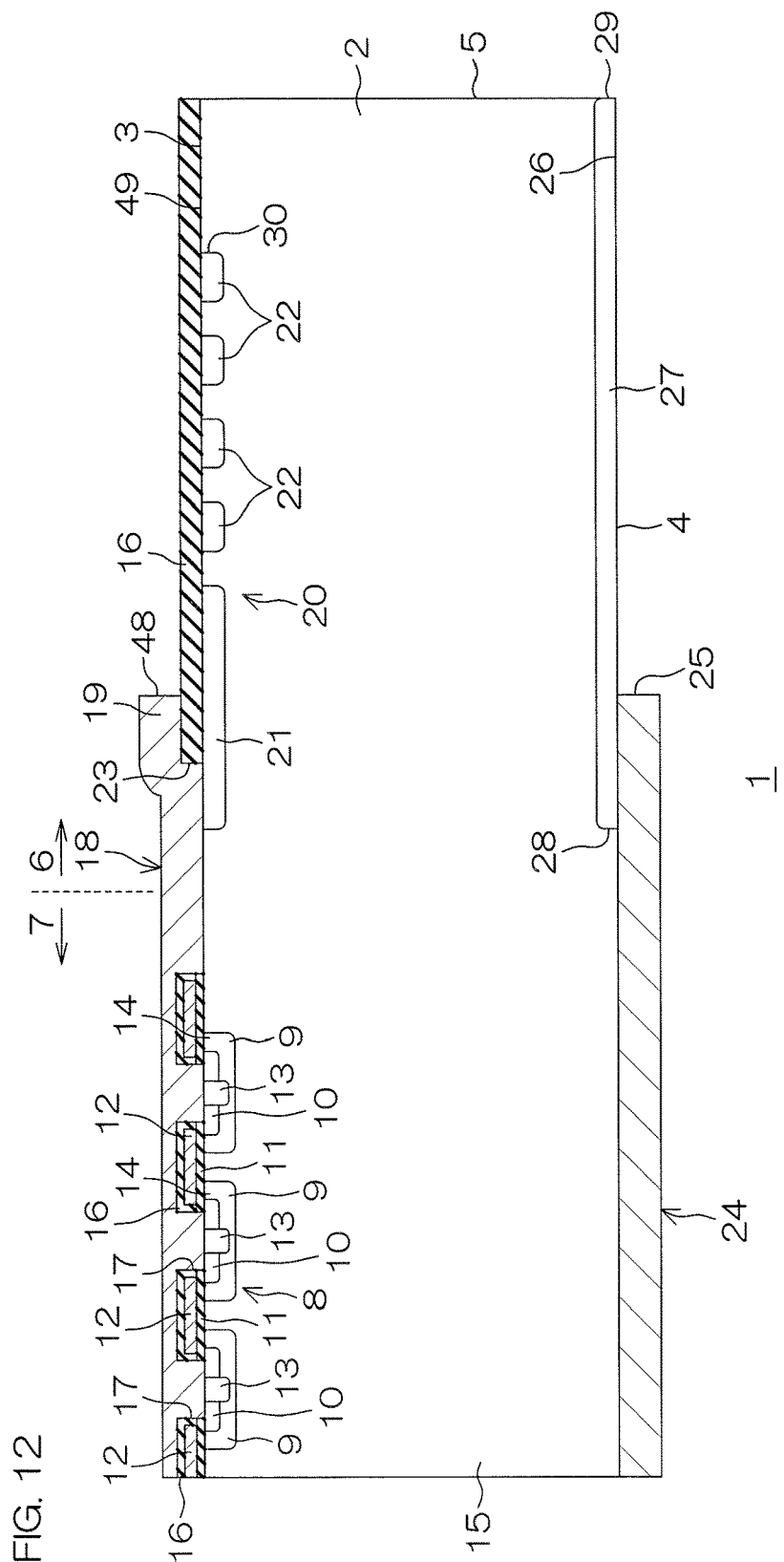
FIG. 12 is a view showing still another form of the back surface termination structure shown in FIG. 3.

FIG. 11 and FIG. 12 are views showing other forms of the back surface termination structure 27 shown in FIG. 3.

As shown in FIG. 11, the back surface termination structure 27 may include a plurality of portions having at least one portion overlapping a peripheral edge portion of the drain electrode 24. In FIG. 11, the back surface termination structure includes a RESURF layer 40 (RESURF: Reduced Surface Field) on the innermost side, and a plurality of guard rings 41 surrounding the RESURF layer 40. The RESURF layer 40 is formed to extend across the inside and the outside of the drain electrode 24, and is in contact with the peripheral edge portion of the drain electrode 24. The plurality of guard ring layers 41 are formed at intervals. The RESURF layer 40 and the guard ring layers 41 may face the RESURF layer 21 and the guard ring layers 22 of the surface termination structure 20 on a one-to-one basis.

As shown in FIG. 12, when the back surface termination structure 27 is a high-resistance region as described above, it may be formed so as to reach the end surface 5 of the semiconductor layer 2 from the peripheral edge portion of the drain electrode 24. That is, the outer peripheral edge 29 of the back surface termination structure 27 may coincide with the end surface 5 of the semiconductor layer 2.

<Structure to Prevent Punch-Through>

Figure 13:
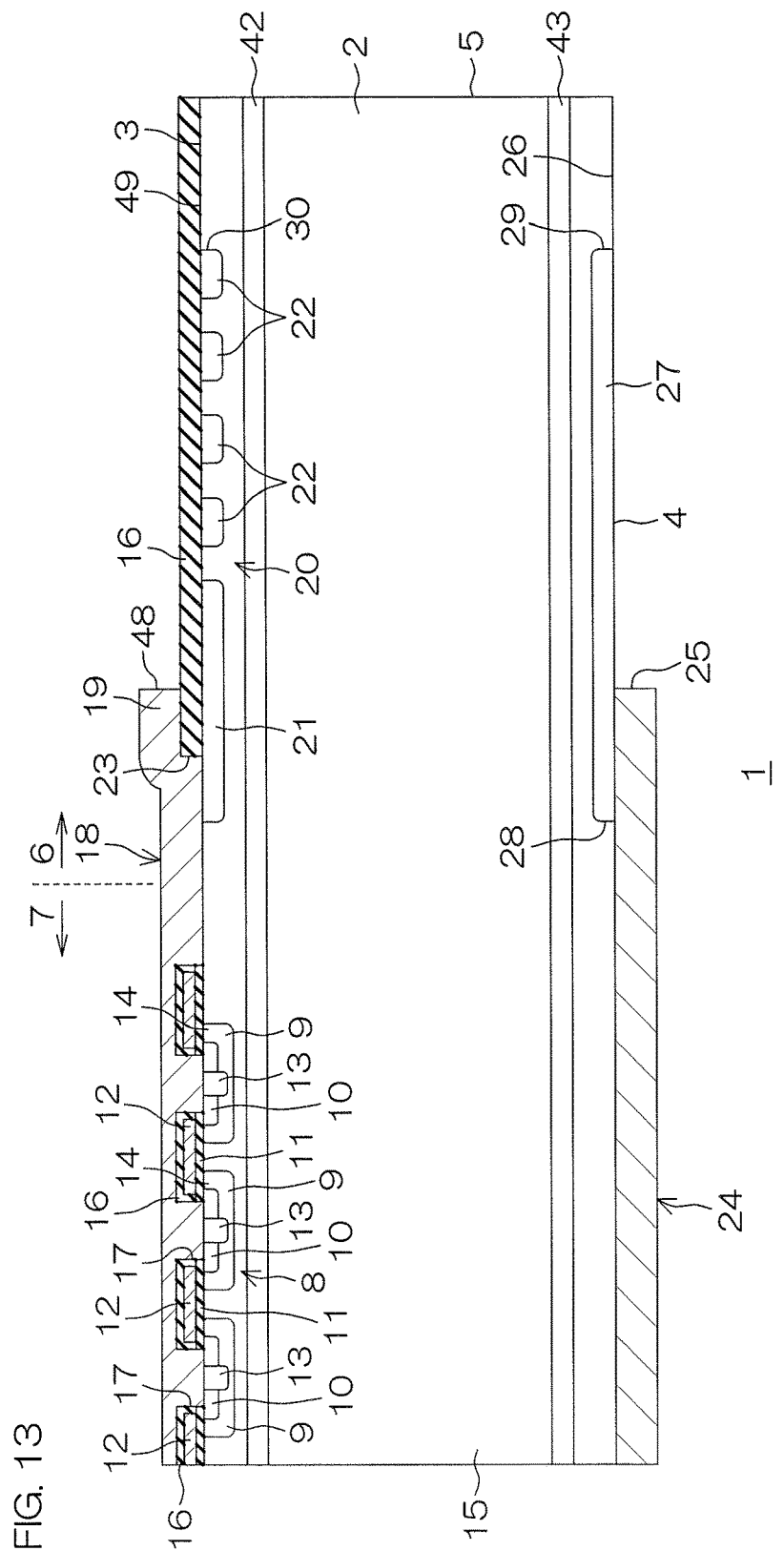
FIG. 13 is a schematic sectional view of a semiconductor device including field stop layers.
Figure 14:
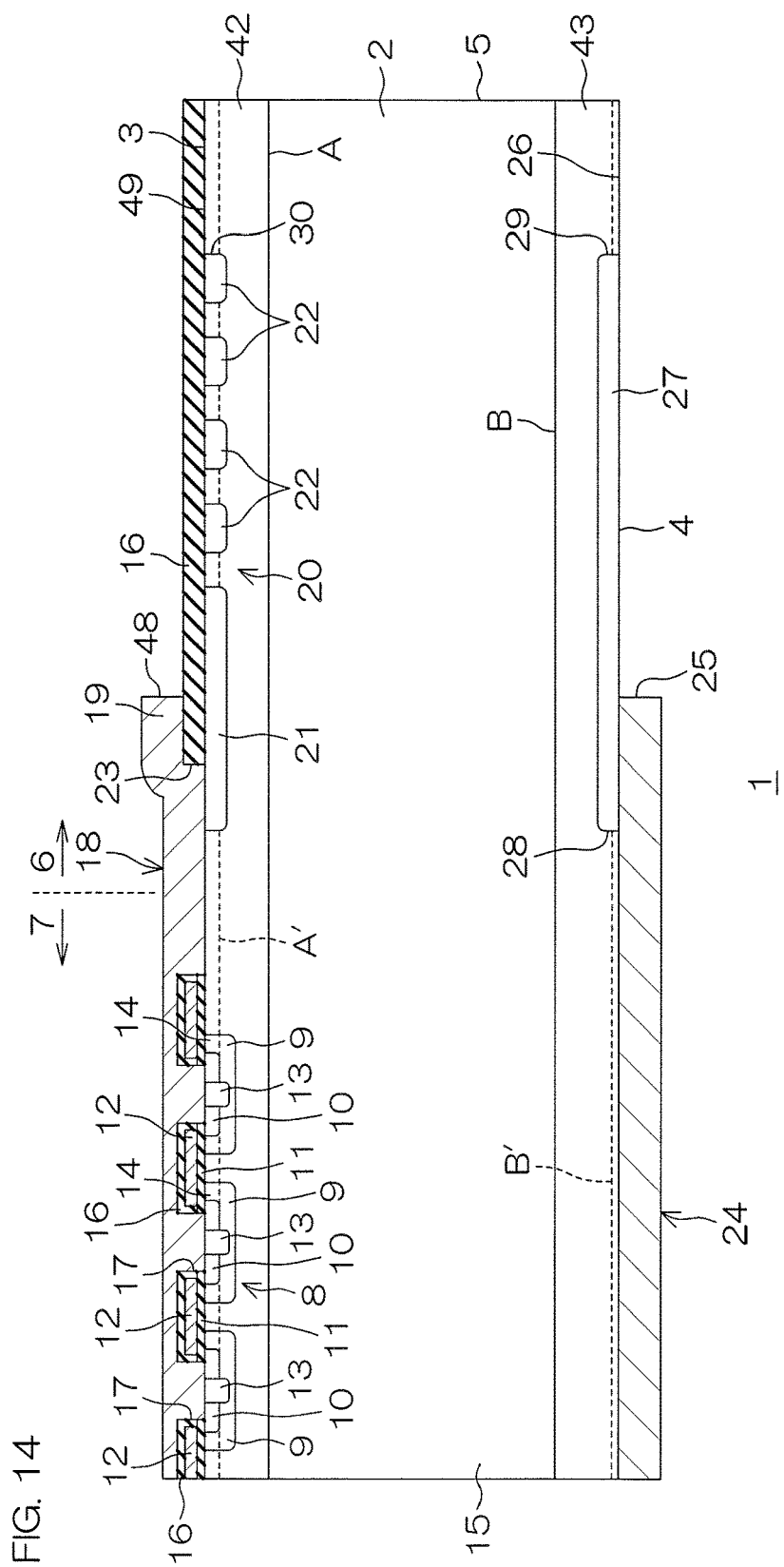
FIG. 14 is a schematic sectional view of a semiconductor device including field stop layers.

FIG. 13 and FIG. 14 are schematic sectional views of a semiconductor device 1 including field stop layers 42 and 43.

By forming the field stop layers 42 and 43, when a voltage is applied between the source and the drain, a depletion layer extending from a low-voltage side can be prevented from reaching a conduction pattern (for example, MIS transistor structure 8) on a high-voltage side. Accordingly, a leakage current due to a punch-through phenomenon can be prevented.

These field stop layers 42 and 43 are just required to be n type field stop layers that are formed on at least one of the surface 3 side and the back surface 4 side of the semiconductor layer 2, and have a higher impurity concentration than the n⁻ type drift region 15. In FIG. 13 and FIG. 14, both of the surface-side field stop layer 42 and the back surface-side field stop layer 43 are shown.

The field stop layers 42 and 43 may be disposed, for example, at depth positions away from the surface 3 or the back surface 4 of the semiconductor layer 2 as shown in FIG. 13.

In detail, the surface-side field stop layer 42 may be disposed below the MIS transistor structure 8 separated toward the back surface 4 side from the p type body regions 9.

On the other hand, the back surface-side field stop layer 43 may be disposed at an upper side separated toward the surface 3 side from the back surface termination structure 27.

It is also allowed that the field stop layers 42 and 43 are formed so as to reach the surface 3 or the back surface 4 of the semiconductor layer 2 as shown in FIG. 14.

In detail, the surface-side field stop layer 42 may be formed in an entire region from the surface 3 to a certain depth position so as to come into contact with the p type body regions 9 and the surface termination structure 20. In this case, the depth of the surface-side field stop layer 42 may be deeper than the p type body regions 9 (solid line A in FIG. 14), or may be set in the middle of the p type body regions 9 (dashed line A' in FIG. 14). That is, in the latter case, the p type body regions 9 are selectively exposed to the back surface 4 side from the surface-side field stop layer 42.

On the other hand, the back surface-side field stop layer 43 may be formed in an entire region from the back surface 4 to a certain depth position so as to come into contact with the back surface termination structure 27. In this case, the depth of the back surface-side field stop layer 43 may be deeper than the back surface termination structure 27 (solid line B in FIG. 14), or may be set in the middle of the back surface termination structure 27 (dashed line B' in FIG. 14). That is, in the latter case, the back surface termination structure 27 is selectively exposed to the surface 3 side from the back surface-side field stop layer 43.

Impurity concentrations of the field stop layers 42 and 43 may have profiles uniform in the depth direction of the semiconductor layer 2, or may have profiles having peaks at predetermined depth positions. When the impurity concentration has a peak, a concentration at this peak is just required to be higher than a concentration of the n⁻ type drift region 15.

The field stop layers 42 and 43 in FIG. 13 and FIG. 14 may be combined as appropriate. For example, it is also allowed that while the surface-side field stop layer 42 is disposed at a position separated from the surface 3 of the semiconductor layer 2, the back surface-side field stop layer 43 is formed so as to reach the back surface 4 of the semiconductor layer 2.

<Reduction in Back Surface Schottky Leakage>

Figure 15:
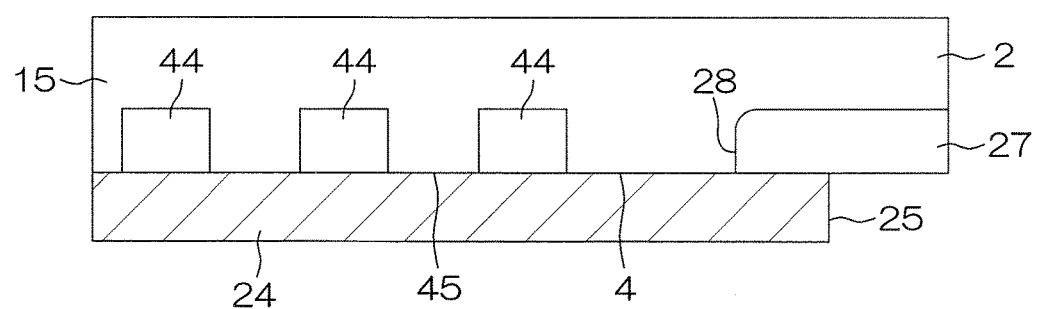
FIG. 15 is a view to describe field relaxation regions formed at a Schottky interface.
Figure 16:
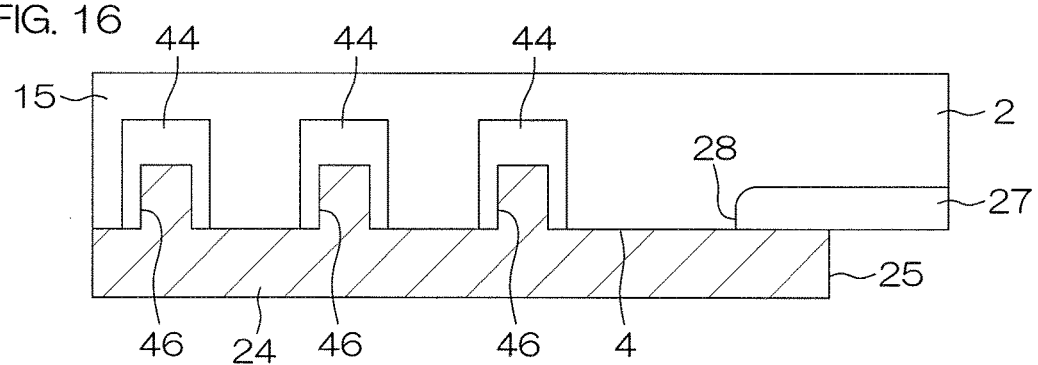
FIG. 16 is a view to describe field relaxation regions formed at a Schottky interface.

FIG. 15 and FIG. 16 are views to describe field relaxation regions 44 formed at the Schottky interface. FIG. 15 and FIG. 16 correspond to enlarged views of a region A enclosed by a dashed line in FIG. 3.

That is, the semiconductor device 1 may include field relaxation regions 44 that are formed in a back surface portion of the semiconductor layer 2 in a region on the inner side of the back surface termination structure 27, and are in contact with the drain electrode 24.

By forming the field relaxation regions 44, an electric field at the Schottky interface between the n⁻ type drift region 15 and the drain electrode 24 can be relaxed. Accordingly, even when a metal with a comparatively small work function is used as the drain electrode 24, a reverse leakage current can be reduced, so that by using this metal, a low on-state resistance can be secured. In detail, although it is also possible to reduce a reverse leakage current at the expense of a low on-state resistance, with this configuration, a reverse leakage current can be reduced by the field relaxation regions 44, so that a low on-state resistance can be realized by using a metal with a lower work function than a metal to be used when the field relaxation regions 44 are not provided.

The field relaxation regions 44 may be, like the back surface termination structure 27, high-resistance regions with higher resistance than the n⁻ type drift region 15, or may be p type impurity regions. In the case of high-resistance regions, the back surface termination structure 27 may have a crystal defect concentration of $1 \times 10^{14}$ cm$^{-3}$ to $1 \times 10^{21}$ cm$^{-3}$. On the other hand, in the case of p type impurity regions, the back surface termination structure 27 may have an impurity concentration of $1 \times 10^{16}$ cm$^{-3}$ to $1 \times 10^{19}$ cm$^{-3}$. By making the configurations of the field relaxation regions 44 and the back surface termination structure 27 equal to each other, these can be formed together in the same step (for example, the step shown in FIG. 4C).

As shown in FIG. 15, when the back surface 4 of the semiconductor layer 2 has a substantially uniform flat portion 45 in a region on the inner side of the back surface termination structure 27, the field relaxation regions 44 may be formed on the flat portion 45.

As shown in FIG. 16, when the back surface 4 of the semiconductor layer 2 selectively has trenches 46 in a region on the inner side of the back surface termination structure 27, the field relaxation regions 44 may be formed along inner surfaces of the trenches 46 in the n⁻ type drift region 15. In this case, the drain electrode 24 may be embedded in the trenches 46 and connected to the field relaxation regions 44 in the trenches 46.

<Plane Patterns of Back Surface Termination Structure 27 and Field Relaxation Regions 44>

Figure 19:
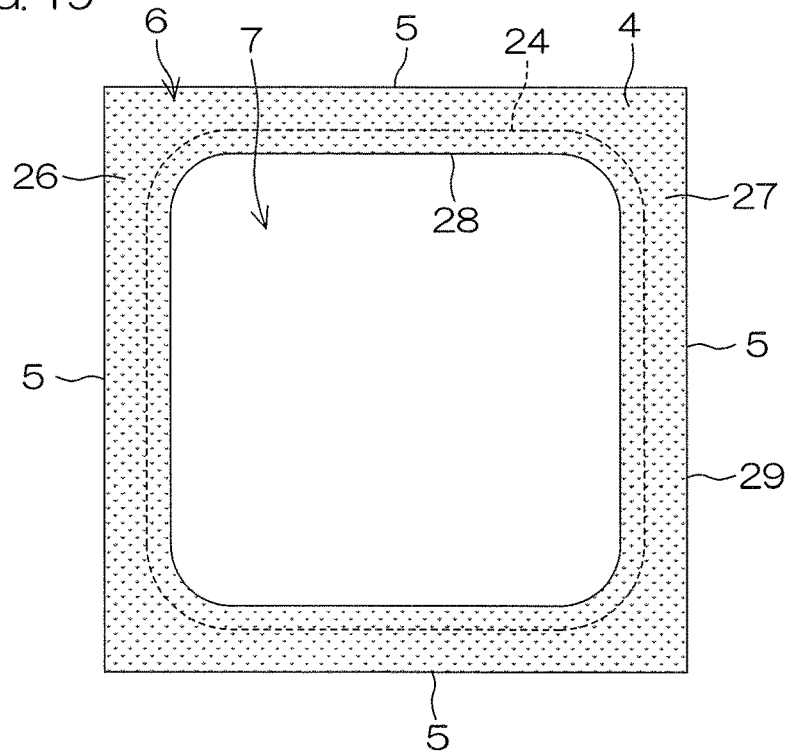
FIG. 19 is a view to describe a variation of a plane pattern of the back surface termination structure.
Figure 20:
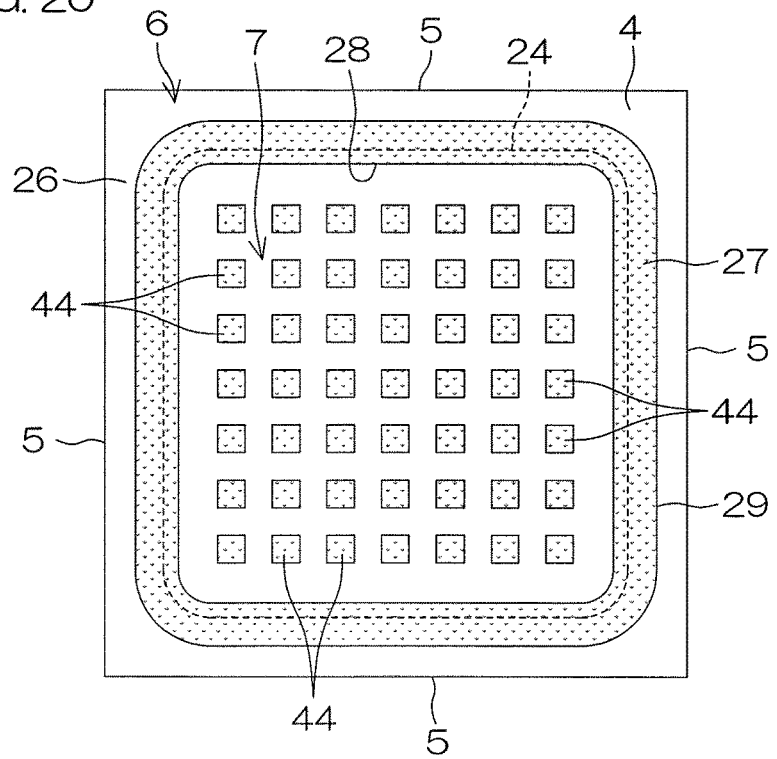
FIG. 20 is a view showing an example of a combination pattern of a back surface termination structure and field relaxation regions.
Figure 21:
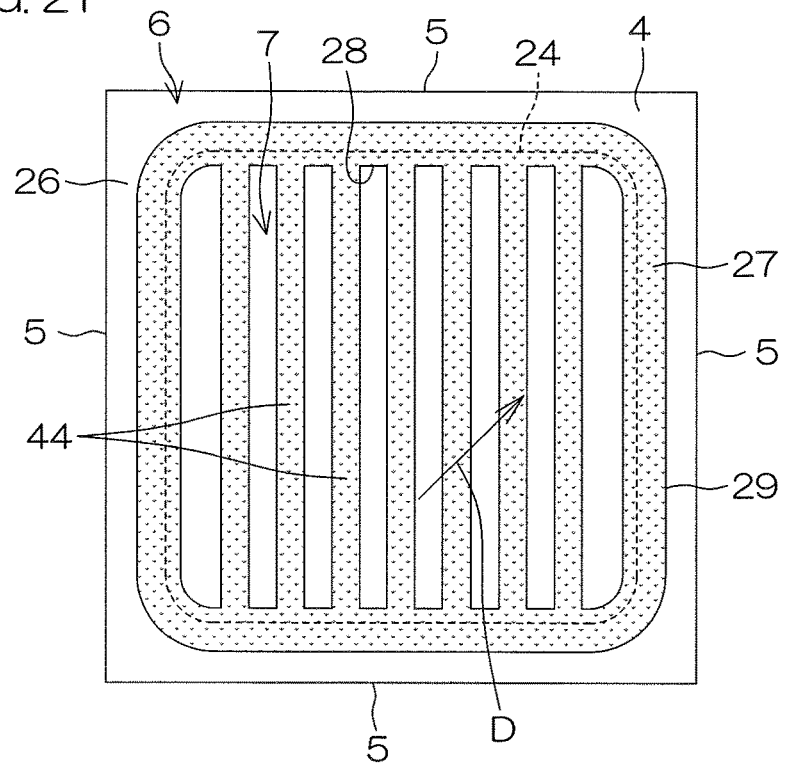
FIG. 21 is a view showing an example of a combination pattern of a back surface termination structure and field relaxation regions.
Figure 22:
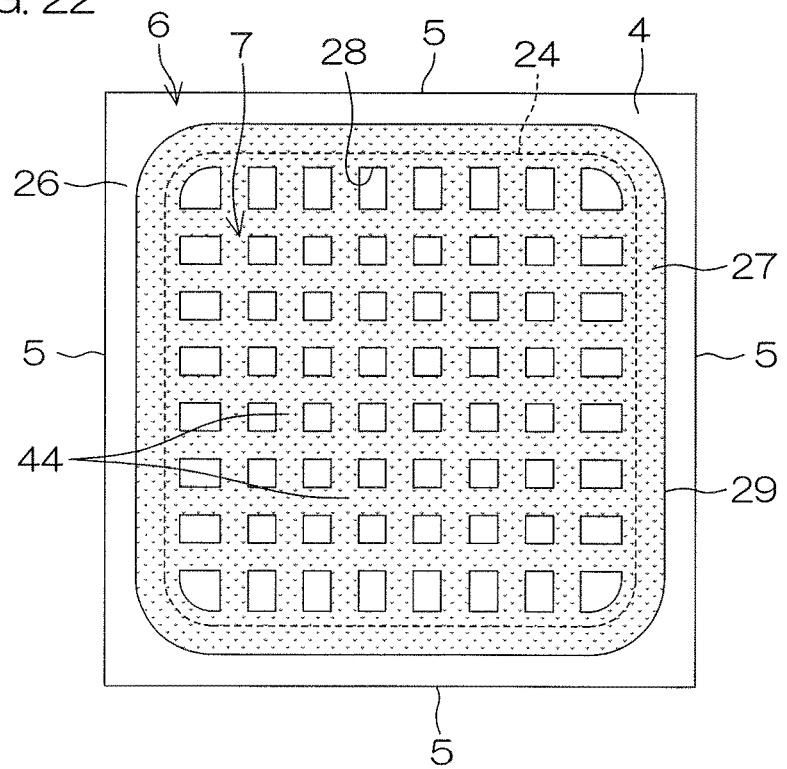
FIG. 22 is a view showing an example of a combination pattern of a back surface termination structure and field relaxation regions.
Figure 23:
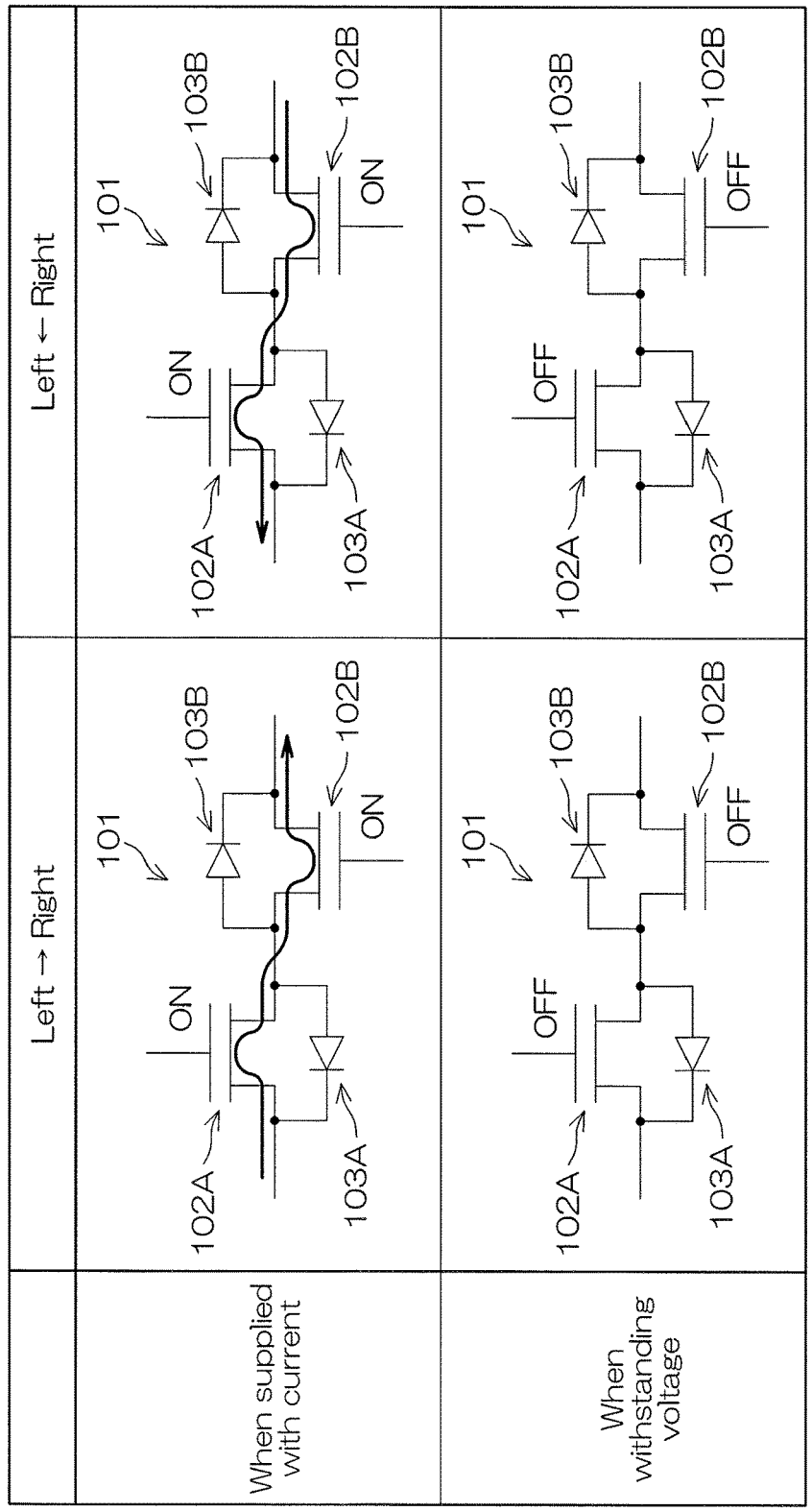
FIG. 23 is a circuit diagram of a bidirectional switch configured by connecting conventional MOSFETs in series.
Figure 24:
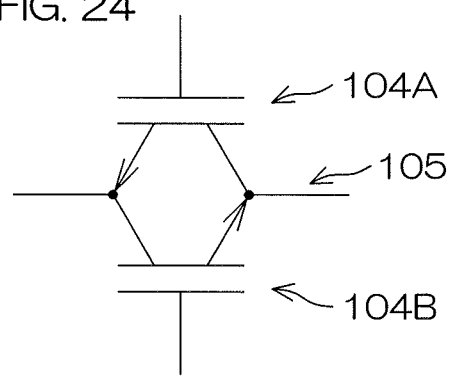
FIG. 24 is a circuit diagram of a bidirectional switch using reverse blocking IGBTs.

FIG. 17 to FIG. 19 are views to describe variations of the plane pattern of the back surface termination structure 27. FIG. 20 to FIG. 22 are views to describe examples of a combination pattern of the back surface termination structure 27 and the field relaxation regions 44.

First, as shown in FIG. 17, the back surface termination structure 27 may be formed into an annular shape surrounding the active region 7.

When the back surface termination structure 27 is formed of a plurality of layers as shown in FIG. 11, in the back surface termination structure 27, as shown in FIG. 18, a RESURF layer 40 and guard ring layers 41 may assume annular shapes spreading concentrically.

As shown in FIG. 19, when the back surface termination structure 27 is a high-resistance region as described above, it may assume an annular shape reaching the end surface 5 of the semiconductor layer 2 from the peripheral edge portion of the drain electrode 24. This configuration corresponds to the configuration shown in FIG. 12.

Various patterns of field relaxation regions 44 can be combined with each plane pattern of the back surface termination structure 27 shown above. In FIG. 20 to FIG. 22, combinations with the back surface termination structure 27 shown in FIG. 17 are shown by way of example.

For example, as shown in FIG. 20, the field relaxation regions 44 may be disposed discretely in the active region 7 surrounded by the back surface termination structure 27 in a plan view. In FIG. 20, the field relaxation regions are arranged in a matrix in a region away from the back surface termination structure 27.

As shown in FIG. 21, the field relaxation regions 44 may be disposed in a stripe pattern in the active region 7 surrounded by the back surface termination structure 27 in a plan view. The field relaxation regions 44 in a stripe pattern may be connected at both end portions to the back surface termination structure 27 as shown in FIG. 21, or may be separated at least at one end portion from the back surface termination structure 27. The stripe direction does not necessarily have to be parallel to the end surface 5 of the semiconductor layer 2 as shown in FIG. 21, and may extend in a direction (arrow D direction) crossing the end surface 5 of the semiconductor layer 2.

As shown in FIG. 22, the field relaxation regions 44 may be disposed in a lattice pattern in the active region 7 surrounded by the back surface termination structure 27. The field relaxation regions 44 in the lattice pattern may be connected at each end portion to the back surface termination structure 27 as shown in FIG. 22, or may be separated at least at one end portion from the back surface termination structure 27.

The patterns of the field relaxation regions 44 shown in FIG. 20 to FIG. 22 can be combined with the patterns of the back surface termination structure 27 shown in FIG. 18 and FIG. 19, as a matter of course.

Figure 25:
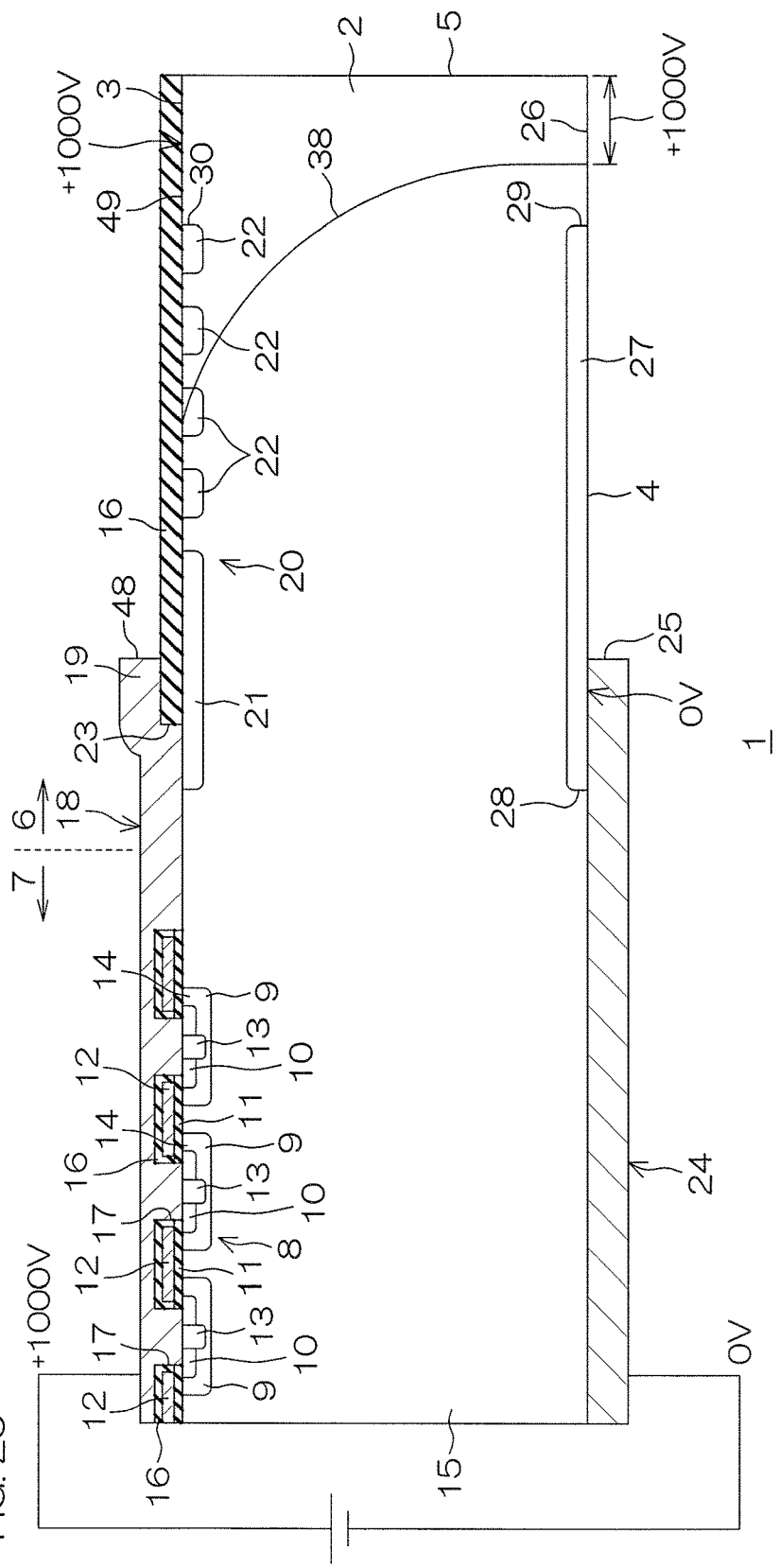
FIG. 25 is a view to describe a short-circuit failure that may occur when a semiconductor device is mounted onto a metal substrate.
Figure 26:
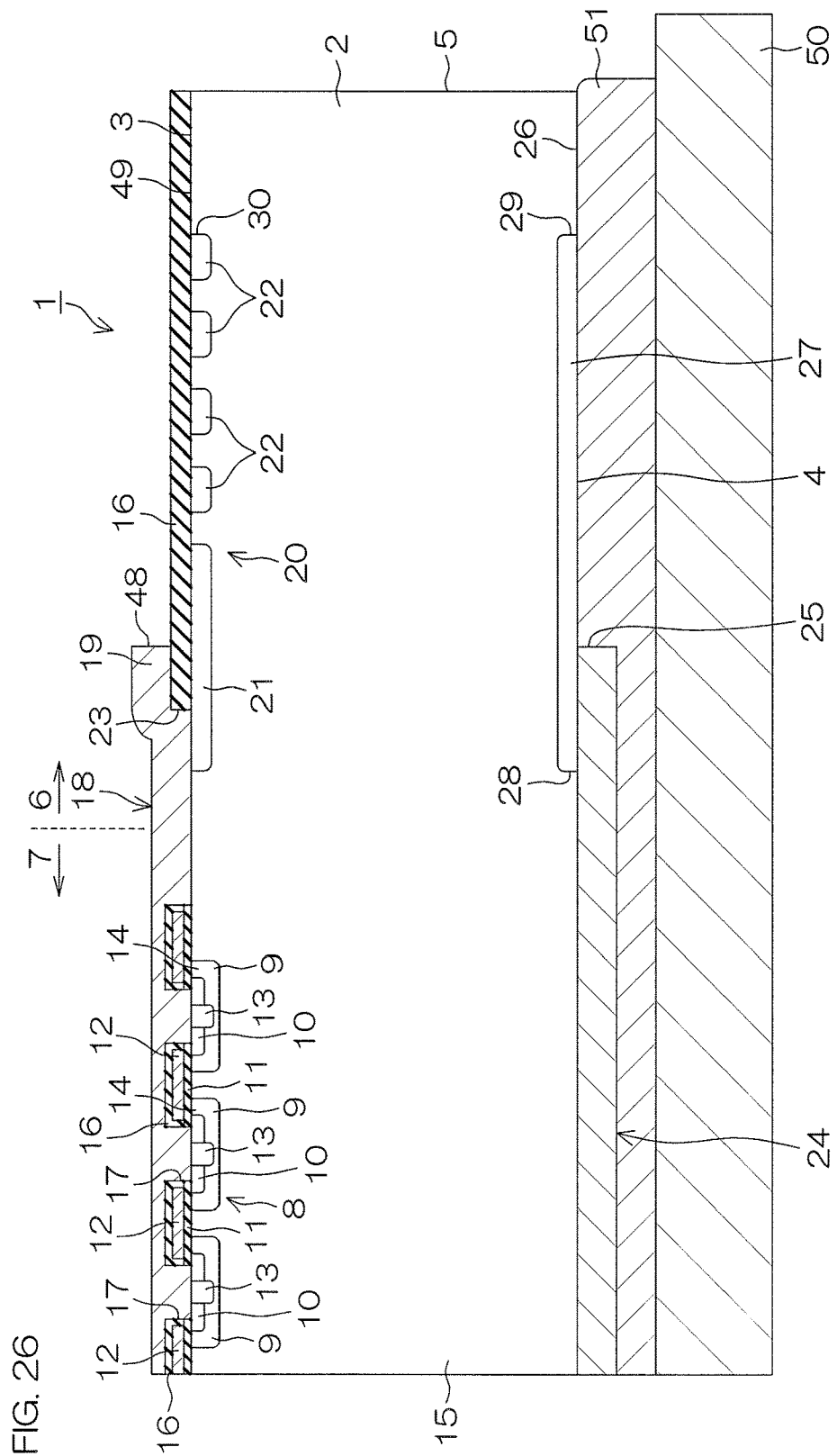
FIG. 26 is a view to describe a short-circuit failure that may occur when a semiconductor device is mounted onto a metal substrate.

FIG. 25 and FIG. 26 are views to describe short-circuit failures that may occur when the semiconductor device 1 is mounted onto a metal substrate 50. The metal substrate 50 may include a member to support the semiconductor device 1 at the time of mounting like an island portion 80 (FIG. 38, FIG. 39) of a drain terminal 77 described later.

As shown in FIG. 10, when the semiconductor devices 1 are used as the bidirectional switch 39 and a forward voltage is applied to one transistor, a reverse voltage is applied to the other transistor. For example, in the case of "when supplied with current, left to right" in the upper left cell in FIG. 10, while a forward voltage is applied to the transistor 1B, a reverse voltage is applied to the transistor 1A. That is, as shown in FIG. 25, between the source electrode 18 and the drain electrode 24 of the transistor 1A (semiconductor device 1 shown in FIG. 25), a high voltage (for example, 1000 V) that makes the source side positive is applied.

At this time, as shown in FIG. 5C, in the configuration of the semiconductor device 1, the depletion layer 38 is prevented from reaching the end surface 5 (chip end surface 5) of the semiconductor layer 2. However, as a result, as shown in FIG. 25, in the region between an end portion of the depletion layer 38 and the chip end surface 5, a potential distribution with the same potential (for example, 1000 V) as that of the surface side is generated via the semiconductor layer 2.

Therefore, as shown in FIG. 26, when the drain electrode 24 side is set as a bonding side and the semiconductor device 1 is mounted onto the metal substrate 50 by a bonding material 51 such as solder, the semiconductor layer 2 and the metal substrate 50 may short-circuit via the bonding material 51.

Figure 27:
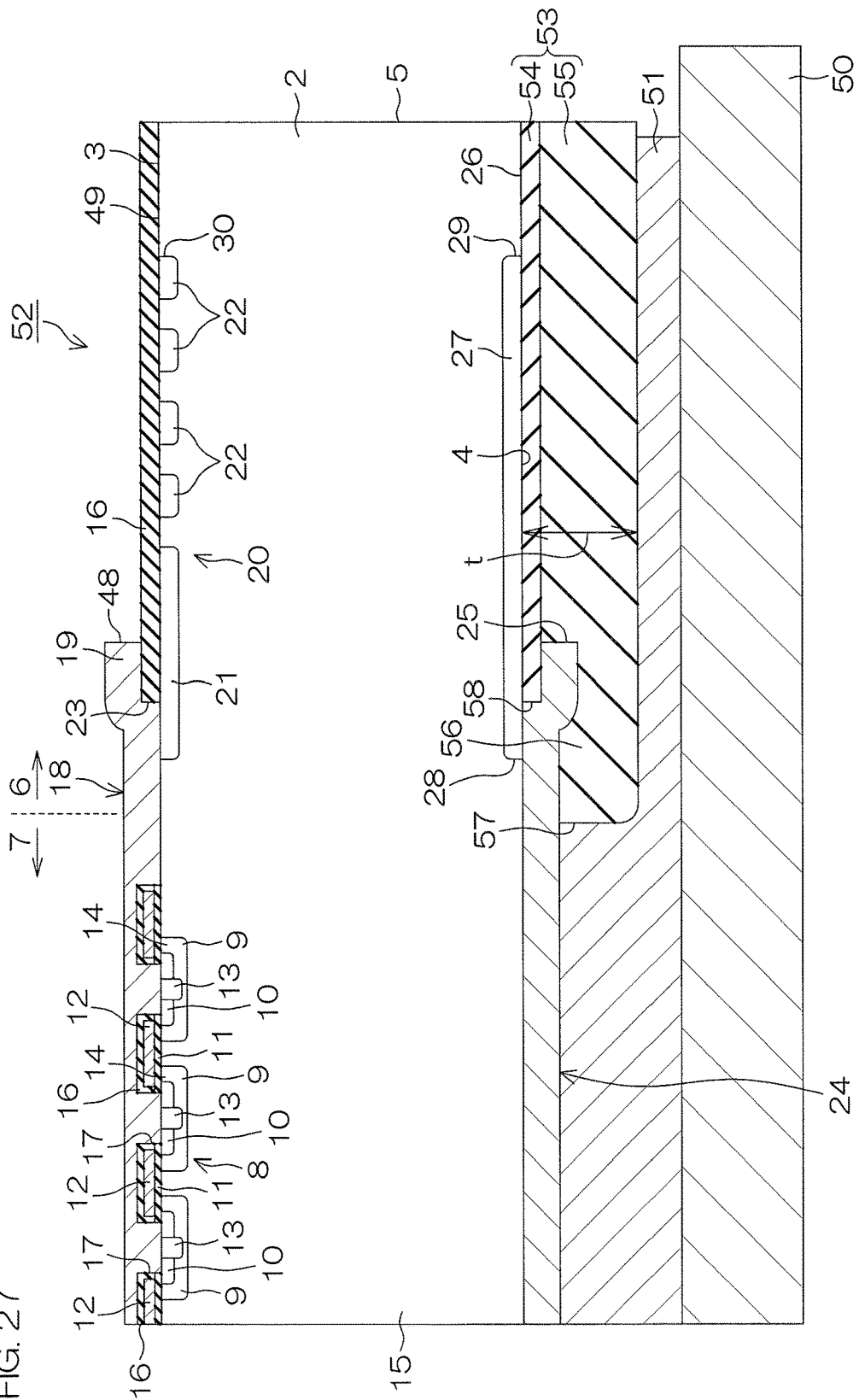
FIG. 27 is a schematic sectional view of a semiconductor device according to another preferred embodiment of the present invention.

Therefore, the semiconductor device 52 shown in FIG. 27 has a protective insulation film 53 that is formed in contact with the peripheral edge portion of the drain electrode 24 and covers the semiconductor region 26 from the peripheral edge 25 of the drain electrode 24 to the end surface 5 of the semiconductor layer 2.

The protective insulation film 53 has, in this preferred embodiment, a structure in which a first film 54 and a second film 55 are laminated in order from the back surface 4 of the semiconductor layer 2.

The first film 54 is sandwiched between the peripheral edge portion of the drain electrode 24 and the semiconductor layer 2, and the second film 55 has an overlap portion 56 riding on the peripheral edge portion of the drain electrode 24. The overlap portion 56 may have an inner peripheral edge 57 disposed on the inner side of an inner peripheral edge 58 of the first film 54 as shown in FIG. 27, and further, the inner peripheral edge 57 may be disposed on the inner side of an inner peripheral edge 28 of the back surface termination structure 27.

The protective insulation film 53 can be made of various insulation materials. Usable materials include, for example, $SiO_2$, SiN, and polyimide, etc. Among these, preferably, $SiO_2$ or SiN is used for the first film 54, and polyimide is used for the second film 55. Film formability when $SiO_2$ and SiN are formed on a metal film of the drain electrode 24, etc., is not satisfactory when compared to a resin film of polyimide, etc., so that by using these as the first film 54, adhesiveness of the protective insulation film 53 can be improved.

The protective insulation film 53 may have a thickness t that satisfies the following equation based on the back surface 4 of the semiconductor layer 2. This thickness t is a thickness of a portion from the chip end surface 5 to the peripheral edge portion 25 of the drain electrode 24 in the protective insulation film 53 (portion on the semiconductor region 26). When the protective insulation film 53 is a lamination film including the first film 54 and the second film 55 as shown in FIG. 27, the thickness t may be the sum of the thicknesses of the first film 54 and the second film 55.

$$t > V/(3MV/cm) \tag{1}$$

(In Equation (1), V is a voltage to be applied in a reverse direction between the source electrode 18 and the drain electrode 24.) For example, when the protective insulation film 53 is $SiO_2$, a relationship between an applied voltage V between the source and the drain and the thickness t of the protective insulation film 53 may be as follows.

Applied voltage V=650 V: thickness t>2.2 μm
Applied voltage V=1200 V: thickness t>4.0 μm
Applied voltage V=1700 V: thickness t>5.7 μm
Applied voltage V=3000 V: thickness t>10.0 μm According to this semiconductor device 52, the semiconductor region 26 from the peripheral edge 25 of the drain electrode 24 on a side to be bonded to the metal substrate 50 to the end surface 5 of the semiconductor layer 2 is covered by the protective insulation film 53. Accordingly, when the drain electrode 24 is bonded and mounted onto the metal substrate 50, the semiconductor region 26 of the semiconductor layer 2 can be prevented from coming into contact with the bonding material 51 and the metal substrate 50, so that short-circuiting between the semiconductor layer 2 and the metal substrate 50 can be prevented.

Next, a method of manufacturing the semiconductor device 52 is described with reference to FIG. 28A to FIG. 28F.

FIG. 28A to FIG. 28F are views showing a manufacturing process of the semiconductor device 52 shown in FIG. 27 in order of steps. In FIG. 28A to FIG. 28F, only points of the method of manufacturing the semiconductor device 52 are described, so that the configuration of the semiconductor device 52 is shown more simply than the configuration shown in FIG. 27.

Figure 28A:
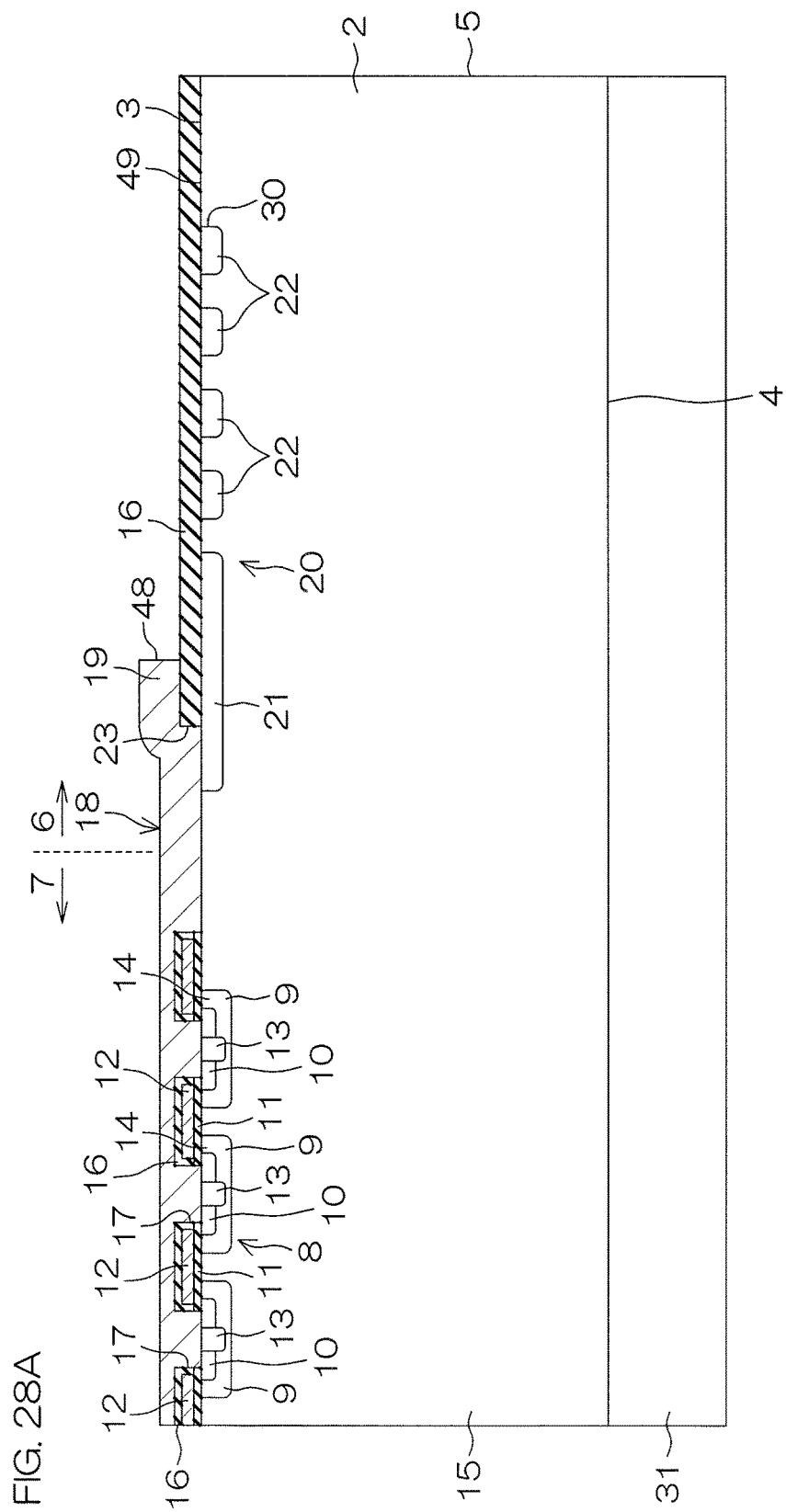
FIG. 28A is a view showing a part of a manufacturing process of the semiconductor device shown in FIG. 27.

In order to manufacture the semiconductor device 52, as shown in FIG. 28A, first, on a base substrate 31 (wafer) made of $n^+$ type SiC (with an impurity concentration of, for example, $1\times10^{18}$ $cm^{-3}$ to $1\times10^{20}$ $cm^{-3}$), a semiconductor layer 2 with a lower concentration than the base substrate 31 is formed by epitaxial growth. Next, by a known semiconductor manufacturing technology, the above-described MIS transistor structure 8 is formed in the surface portion of the semiconductor layer 2. Thereafter, the interlayer dielectric film 16 and the source electrode 18 are formed.

Figure 28B:
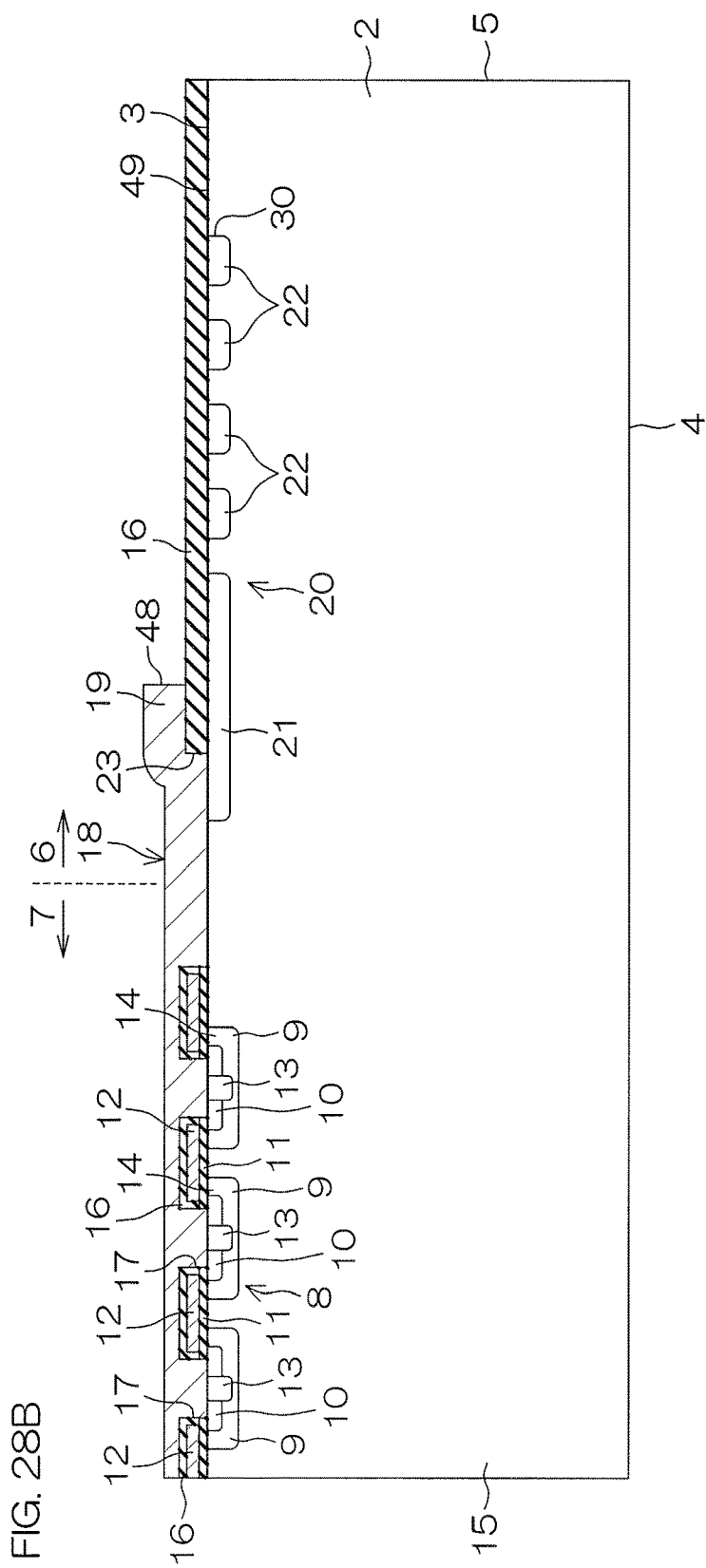
FIG. 28B is a view showing a next step of FIG. 28A.

Next, as shown in FIG. 28B, by removing the base substrate 31, the entire back surface 4 of the semiconductor layer 2 is exposed.

Next, as shown in FIG. 28C, a resist film (not shown) that selectively has apertures is formed on the back surface 4 of the semiconductor layer 2, and via the resist film, p type impurity (for example, aluminum (Al)) ions are injected into the back surface 4 of the semiconductor layer 2. Thereafter, by laser annealing, the p type impurity is activated and the back surface termination structure 27 is formed.

Figure 28D:
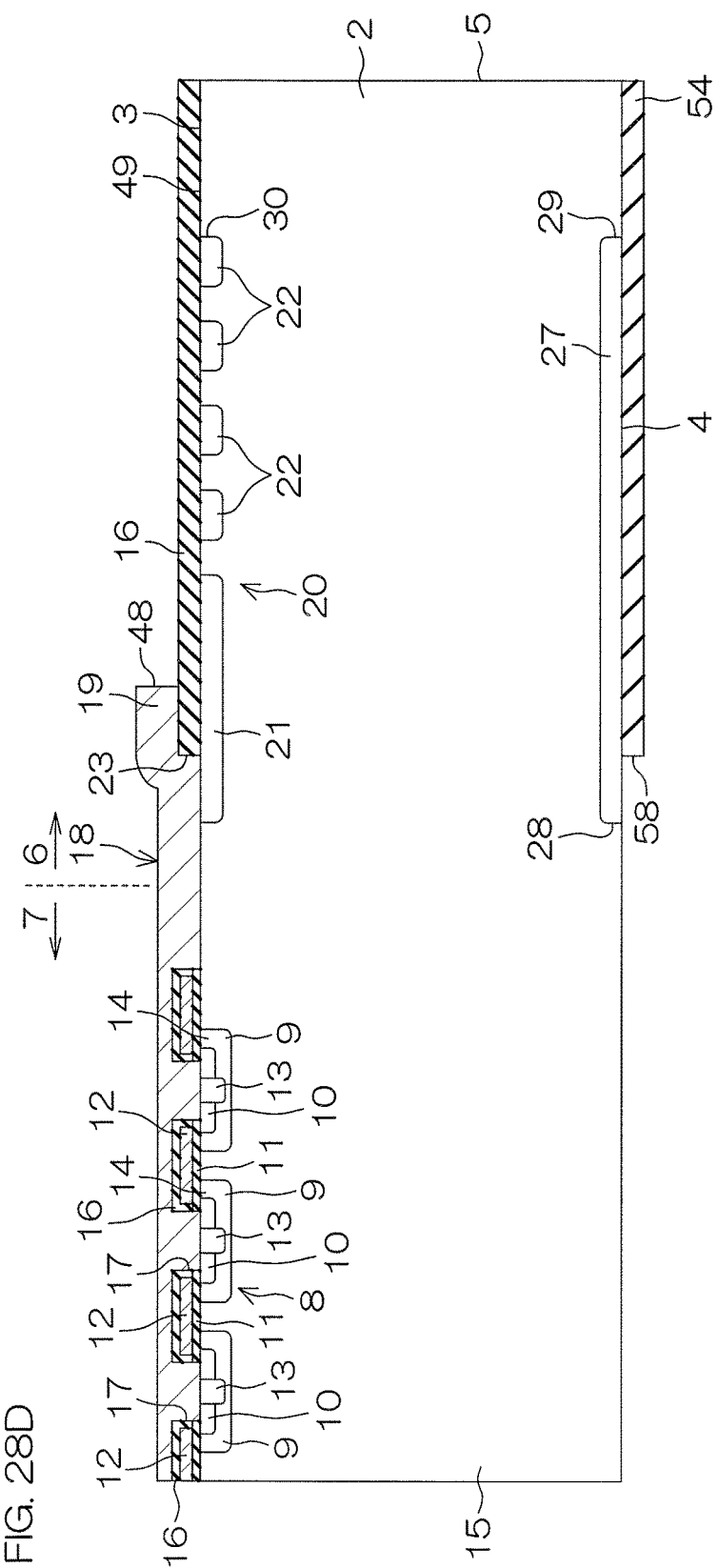
FIG. 28D is a view showing a next step of FIG. 28C.

Next, as shown in FIG. 28D, by, for example, a CVD method, an insulation film of $SiO_2$, SiN, etc., is formed on the entire back surface 4 of the semiconductor layer 2, and is selectively etched to form the first film 54.

Figure 28E:
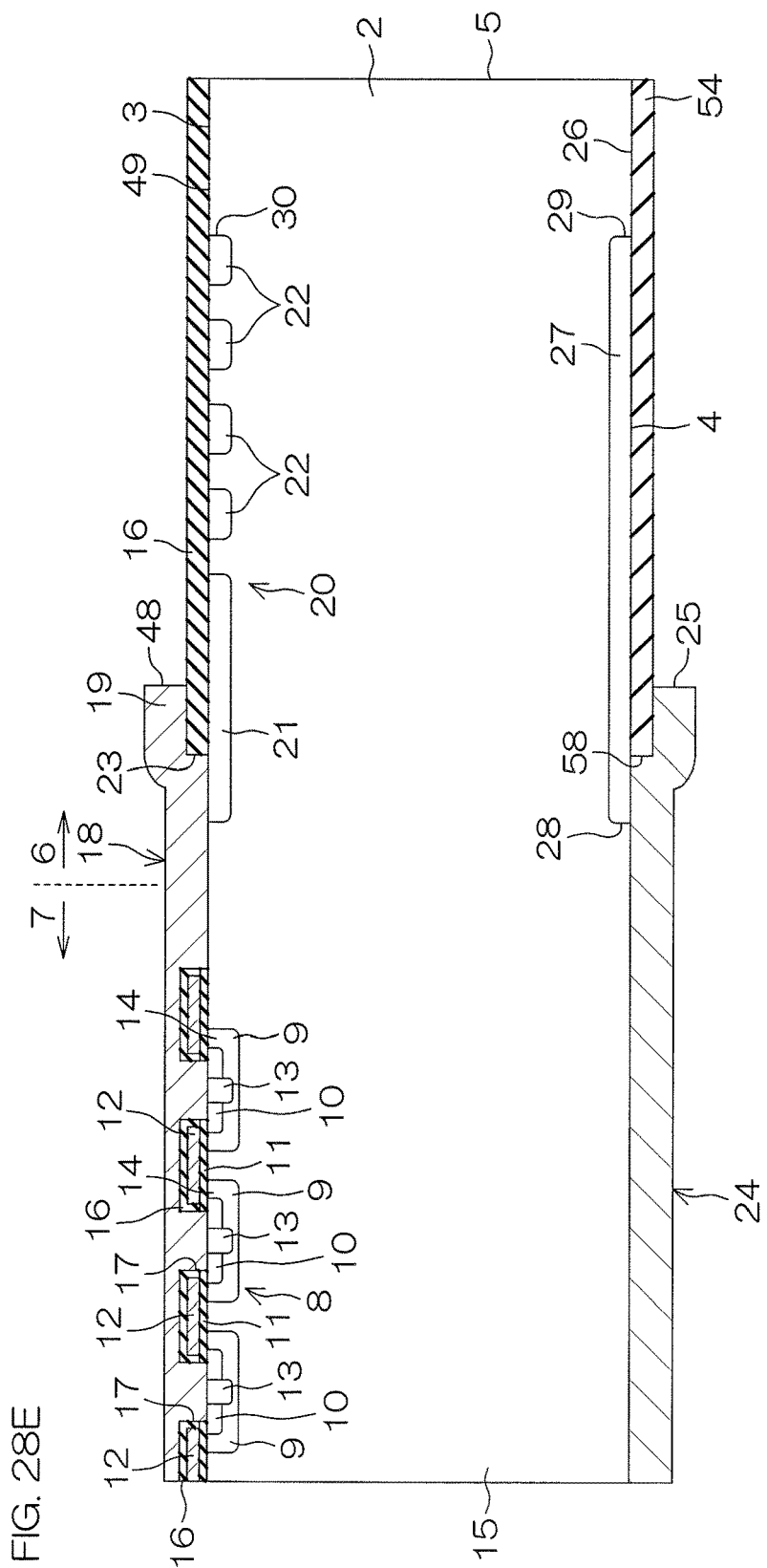
FIG. 28E is a view showing a next step of FIG. 28D.

Next, as shown in FIG. 28E, by, for example, sputtering, a metal film is formed on the entire back surface 4 of the semiconductor layer 2, and selectively etched to form the drain electrode 24.

Figure 28F:
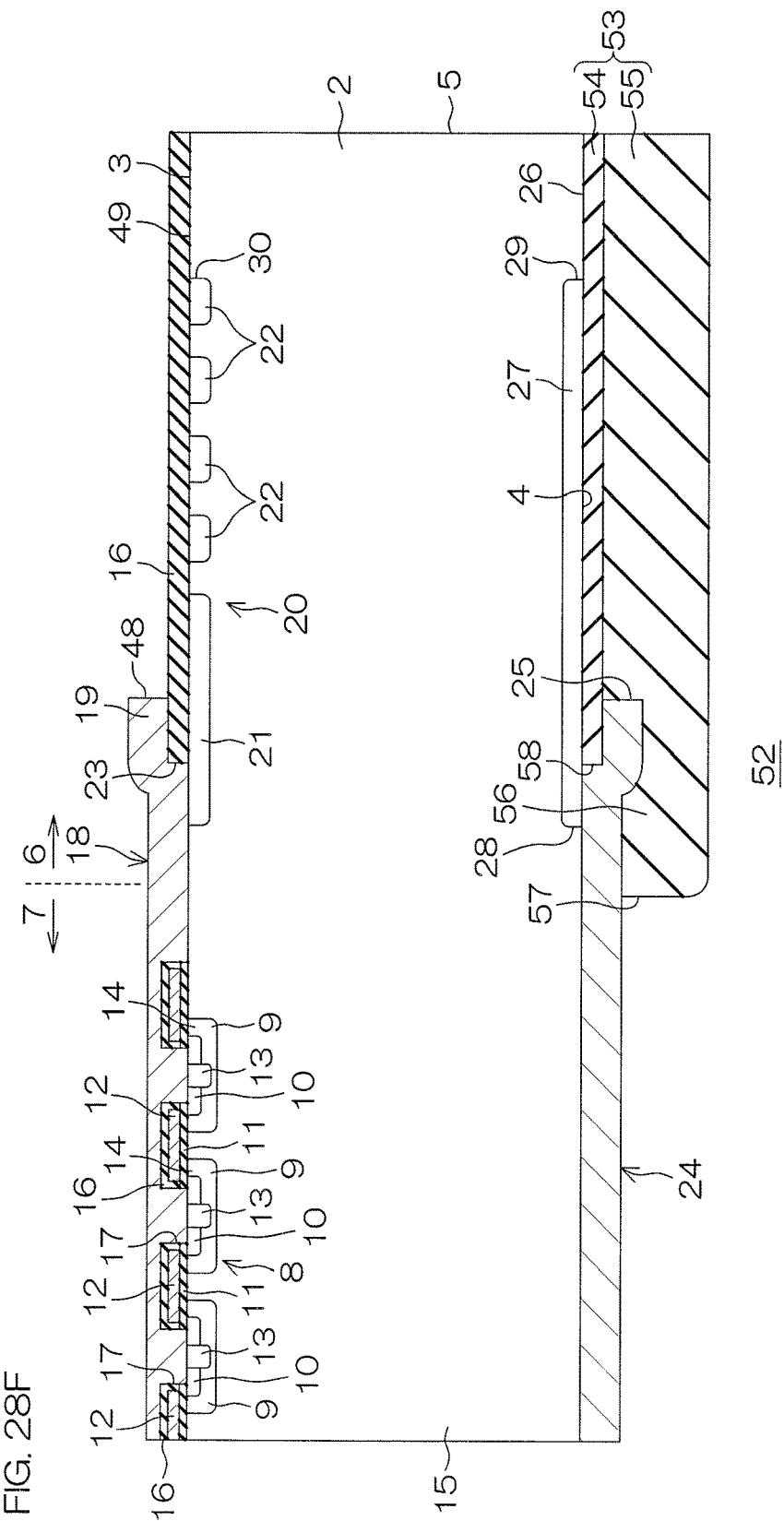
FIG. 28F is a view showing a next step of FIG. 28E.

Next, as shown in FIG. 28F, a resin film of polyimide, etc., is applied onto the entire back surface 4 of the semiconductor layer 2, and patterned by selective exposure and development to form the second film 55. Accordingly, the protective insulation film 53 including the first film 54 and the second film 55 is formed.

Thereafter, along dicing lines (not shown) set at positions away from the peripheral edge 25 of the drain electrode 24, the semiconductor layer 2 is cut. Accordingly, individualized semiconductor devices 52 are obtained.

<Variations of Protective Insulation Film 53>

Figure 29:
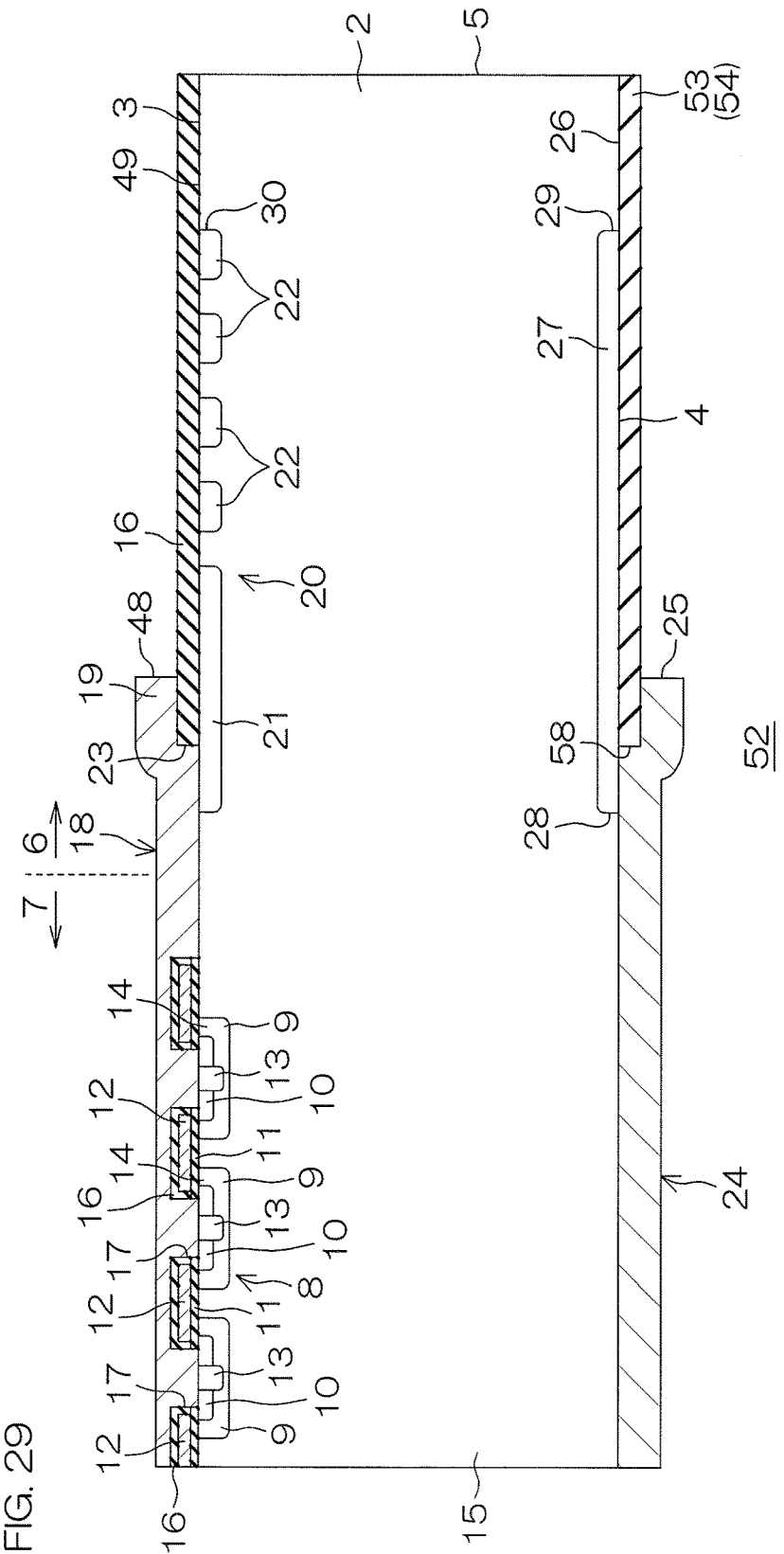
FIG. 29 is a view showing another form of a protective insulation film shown in FIG. 27.
Figure 30:
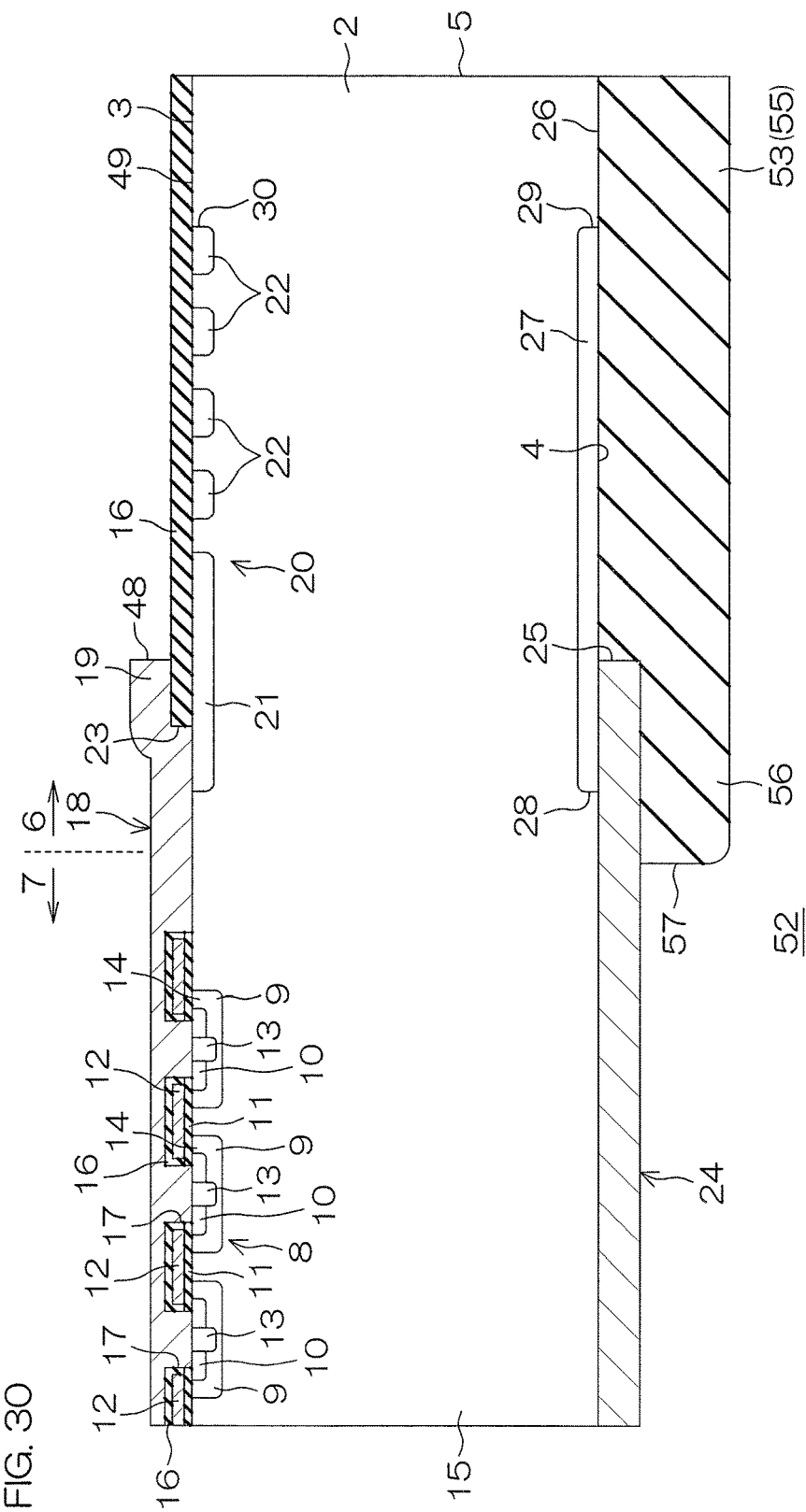
FIG. 30 is a view showing still another form of the protective insulation film shown in FIG. 27.

FIG. 29 and FIG. 30 are views showing other forms of the protective insulation film 53 shown in FIG. 27.

The protective insulation film 53 may be a monolayer film of the above-described first film 54 as shown in FIG. 29, or may be a monolayer film of the above-described second film 55 as shown in FIG. 30. In the case of FIG. 30, the protective insulation film 53 (second film 55) is formed in contact with the semiconductor region 26 from the peripheral edge 25 of the drain electrode 24 to the end surface 5 of the semiconductor layer 2.

<Variations of Element Structure>

FIG. 31 to FIG. 34 are views to describe variations of the element structure of the semiconductor device 52 shown in FIG. 27. In FIG. 31 to FIG. 34, the same components as in FIG. 27 are designated by common reference signs, and descriptions thereof are omitted.

Figure 31:
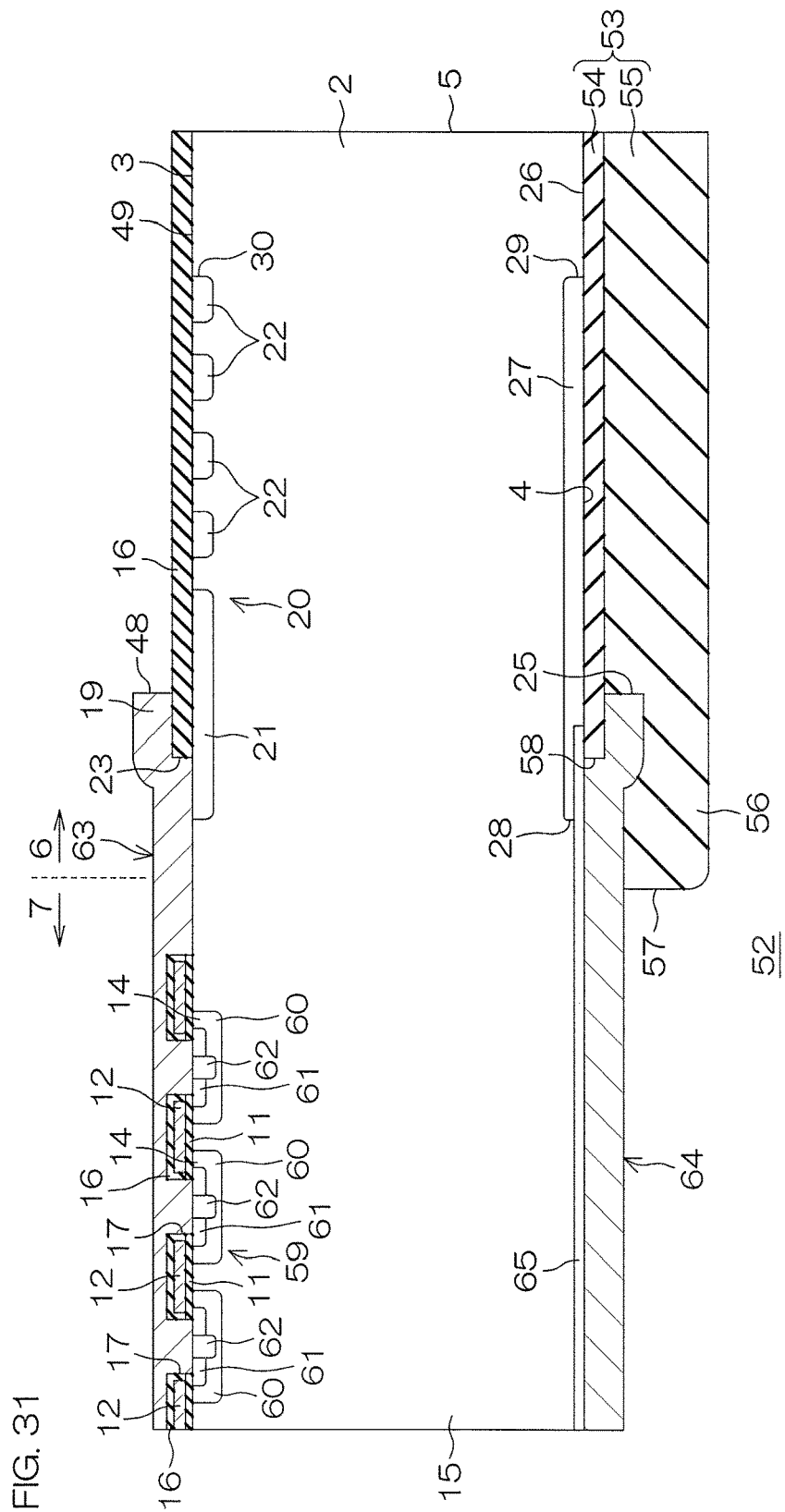
FIG. 31 is a view to describe a variation of an element structure of the semiconductor device shown in FIG. 27.

The semiconductor device 52 has the MIS transistor structure 8 in the surface portion of the semiconductor layer 2 as an element structure in FIG. 27, however, the semiconductor device may have an IGBT structure 59 in the surface portion of the semiconductor layer 2 as shown in, for example, FIG. 31. The IGBT structure 59 may include, as a configuration different from that of the MIS transistor structure 8, p type base regions 60 in place of the p type body regions 9, $n^+$ type emitter regions 61 in place of the $n^+$ type source regions 10, $p^+$ type base contact regions 62 in place of the $p^+$ type body contact regions 13, an emitter electrode 63 in place of the source electrode 18, and a collector electrode 64 in place of the drain electrode 24.

In the back surface portion of the semiconductor layer 2, a p type collector region 65 is formed. The collector region 64 is in ohmic contact with the p type collector region 65. The back surface termination structure 27 is formed so as to partially overlap the p type collector region 65.

Figure 32:
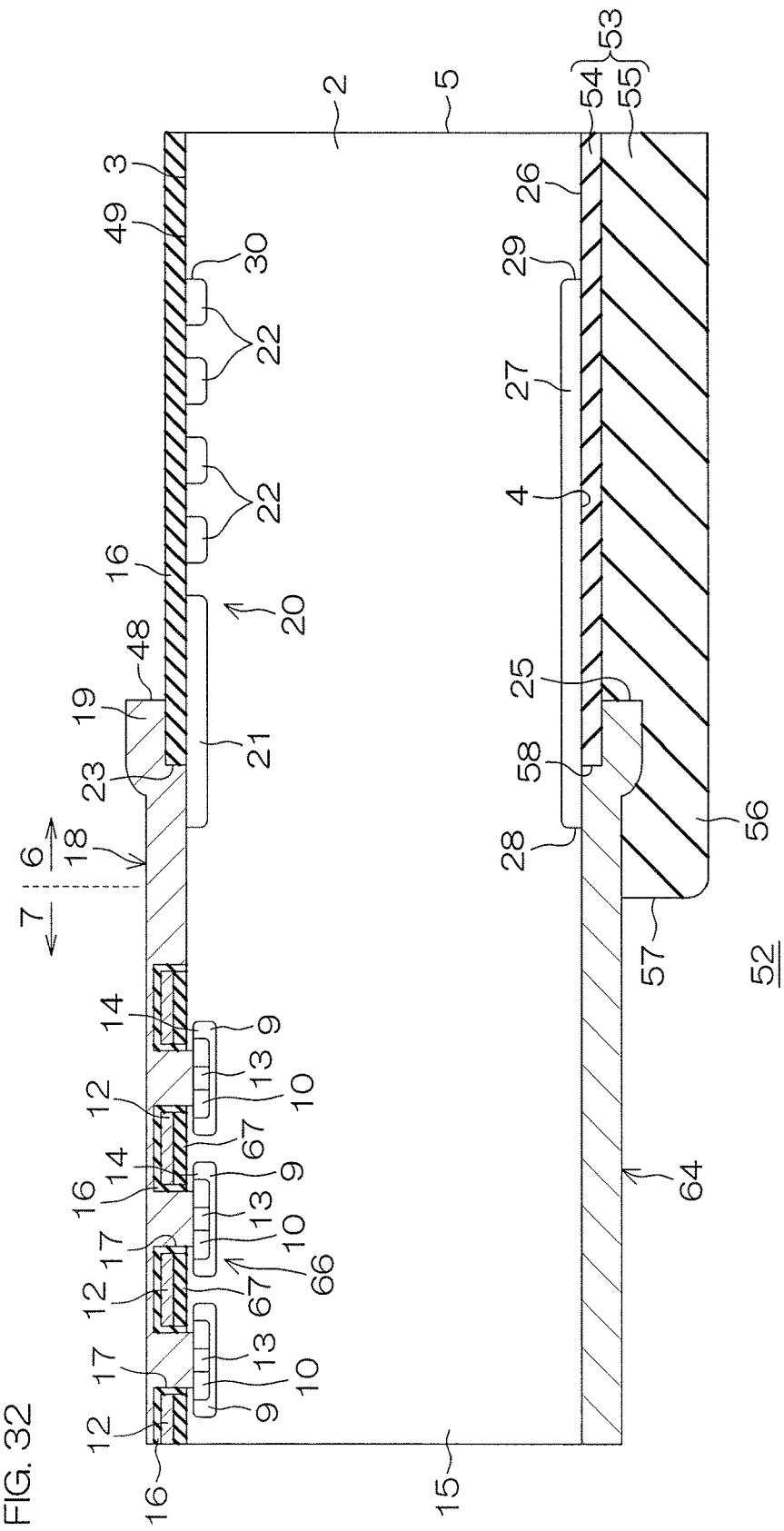
FIG. 32 is a view to describe a variation of the element structure of the semiconductor device shown in FIG. 27.

The semiconductor device 52 may have, for example, as shown in FIG. 32, a JFET structure 66 in the surface portion of the semiconductor layer 2. The JFET structure 66 includes, as a configuration different from that of the MIS transistor structure 8, p type gate regions 67 in place of the gate insulation films 11.

Figure 33:
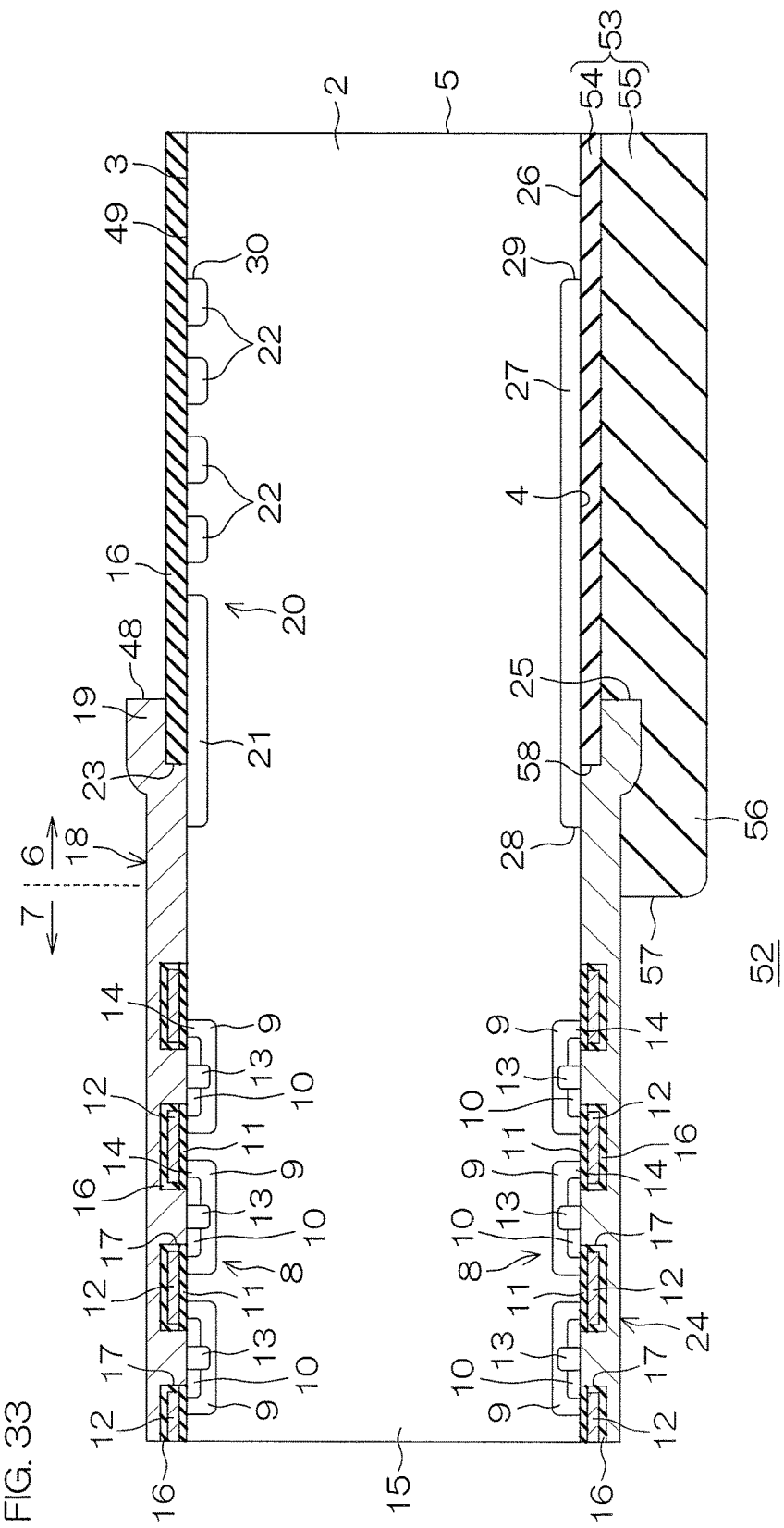
FIG. 33 is a view to describe a variation of the element structure of the semiconductor device shown in FIG. 27.

The semiconductor device 52 may be configured as, for example, as shown in FIG. 33, an MIS type bidirectional switch including MIS transistor structures 8 formed in both surface portions on the surface 3 side and the back surface 4 side of the semiconductor layer 2. In this case, the drain electrode 24 functions as a source electrode of the MIS transistor structure 8 on the back surface 4 side. That is, when a forward voltage is applied to one of the MIS transistor structures 8 on the surface 3 side and the back surface 4 side, a reverse voltage is applied to the other MIS transistor structure 8. Such an MIS type bidirectional switch can be manufactured by bonding together the back surfaces of semiconductor wafers each having an MIS transistor structure 8 on the surface side.

Figure 34:
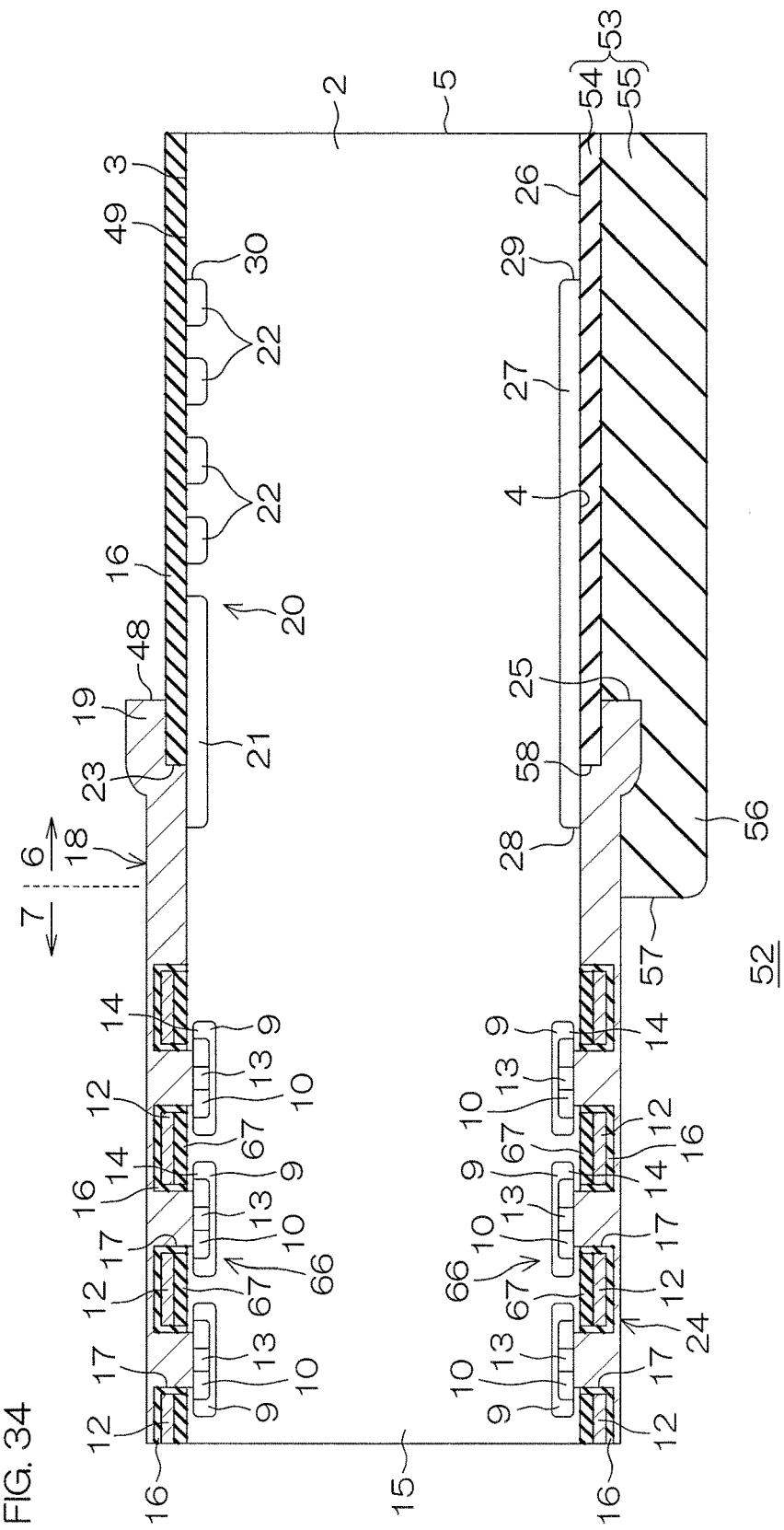
FIG. 34 is a view to describe a variation of the element structure of the semiconductor device shown in FIG. 27.

Further, the semiconductor device 52 may be configured as, for example, as shown in FIG. 34, a JFET type bidirectional switch that has JFET structures 66 formed in surface portions on both of the surface 3 side and the back surface 4 side of the semiconductor layer 2. The semiconductor device 2 may be a trench-gate type MIS transistor structure or IGBT not shown in the drawings.

Other Preferred Embodiments Capable of Preventing Short-Circuiting Between Semiconductor Layer and Metal Substrate FIG. 27 to FIG. 34 show examples of the preferred embodiment capable of preventing short-circuiting between the semiconductor layer and the metal substrate, and this effect can also be obtained by other preferred embodiments.

Figure 35:
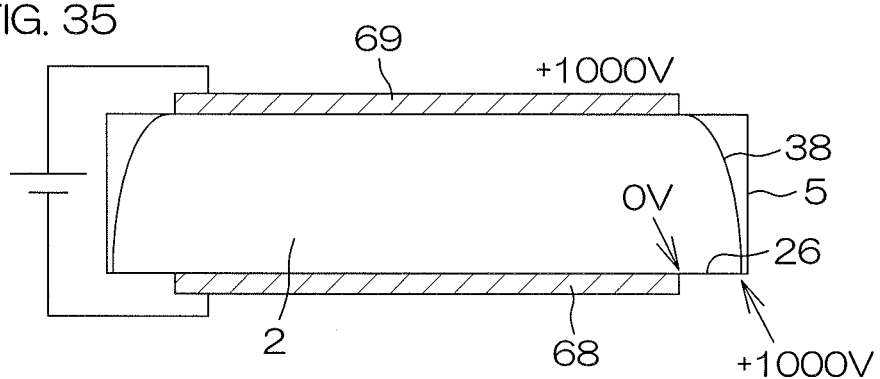
FIG. 35 is a view to describe a short-circuit failure that may occur when a semiconductor device is mounted onto a metal substrate.

That is, as shown in FIG. 35, in a configuration in which a part of the semiconductor layer 2 is exposed as a semiconductor region 26 to the outside of a back metal 68 (for example, the drain electrode 24 shown in FIG. 27), when a high voltage (for example, 1000 V) that makes the surface side positive is applied between a surface metal 69 and the back metal 68, in the region between an end portion of the depletion layer 38 and the chip end surface 5, a potential distribution with the same potential (for example, 1000 V) as that on the surface side is generated via the semiconductor layer 2.

Figure 36:
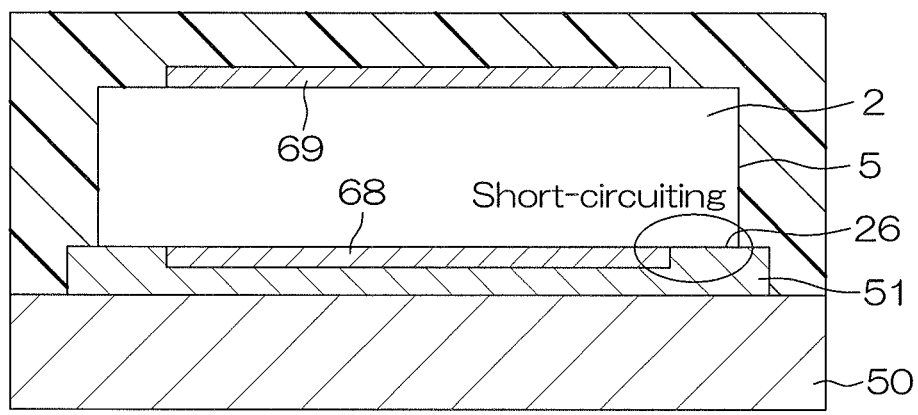
FIG. 36 is a view to describe a short-circuit failure that may occur when a semiconductor device is mounted onto a metal substrate.
Figure 37:
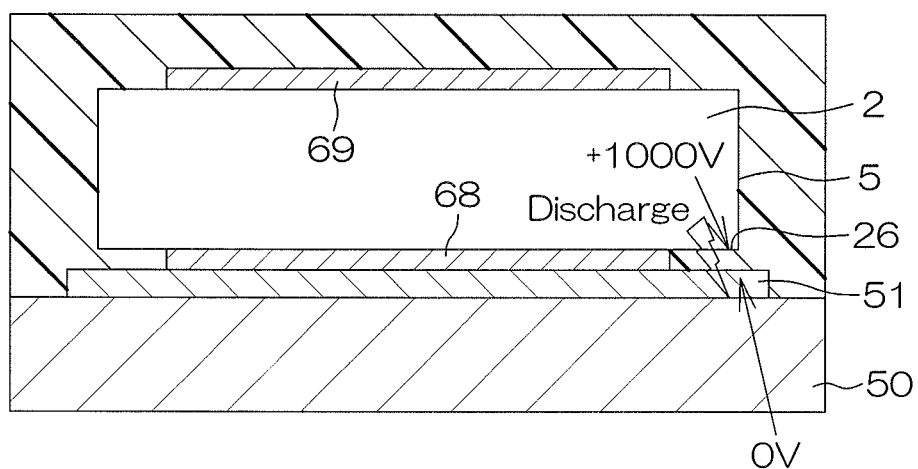
FIG. 37 is a view to describe a discharge failure that may occur when a semiconductor device is mounted onto a metal substrate.

Therefore, as shown in FIG. 36, when the back metal 68 side is set as a bonding side and the semiconductor device is mounted onto the metal substrate 50 by a bonding material 51 such as solder, the semiconductor layer 2 and the metal substrate 50 may short-circuit via the bonding material 51. In addition, as shown in FIG. 37, even when the bonding material 51 is thinned and contact between the semiconductor layer 2 and the metal substrate 50 is prevented, the distance from the semiconductor layer 2 to the metal substrate 50 or the bonding material 51 is short, and between these, discharge may occur. Therefore, a withstand voltage when the transistor is used as a reverse blocking device is not high unless the protective insulation film 53 described above is formed.

Figure 38:
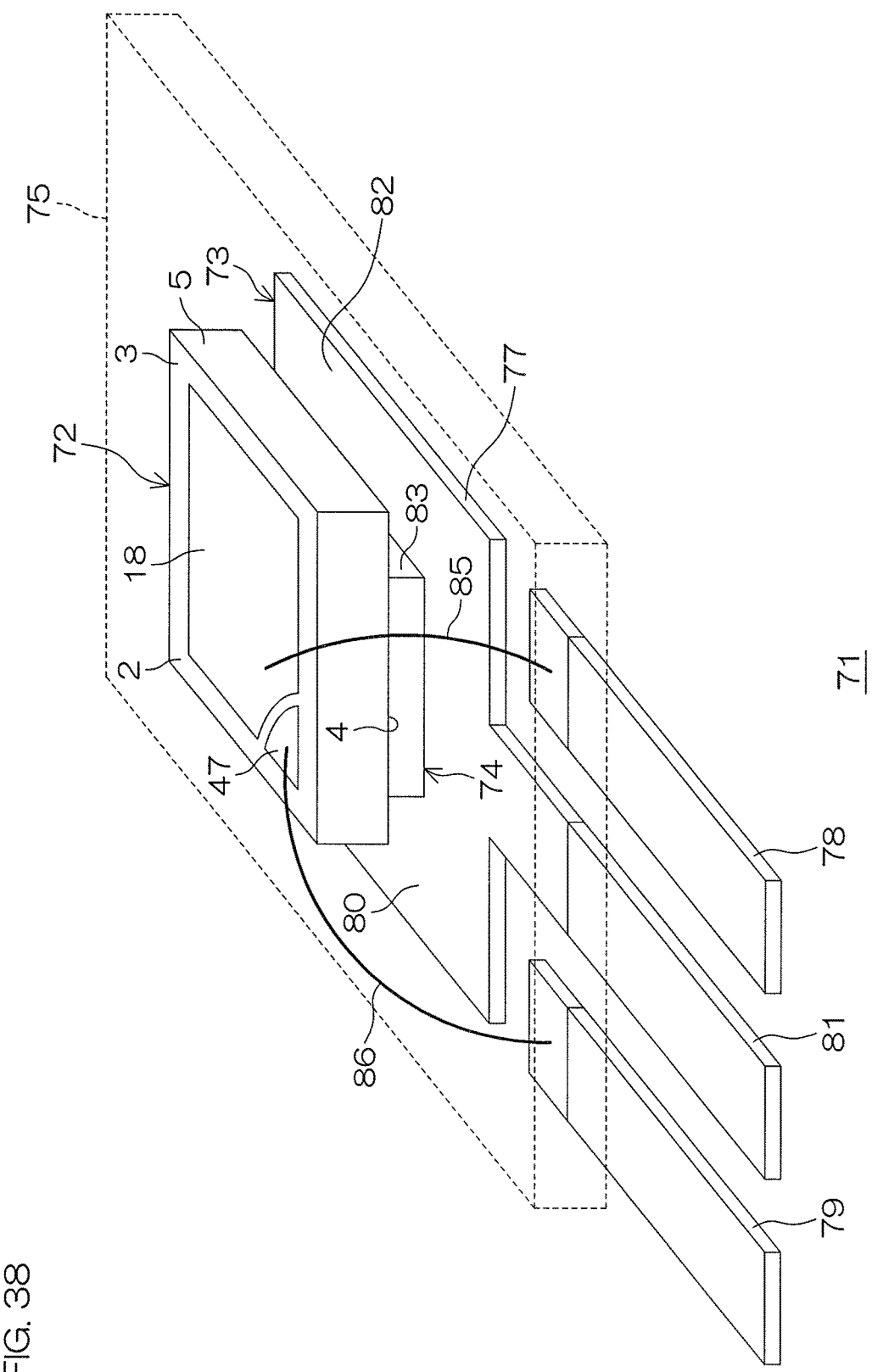
FIG. 38 is a schematic perspective view of a semiconductor device according to still another preferred embodiment of the present invention.
Figure 39:
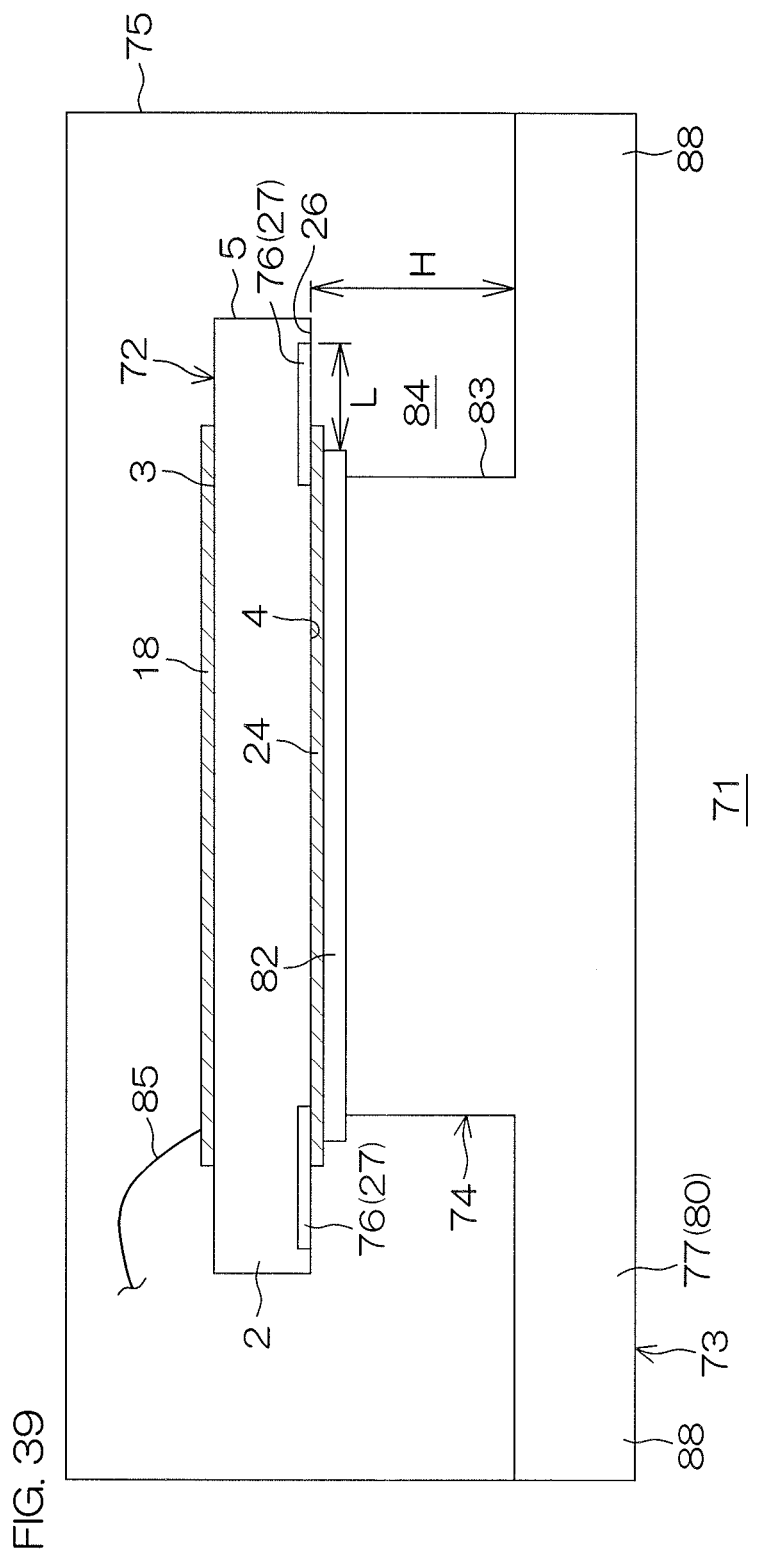
FIG. 39 is a partial sectional view of the semiconductor device shown in FIG. 38.

Therefore, as another preferred embodiment to solve this kind of trouble, for example, a preferred embodiment shown in FIG. 38 and FIG. 39 can be proposed.

FIG. 38 is a schematic perspective view of a semiconductor package 71 according to another preferred embodiment of the present invention. FIG. 39 is a partial sectional view of the semiconductor package 71 shown in FIG. 38. In FIG. 38 and FIG. 39, the same components as in FIG. 1 to FIG. 37 are designated by common reference signs, and descriptions thereof are omitted. In FIG. 38, for clarification, the inside of the resin package 75 is transparently seen.

The semiconductor package 71 as an example of the semiconductor device of the present invention includes a semiconductor chip 72, a substrate terminal 73, a spacer 74, and a resin package 75.

The semiconductor chip 72 may have the same configuration as that of the semiconductor device 1 shown in FIG. 1 to FIG. 3. That is, the semiconductor chip 72 has, on a surface on the bonding side (in the semiconductor chip 72, on the back surface 4 on the drain side), an impurity region pattern 76 such as the back surface termination structure 27. An element structure of the semiconductor chip 72 is not limited to the MIS transistor structure 8, and may be an IGBT structure 59 (FIG. 31), a JFET structure 66 (FIG. 32), MIS transistor structures provided on both surfaces (FIG. 33), or JFET structures 66 provided on both surfaces (FIG. 34).

A substrate terminal 73 is a plate (metal substrate) made of a metal material, for example, Cu, etc., and includes a drain terminal 77, a source terminal 78, and a gate terminal 79.

The drain terminal 77 includes an island portion 80 having a quadrilateral shape in a plan view, and a linear terminal portion 81 extending from one side of the island portion 80. The source terminal 78 and the gate terminal 79 are linearly formed parallel to the terminal portion 81 of the drain electrode 77, and are respectively disposed on the right side and the left side of the paper surface so as to sandwich the central drain terminal 77 (terminal portion 81) from both sides in the width direction.

The island portion 80 is to support the semiconductor chip 72, and has a larger area than the semiconductor chip 72. Accordingly, the island portion 80 includes an outer peripheral portion 88 that is a portion on the outer side of the semiconductor chip 72 and surrounds the semiconductor chip 72 in a state where the semiconductor chip 72 is mounted (the state shown in FIG. 38 and FIG. 39).

The spacer 74 is made of a metal material such as Cu (Cu, an alloy containing Cu, a metal whose surface is plated with Cu, etc.), and is provided integrally with the island portion

80. The integrated structure of the island portion 80 and the spacer 74 can be manufactured by, for example, preparing a metal substrate and etching and machining the metal substrate according to the shape of the spacer 74.

The spacer 74 is formed into, in the present preferred embodiment, a rectangular parallelepiped shape having a side surface (peripheral surface 83) perpendicular to the surface of the island portion 80, and has a plane area smaller than that of the back metal (drain electrode 24) of the semiconductor chip 72. The spacer 74 is disposed between the semiconductor chip 72 and the island portion 80 so that its entirety fits within an inner region of the semiconductor chip 72. The semiconductor chip 72 is bonded to a spacer 74 by a bonding material 82 (solder, silver paste, etc.) provided on the top surface of the spacer 74. Accordingly, via the columnar spacer 74 having a plane area smaller than that of the drain electrode 24, the semiconductor chip 72 is supported by the island portion 80 in a state where the semiconductor region 26 on the outer side of the peripheral surface 83 of the spacer 74 floats. Therefore, between the semiconductor region 26 of the semiconductor chip 72 and the island portion 80, a space 84 having a height H substantially equal to a height of the spacer 74 is formed, and a material of the resin package 75 enters this space 84.

Here, the size (width and height) of the spacer 74 is preferably designed in consideration of a withstand voltage required for the semiconductor chip 72. When a high reverse voltage is applied to the semiconductor chip 72 shown in FIG. 38 and FIG. 39, all of the island portion 80, the spacer 74, the bonding material 82 and the drain electrode 24 become the same potential of 0 V. At this time, the semiconductor region 26 becomes a high potential (for example, 1000 V), so that withstand voltages in the vertical direction and the horizontal direction from the semiconductor region 26 must be considered. In the vertical direction, a distance (height H Of the space 84) between the semiconductor region 26 that becomes a high potential and the island portion 80 must be considered, and in the horizontal direction, a distance L between the semiconductor region 26 and the bonding material 82 must be considered.

For example, in the semiconductor chip 72 required to have a reverse withstand voltage of 1000 V, when the resin material (for example, epoxy resin, etc.) of the resin package 75 has a withstand voltage of 10 kV to 30 kV per 1 mm, the size of the spacer 74 must be designed so that the height H and the distance L exceed 100 μm.

The drain electrode 24 of the semiconductor chip 72 is electrically connected to the island portion 80 via the spacer 74. On the other hand, the source electrode 18 and the gate pad 47 of the semiconductor chip 72 are electrically connected to the source terminal 78 and the gate terminal 79 via bonding wires 85 and 86, respectively.

The resin package 75 seals the semiconductor chip 72, etc., so that portions of the terminal portion 81 of the drain terminal 77, the source terminal 78, and the gate terminal 79 are exposed.

As described above, in this semiconductor package 71, when a reverse voltage is applied, even if a high potential distribution (for example, 1000 V) is generated in the semiconductor region 26 on the bonding side, due to the presence of the spacer 74, an insulation distance between this potential distribution and the island portion 80 can be secured. As a result, discharge between the semiconductor layer 2 and the island portion 80 can be prevented.

In addition, the spacer 74 has a smaller plane area than the back metal (drain electrode 24) of the semiconductor chip 72. Therefore, when bonding the semiconductor chip 72 and the spacer 74 together, by preparing a suitable amount of the bonding material 82 for an area of a top surface of the spacer 74, after bonding, extra bonding material 82 can be prevented from excessively spreading in the horizontal direction and coming into contact with the semiconductor layer 2. As a result, the semiconductor layer 2 and the spacer 74 can be prevented from short-circuiting via the bonding material 82.

The shape of the spacer 74 is not limited to the rectangular parallelepiped shape integrated with the island portion 80 as described above, and may be another shape.

Figure 40:
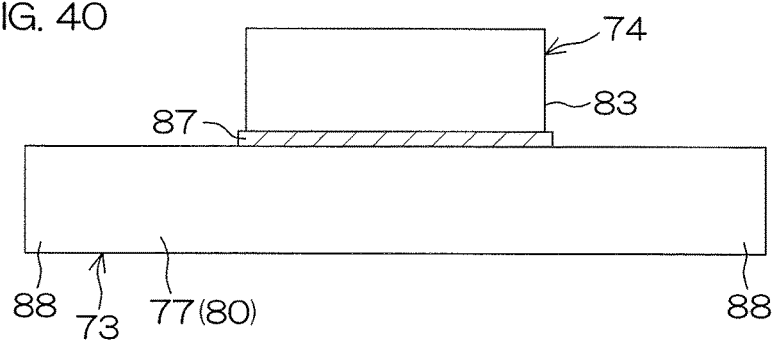
FIG. 40 is a view to describe a variation of a spacer shown in FIG. 38 and FIG. 39.

For example, as shown in FIG. 40, it is also possible that the spacer 74 having a rectangular parallelepiped shape is formed independently from the island portion 80, and bonded to the island portion 80 via a bonding material 87 such as solder. This case is advantageous since the spacer 74 and the island portion 80 can be made of different materials, however, heat resistance of solder to be used as the bonding material 87 is not low, so that from the viewpoint of efficient heat release, it is better to integrally configure the spacer 74 and the island portion 80.

Figure 41:
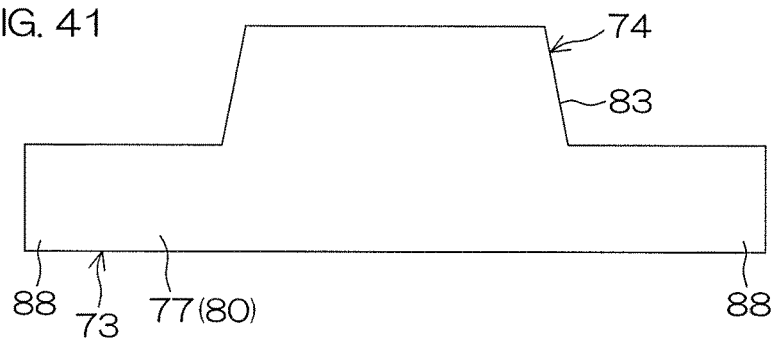
FIG. 41 is a view to describe a variation of the spacer shown in FIG. 38 and FIG. 39.

As shown in FIG. 41, the peripheral surface 83 of the spacer 74 may be a surface inclined with respect to the surface of the island portion 80. For example, the spacer 74 may have a tapered peripheral surface 83 so that its diameter narrows toward the top portion.

Figure 42:
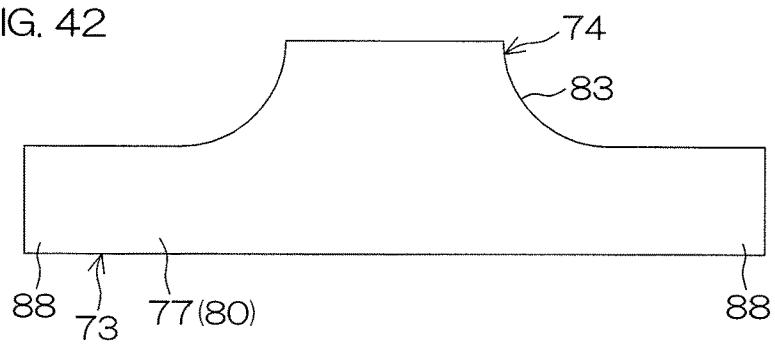
FIG. 42 is a view to describe a variation of the spacer shown in FIG. 38 and FIG. 39.
Figure 43:
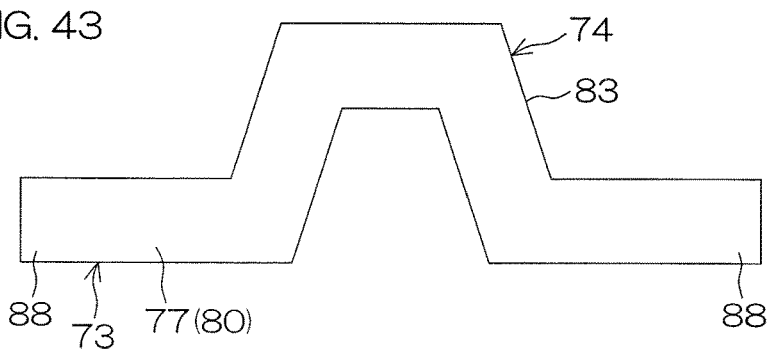
FIG. 43 is a view to describe a variation of the spacer shown in FIG. 38 and FIG. 39.

As shown in FIG. 42, the peripheral surface 83 of the spacer 74 may be a concave surface concaved toward the inside of the spacer 74. This concave peripheral surface 83 can be formed by manufacturing the spacer 74 by, for example, isotropic wet etching.

The spacer 74 may not be formed into a columnar shape (block shape) on the island portion 80 as shown in FIG. 38 to FIG. 42 as long as it can secure a distance between the island portion 80 and the semiconductor layer 2. For example, the spacer 74 may be a hollow convex portion formed by selectively projecting a part of the island portion 80. This hollow spacer 74 can be formed by, for example, pressing a metal substrate constituting the drain terminal 77.

Figure 44:
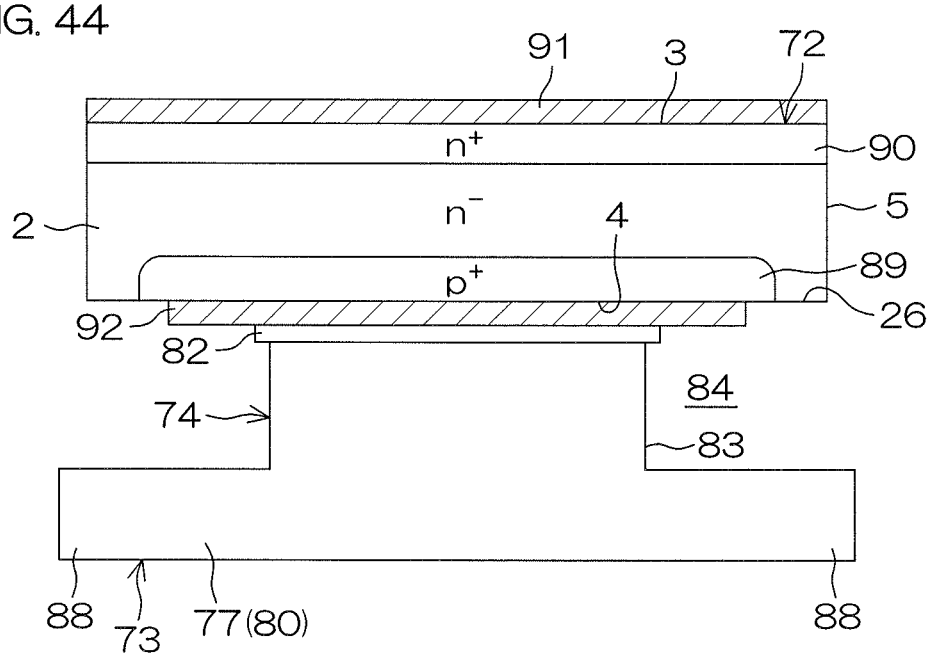
FIG. 44 is a view showing a modification of a semiconductor chip shown in FIG. 38 and FIG. 39.

In the semiconductor chip 72, in FIG. 39, as in FIG. 1, an impurity region pattern (the MIS transistor structure 8, the surface termination structure 20, etc.) is formed on a side (surface 3 side of the semiconductor layer 2 in FIG. 39) opposite to the bonding side as well. However, for example, like the flip-chip bonding form of the diode shown in FIG. 44, this impurity region pattern may not be formed on a side opposite to the bonding side. As an example, it is also possible that, while a pattern of a p$^+$ type anode region 89 is formed on the bonding side of the semiconductor layer 2, the side opposite to the bonding side is entirely an n$^+$ type cathode region 90. In this case, a cathode electrode 91 that comes into contact with the n$^+$ type cathode region 90 may be formed on the entire surface 3 of the semiconductor layer 2, and an anode electrode 92 that comes into contact with the p$^+$ type anode region 89 may be selectively formed on a part of the back surface 4 of the semiconductor layer 2.

Figure 45:
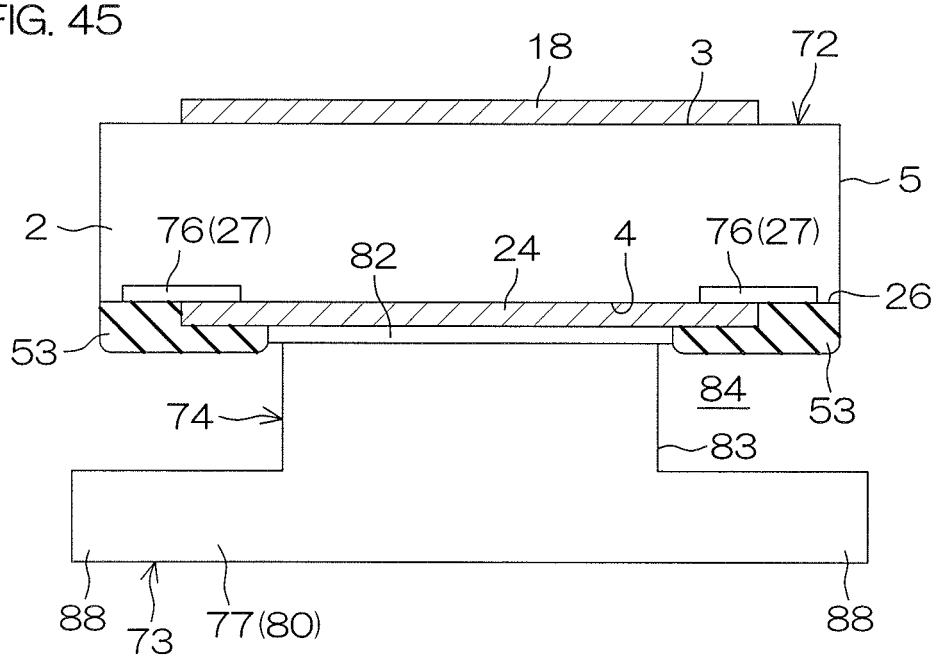
FIG. 45 is a view showing a modification of the semiconductor chip shown in FIG. 38 and FIG. 39.

Further, as shown in FIG. 45, in the semiconductor chip 72, the semiconductor region 26 may also be covered by the protective insulation film 53 shown in FIG. 27, etc. Accordingly, a reverse withstand voltage of the semiconductor chip 72 can be further improved.

Preferred embodiments of the present invention are described above, however, the present invention can also be carried out in preferred embodiments other than the preferred embodiments described above.

For example, the above-described preferred embodiments show only the case where the semiconductor layer 2 is made of SiC, however, the material of the semiconductor layer 2 may be another material called a wide bandgap type such as GaN, and the semiconductor layer 2 may be made of Si. By using the semiconductor device of the preferred embodiment of the present invention as a bidirectional switch of a power supply unit, a power supply unit improved in reliability of withstand voltage and having a small on-state loss can be easily obtained.

In addition, various design changes can be made within the scope of the matters described in claims.

The following problem can be presented as "Technical Problem" described above.

For example, in the configuration described in Patent Literature 1, in order to form a Schottky junction on the back surface of the n type SiC layer, trenches must be formed in the p⁺ type SiC substrate by etching. It is difficult to finely control the depths of the trenches by etching, and the trenches may not reach the n type SiC layer, or the n type SiC may be over-etched. In addition, etching advances not only in the thickness direction but also in the transverse direction of the substrate, so that it is difficult to form trenches with a designed width in the planar direction of the substrate as well.

Therefore, a second object of the present invention is to provide an SIC semiconductor device which can realize a satisfactory reverse withstand voltage by a Schottky junction between a drift region and a drain electrode, and can accurately form the Schottky junction, and a method of manufacturing the same.

A third object of the present invention is to provide a semiconductor device that can realize a satisfactory reverse withstand voltage between the first electrode and the second electrode by a potential barrier formed when a reverse voltage is applied, and can prevent short-circuiting between a semiconductor layer and a metal substrate when the first electrode is bonded and mounted onto the metal substrate.

In order to achieve the second and third objects described above, the following features can be extracted from the preferred embodiments described above.

For example, a semiconductor device includes a semiconductor layer having a surface and an end surface extending in a direction crossing the surface, a second conductivity type body region formed in a surface portion of the semiconductor layer, a first conductivity type source region formed in a surface portion of the body region, a first conductivity type drift region that is formed so as to be exposed to a back surface of the semiconductor layer and separated from the source region by the body region, a gate electrode that faces the body region across an insulation film, a drain electrode that is Schottky-joined to the drift region on the back surface of the semiconductor layer, and has a peripheral edge at a position separated inward from the end surface of the semiconductor layer, and a back surface termination structure that is formed in a back surface portion of the semiconductor layer, and disposed so as to overlap the peripheral edge portion of the drain electrode.

This semiconductor device can be obtained by the following method of manufacturing a semiconductor device. The method of manufacturing a semiconductor device includes, in a semiconductor wafer including a first conductivity type semiconductor layer, a step of forming a transistor structure in a surface portion of the semiconductor layer, a step of selectively forming a back surface termination structure to improve a reverse withstand voltage of the transistor in a peripheral portion of the back surface of the semiconductor layer, a step of selectively forming a back surface electrode on the back surface of the semiconductor layer so that at least a part of its peripheral edge portion overlaps the back surface termination structure, and Schottky-joining the back surface electrode to the semiconductor layer, and a step of cutting the semiconductor layer along dicing lines set at positions away from a peripheral edge of the back surface electrode.

According to this method, a Schottky junction area can be set by forming a back surface electrode with a desired size on a Schottky junction surface (back surface) in the semiconductor layer. For example, an electrode film is formed on the entire back surface of the semiconductor layer, and by patterning this electrode film, a back surface electrode with a desired size can be easily obtained.

In the thus obtained semiconductor device, for example, when a reverse voltage is applied between the source and the drain, a current that flows in a thickness direction inside the semiconductor layer via a body diode formed by a p-n junction between a body region and a drift region can be blocked by a Schottky barrier of the Schottky junction. Further, a back surface termination structure is formed so as to overlap the peripheral edge portion of the drain electrode (back surface electrode), so that when a reverse voltage is applied, a depletion layer can be prevented from reaching an end surface (chip end surface) of the semiconductor layer. Accordingly, even when a defect region is present at the end surface of the semiconductor layer due to dicing, a leakage current can be prevented from flowing due to generation of electron-hole pairs in this defect region. As a result of these, the semiconductor device secures a satisfactory reverse withstand voltage, and accordingly, can be satisfactorily used as a reverse blocking MISFET for a bidirectional switch.

In the semiconductor device, the back surface termination structure may include a first high-resistance region with higher resistance than the drift region. In this case, it is possible that the semiconductor layer is SiC, and the first high-resistance region has a crystal defect concentration of $1 \times 10^{14}$ cm$^{-3}$ to $1 \times 10^{21}$ cm$^{-3}$.

In the semiconductor device, the back surface termination structure may include a second conductivity type first impurity region. In this case, it is possible that the semiconductor layer is SiC, and the first impurity region has an impurity concentration of $1 \times 10^{16}$ cm$^{-3}$ to $1 \times 10^{19}$ cm$^{-3}$.

In the semiconductor device, the back surface termination structure may have an inner peripheral edge on the inner side of a peripheral edge of the drain electrode, and an outer peripheral edge at a position separated outward from the peripheral edge of the drain electrode and inward from the end surface of the semiconductor layer.

In the semiconductor device, a distance of the outer peripheral edge from the end surface of the semiconductor layer may be a distance to prevent a depletion layer formed in the back surface termination structure from reaching the end surface of the semiconductor layer.

In the semiconductor device, the outer peripheral edge of the back surface termination structure may be disposed at a position closer to the drain electrode than a region in which the depletion layer formed in the back surface termination structure spreads.

In the semiconductor device, the back surface termination structure may include a plurality of portions having at least one portion overlapping the peripheral edge portion of the drain electrode.

In the semiconductor device, the back surface termination structure may be a high-resistance region with higher resistance than the drift region, and formed so as to reach the end surface of the semiconductor layer.

The semiconductor device may include a first conductivity type field stop layer that is formed on at least one of the surface side and the back surface side of the semiconductor layer, and has a higher impurity concentration than the drift region. In this case, the field stop layer may be disposed at a depth position separated from the surface or the back surface of the semiconductor layer, or may be formed so as to reach the surface or the back surface of the semiconductor layer.

With this configuration, when a voltage is applied between the source and the drain, a depletion layer extending from a low-voltage side can be prevented from reaching a conduction pattern (for example, MIS transistor structure) on a high-voltage side. Accordingly, a leakage current due to a punch-through phenomenon can be prevented.

The semiconductor device may include field relaxation regions that are formed in the back surface portion of the semiconductor layer in a region on the inner side of the back surface termination structure, and are in contact with the drain electrode.

With this configuration, an electric field at the Schottky interface between the drift region and the drain electrode can be relaxed. Accordingly, even when a metal with a comparatively small work function is used as the drain electrode, a reverse leakage current can be reduced, so that by using this metal, a low on-state resistance can be secured.

In the semiconductor device, the field relaxation region may include a second high-resistance region with a higher resistance than the drift region. In this case, the second high-resistance region may have a crystal defect concentration of $1\times10^{14}$ cm$^{-3}$ to $1\times10^{21}$ cm$^{-3}$.

In the semiconductor device, the field relaxation region may include a second conductivity type second impurity region. In this case, the second impurity region may have an impurity concentration of $1\times10^{16}$ cm$^{-3}$ to $1\times10^{19}$ cm$^{-3}$.

In the semiconductor device, in a region on the inner side of the back surface termination structure, the back surface of the semiconductor layer may have a substantially uniform flat portion, and the field relaxation regions may be formed on the flat portion.

In the semiconductor device, in a region on the inner side of the back surface termination structure, trenches may be selectively formed in the back surface of the semiconductor layer, and the field relaxation regions may be formed along the inner surfaces of the trenches inside the drift region.

In the semiconductor device, the field relaxation regions may be disposed discretely in a plan view, may be disposed in a stripe pattern in a plan view, or may be disposed in a lattice pattern in a plan view.

The semiconductor device may further include a source electrode that is formed on the surface side of the semiconductor layer and connected to the source region, and a surface termination structure disposed at a peripheral edge portion of the source electrode so that at least a part of the surface termination structure overlaps the source electrode.

In the method of manufacturing a semiconductor device, the step of forming the back surface termination structure may include a step of transforming the back surface termination structure into a high-resistance region with a higher resistance than the semiconductor layer by laser annealing or heat treatment at 500° C. or less after irradiating second impurity ions, protons, or electron beams onto the back surface of the semiconductor layer, and one end of the back surface termination structure may be flush with the cut surface.

In the method of manufacturing a semiconductor device, the step of forming the back surface termination structure may include a step of transforming the back surface termination structure into a second conductivity type first impurity region by activating the back surface termination structure by laser annealing after injecting second impurity ions into the back surface of the semiconductor layer, and one end of the back surface termination structure may be a length on a side closer to the back surface electrode side than a depletion layer formed when a reverse voltage is applied to the semiconductor device.

The method of manufacturing a semiconductor device may further include a step of forming a protective insulation layer partially overlapping a peripheral edge of the back surface electrode.

A semiconductor device according to another preferred embodiment includes a semiconductor layer which has a first surface on a die-bonding side, a second surface on a side opposite to the first surface, and an end surface extending in a direction crossing the first surface and the second surface, and in which an active region and an outer peripheral region surrounding the active region are formed, a first electrode that is formed on the first surface of the semiconductor layer and has a peripheral edge at a position separated inward from the end surface of the semiconductor layer, a first termination structure that is formed in a surface portion on the first surface side of the semiconductor layer, and disposed so as to overlap the peripheral edge portion of the first electrode, a second electrode that is formed on the second surface of the semiconductor layer, and has a peripheral edge at a position separated inward from the end surface of the semiconductor layer, and a protective insulation film that is formed so as to come into contact with at least the peripheral edge portion of the first electrode, and covers a semiconductor surface of the semiconductor layer from the peripheral edge of the first electrode to the end surface of the semiconductor layer, wherein when a reverse voltage is applied between the first electrode and the second electrode, a current that flows in a reverse direction between the first electrode and the second electrode is reduced by a potential barrier formed on one of the first surface and the second surface.

With this configuration, when a reverse voltage is applied between the first electrode and the second electrode, a current that flows in a thickness direction inside the semiconductor layer can be blocked by a potential barrier formed on one of the first surface and the second surface. Further, a termination structure is formed on both of the first surface and the second surface of the semiconductor layer, so that when a reverse voltage is applied, a depletion layer can be prevented from reaching the end surface (chip end surface) of the semiconductor layer. Accordingly, even when a defect region is present at the end surface of the semiconductor layer due to dicing, a leakage current can be prevented from flowing due to generation of electron-hole pairs in the defect region. As a result of these, in the semiconductor device, a satisfactory reverse withstand voltage can be secured, so that the semiconductor device can be satisfactorily used as a reverse blocking device for a bidirectional switch.

Further, a semiconductor surface of the semiconductor layer from the peripheral edge of the first electrode on the bonding side to the end surface of the semiconductor layer is covered by a protective insulation film. Accordingly, when the first electrode is bonded and mounted onto a metal substrate, the semiconductor surface of the semiconductor layer can be prevented from coming into contact with the metal substrate, so that short-circuiting between the semiconductor layer and the metal substrate can be prevented.

The semiconductor device according to another preferred embodiment may further include a second termination structure that is formed in a surface portion on the second surface side of the semiconductor layer, and disposed so as to overlap the peripheral edge portion of the second electrode.

In the semiconductor device according to another preferred embodiment, the peripheral edge portion of the first electrode and a part of the protective insulation film may overlap each other.

In the semiconductor device according to another preferred embodiment, the protective insulation film may have a lamination structure including a first film sandwiched by the peripheral edge portion of the first electrode and the semiconductor layer, and a second film that is formed on the first film and overlaps the peripheral edge portion of the first electrode.

In the semiconductor device according to another preferred embodiment, the first film may be made of $SiO_2$ or SiN, and the second film may be made of polyimide.

In the semiconductor device according to another preferred embodiment, the protective insulation film may have a thickness t satisfying the following Equation (1) based on the semiconductor surface.

$$t > V/(3MV/cm) \tag{1}$$

(In Equation, V is a voltage to be applied between the first electrode and the second electrode.)

The semiconductor device according to another preferred embodiment may include a MISFET structure formed in the surface portion on the second surface side of the semiconductor layer, and the first electrode may be Schottky-joined to the semiconductor layer at the first surface of the semiconductor layer.

The semiconductor device according to another preferred embodiment may include an IGBT structure formed in the surface portion on the second surface side of the semiconductor layer.

The semiconductor device according to another preferred embodiment may include a JFET structure formed in the surface portion on the second surface side of the semiconductor layer, and the first electrode may be Schottky-joined to the semiconductor layer at the first surface of the semiconductor layer.

The semiconductor device according to another preferred embodiment may include MISFET structures formed in the surface portions on both the first surface side and the second surface side of the semiconductor layer.

The semiconductor device according to another preferred embodiment may include JFET structures formed in the surface portions on both the first surface side and the second surface side of the semiconductor layer.

In the semiconductor device according to another preferred embodiment, the semiconductor layer may be made of any of Si, SiC, and GaN.

The present application corresponds to Japanese Patent Application No. 2015-242486 filed in the Japan Patent Office on Dec. 11, 2015, Japanese Patent Application No. 2016-116466 filed in the Japan Patent Office on Jun. 10, 2016, and Japanese Patent Application No. 2016-123817 filed in the Japan Patent Office on Jun. 22, 2016, and the entire disclosures of these applications are incorporated herein by reference.

REFERENCE SIGNS LIST

1: Semiconductor device
2: Semiconductor layer
3: Surface (of semiconductor layer)
4: Back surface (of semiconductor layer)
5: End surface (of semiconductor layer)
8: MIS transistor structure
9: p type body region
10: $n^+$ type source region
11: Gate insulation film
12: Gate electrode
15: $n^-$ type drift region
18: Source electrode
20: Surface termination structure
24: Drain electrode
25: Peripheral edge (of drain electrode)
27: Back surface termination structure
28: Inner peripheral edge
29: Outer peripheral edge
31: Base substrate
34: Metal film
36: Dicing line
40: RESURF layer
41: Guard ring layer
42: Surface-side field stop layer
43: Back surface-side field stop layer
44: Field relaxation region
45: Flat portion
46: Trench
50: Metal substrate
51: Bonding material
52: Semiconductor device
53: Protective insulation film
54: First film
55: Second film
56: Overlap portion
57: Inner peripheral edge
58: Inner peripheral edge
59: IGBT structure
66: JFET structure
71: Semiconductor package
72: Semiconductor chip
73: Substrate terminal
74: Spacer
75: Resin package
76: Impurity region pattern
77: Drain terminal
78: Source terminal
79: Gate terminal
80: Island portion
81: Terminal portion
82: Bonding material
83: Peripheral surface
84: Space
85: Bonding wire
86: Bonding wire
87: Bonding material
88: Outer peripheral portion
89: $p^+$ type anode region
90: $n^+$ type cathode region
91: Cathode electrode
92: Anode electrode

What is claimed is:
1. A semiconductor device comprising:
a semiconductor chip including a semiconductor layer that has a first surface on a die-bonding side, a second surface on the opposite side of the first surface, and an end surface extending in a direction crossing the first surface and the second surface, a first electrode that is formed on the first surface and has a peripheral edge at a position separated inward from the end surface, and a second electrode formed on the second surface;

a conductive substrate onto which the semiconductor chip is die-bonded;

a conductive spacer that has a planar area smaller than that of the first electrode and supports the semiconductor chip on the conductive substrate;

a resin package that seals at least the semiconductor chip and the conductive spacer; and a bonding material that is provided between the conductive spacer and the first electrode of the semiconductor chip, and has a projecting portion projecting from the conductive spacer and fitting inside the first electrode.

2. The semiconductor device according to claim 1, wherein the conductive spacer includes a columnar spacer integrally formed with the conductive substrate.

3. The semiconductor device according to claim 2, wherein the columnar spacer is formed into a rectangular parallelepiped shape having a side surface perpendicular to a surface of the conductive substrate.

4. The semiconductor device according to claim 2, wherein the columnar spacer is formed into a shape having a tapered side surface inclined with respect to the surface of the conductive substrate.

5. The semiconductor device according to claim 2, wherein the columnar spacer is formed into a shape having a side surface including a curved surface concaved toward the inside of the columnar spacer.

6. The semiconductor device according to claim 1, wherein the conductive spacer is bonded to the conductive substrate via a second bonding material.

7. The semiconductor device according to claim 6, wherein the conductive spacer and the conductive substrate are formed of materials different from each other.

8. A semiconductor device comprising:

a semiconductor chip including a semiconductor layer that has a first surface on a die-bonding side, a second surface on the opposite side of the first surface, and an end surface extending in a direction crossing the first surface and the second surface, a first electrode that is formed on the first surface and has a peripheral edge at a position separated inward from the end surface, and a second electrode formed on the second surface;

a conductive substrate onto which the semiconductor chip is die-bonded;

a conductive spacer that is a hollow conductive spacer formed by selectively projecting a part of the conductive substrate and has a planar area smaller than that of the first electrode;

a resin package that seals at least the semiconductor chip and the conductive spacer; and a bonding material that is provided between the conductive spacer and the first electrode of the semiconductor chip, and has a projecting portion projecting from the conductive spacer and fitting inside the first electrode.

9. The semiconductor device according to claim 1, wherein the semiconductor chip has, in a surface portion of the semiconductor layer on the first surface side, a first conductivity type first impurity region electrically connected to the first electrode, and a second conductivity type second impurity region exposed to the outer side of the first electrode, and the second impurity region has a portion that becomes the same potential as that of the second electrode when a reverse voltage is applied between the first electrode and the second electrode.

10. The semiconductor device according to claim 1, further comprising: a protective insulation film that is formed in contact with at least a peripheral edge portion of the first electrode, and covers an area from the peripheral edge of the first electrode to the end surface of the semiconductor layer.

11. The semiconductor device according to claim 1, wherein a part of the resin package enters a space between a portion of the semiconductor chip on an outer side of the conductive spacer and the conductive substrate, and when a withstand voltage of the semiconductor device is $V_{B1}$ (V), a withstand voltage of the resin package per unit length is $V_{B2}$ (V/mm), and a height distance between the semiconductor chip and the conductive substrate is H, the height H exceeds $V_{B1}/V_{B2}$.

12. The semiconductor device according to claim 9, wherein a part of the resin package enters a space between a portion of the semiconductor chip on an outer side of the conductive spacer and the conductive substrate, and when a withstand voltage of the semiconductor device is $V_{B1}$ (V), a withstand voltage of the resin package per unit length is $V_{B2}$ (V/mm), and a distance between a peripheral surface of the conductive spacer and a peripheral surface of the second impurity region is L, the distance L exceeds $V_{B1}/V_{B2}$.

13. The semiconductor device according to claim 1, wherein the conductive spacer is made of Cu or an alloy containing Cu, or a metal whose surface is plated with Cu.

14. The semiconductor device according to claim 1, wherein the conductive substrate includes an island portion on which the semiconductor chip is disposed, and a terminal portion extending from the island portion.

15. The semiconductor device according to claim 9, wherein the semiconductor chip includes an active region in which a plurality of transistors are formed in a surface portion of the semiconductor layer, and an outer peripheral region in which a protection element is formed so as to surround the active region.

16. The semiconductor device according to claim 1, wherein the semiconductor layer is a wide bandgap type semiconductor layer.

17. A power converter using the semiconductor device according to claim 1 as a bidirectional switch circuit.

* * * * *